(12) United States Patent
West et al.

(10) Patent No.: US 9,647,157 B2
(45) Date of Patent: May 9, 2017

(54) DISCRETE ATTACHMENT POINT APPARATUS AND SYSTEM FOR PHOTOVOLTAIC ARRAYS

(71) Applicant: SolarCity Corporation, San Mateo, CA (US)

(72) Inventors: Jack Raymond West, San Rafael, CA (US); Brian Atchley, San Rafael, CA (US); Tyrus Hudson, San Rafael, CA (US)

(73) Assignee: SolarCity Corporation, San Mateo, CA (US)

( * ) Notice: Subject to any disclaimer, the term of this patent is extended or adjusted under 35 U.S.C. 154(b) by 756 days.

(21) Appl. No.: 13/911,955

(22) Filed: Jun. 6, 2013

(65) Prior Publication Data
US 2014/0026946 A1    Jan. 30, 2014

Related U.S. Application Data

(63) Continuation-in-part of application No. 13/325,054, filed on Dec. 13, 2011, now abandoned, and a
(Continued)

(51) Int. Cl.
*H02S 20/23* (2014.01)
*F24J 2/52* (2006.01)
(Continued)

(52) U.S. Cl.
CPC ........ *H01L 31/0422* (2013.01); *F24J 2/5205* (2013.01); *F24J 2/526* (2013.01);
(Continued)

(58) Field of Classification Search
CPC ........ H02S 20/23; F24J 2/5205; F24J 2/5247; F24J 2/5252; F24J 2/5254; F24J 2/5258; F24J 2/526; F24J 2/5264
See application file for complete search history.

(56) References Cited

U.S. PATENT DOCUMENTS 6,160,215 A * 12/2000 Curtin ................... H01L 31/048
136/244
7,592,537 B1    9/2009 West
(Continued)

OTHER PUBLICATIONS

Notice of Allowance, U.S. Appl. No. 14/615,320, mailed May 28, 2015, 10 pages.
(Continued)

*Primary Examiner* — Magali P Slawski
(74) *Attorney, Agent, or Firm* — Kilpatrick Townsend & Stockton LLP

(57) ABSTRACT

An attachment point apparatus and system for photovoltaic arrays is disclosed as well as an installed photovoltaic array using attachment apparatus. One embodiment provides a rail for receiving a PV module, including a rail member located substantially beneath at least a portion of a second photovoltaic module and having a first end located near a gap between a first and second photovoltaic modules. An embodiment also provides a second photovoltaic module which is substantially coplanar with and located between a first and third photovoltaic modules and wherein said rail member is connected to the first, second, and third photovoltaic modules and attached to a support structure by a first and second attachment brackets. A further embodiment provides a lever clip, said lever clip comprising a head portion connecting a photovoltaic module to a rail, a lever portion extending away from a head portion, and a retaining portion near an end of a lever portion wherein the lever portion acts as a lever to rotate the head portion during installation such that the head portion secures the photovoltaic module to a frame.

26 Claims, 64 Drawing Sheets

Related U.S. Application Data continuation-in-part of application No. 13/402,860, filed on Feb. 22, 2012.

(60) Provisional application No. 61/656,240, filed on Jun. 6, 2012, provisional application No. 61/827,219, filed on May 24, 2013.

(51) Int. Cl.
*H01L 31/042* (2014.01)
*H02S 20/00* (2014.01)

(52) U.S. Cl.
CPC .......... *F24J 2/5247* (2013.01); *F24J 2/5254* (2013.01); *F24J 2/5258* (2013.01); *F24J 2/5264* (2013.01); *H02S 20/00* (2013.01); *H02S 20/23* (2014.12); *F24J 2002/5215* (2013.01); *F24J 2002/5226* (2013.01); *Y02B 10/12* (2013.01); *Y02E 10/47* (2013.01); *Y02E 10/50* (2013.01)

(56) References Cited

U.S. PATENT DOCUMENTS

| | | | |
|---|---|---|---|
| 7,677,242 | B2 | 3/2010 | Carcangiu |
| 8,181,926 | B2 | 5/2012 | Jolly et al. |
| 9,166,524 | B2 | 10/2015 | West et al. |
| 2003/0172922 | A1 | 9/2003 | Haber |
| 2003/0201009 | A1 | 10/2003 | Nakajima et al. |
| 2007/0212935 | A1 | 9/2007 | Lenox |
| 2008/0053517 | A1 | 3/2008 | Plaisted et al. |
| 2009/0078299 | A1* | 3/2009 | Cinnamon ............ F24J 2/5211 136/244 |
| 2010/0193012 | A1 | 8/2010 | Klammer et al. |
| 2010/0276558 | A1* | 11/2010 | Faust .................... F24J 2/5205 248/222.14 |
| 2011/0072631 | A1 | 3/2011 | Hartelius et al. |
| 2011/0138585 | A1 | 6/2011 | Kmita et al. |
| 2011/0146763 | A1 | 6/2011 | Sagayama |
| 2011/0214368 | A1 | 9/2011 | Haddock et al. |
| 2013/0043199 | A1 | 2/2013 | Cusson et al. |
| 2013/0091786 | A1 | 4/2013 | DuPont et al. |
| 2014/0175244 | A1 | 6/2014 | West et al. |
| 2015/0280639 | A1 | 10/2015 | Atchley et al. |

OTHER PUBLICATIONS

Preinterview First Office Action, U.S. Appl. No. 14/615,320, mailed Apr. 22, 2015, 4 pages.
International Search Report, PCT Application No. PCT/US2011/064749, mailed Apr. 6, 2012, 2 pages.
Written Opinion, PCT Application No. PCT/US2011/064749, mailed Apr. 6, 2012, 5 pages.
U.S. Appl. No. 13/402,860 , "Non-Final Office Action", Sep. 9, 2016, 10 pages.
U.S. Appl. No. 14/106,153 , "Non-Final Office Action", Sep. 19, 2016, 9 pages.

* cited by examiner

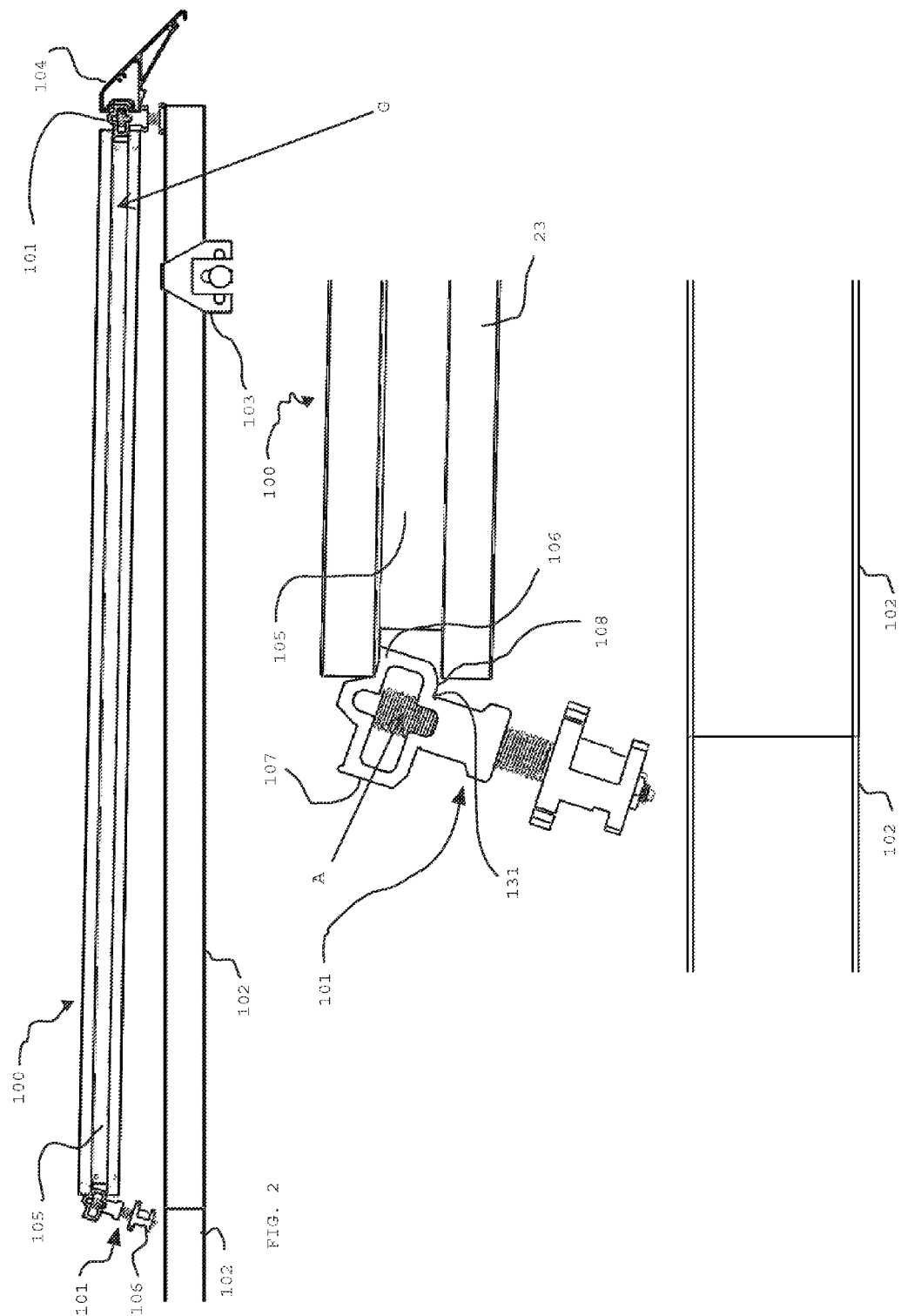

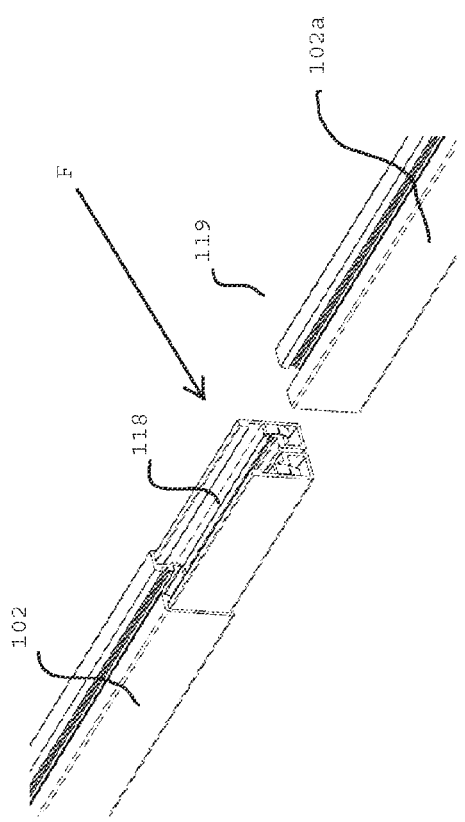
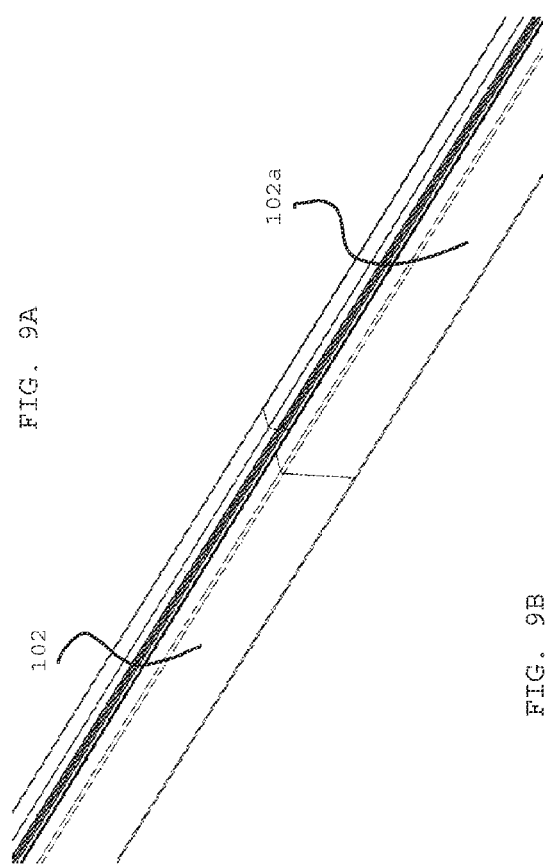

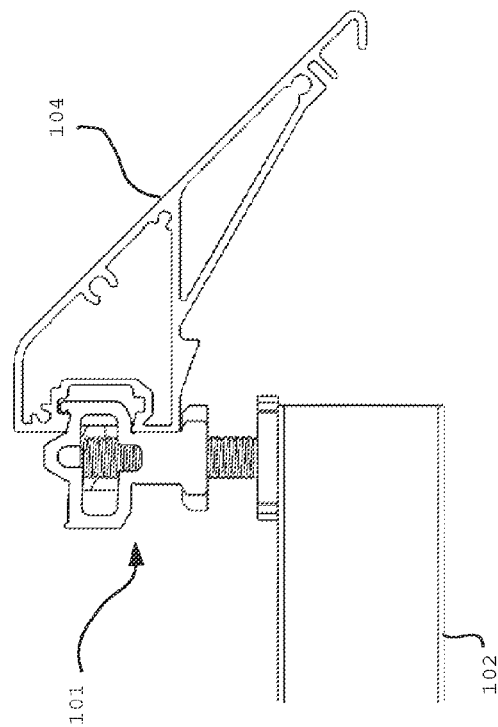
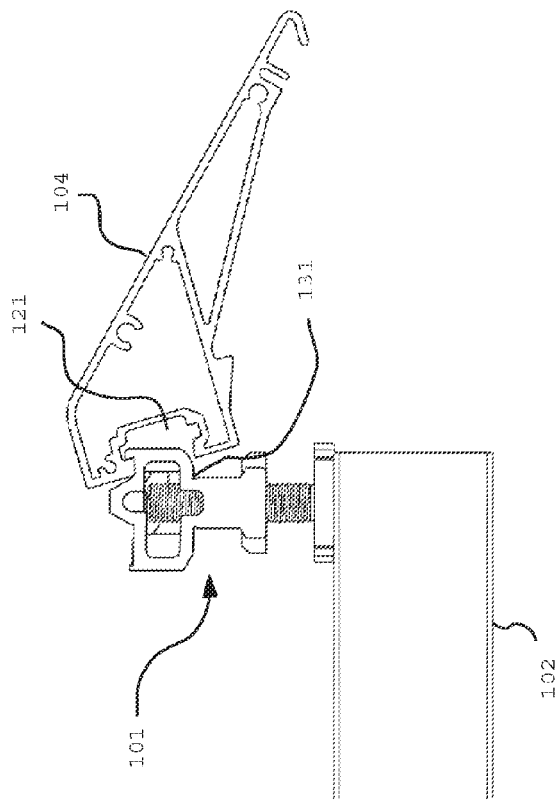
FIG. 10B
FIG. 10A

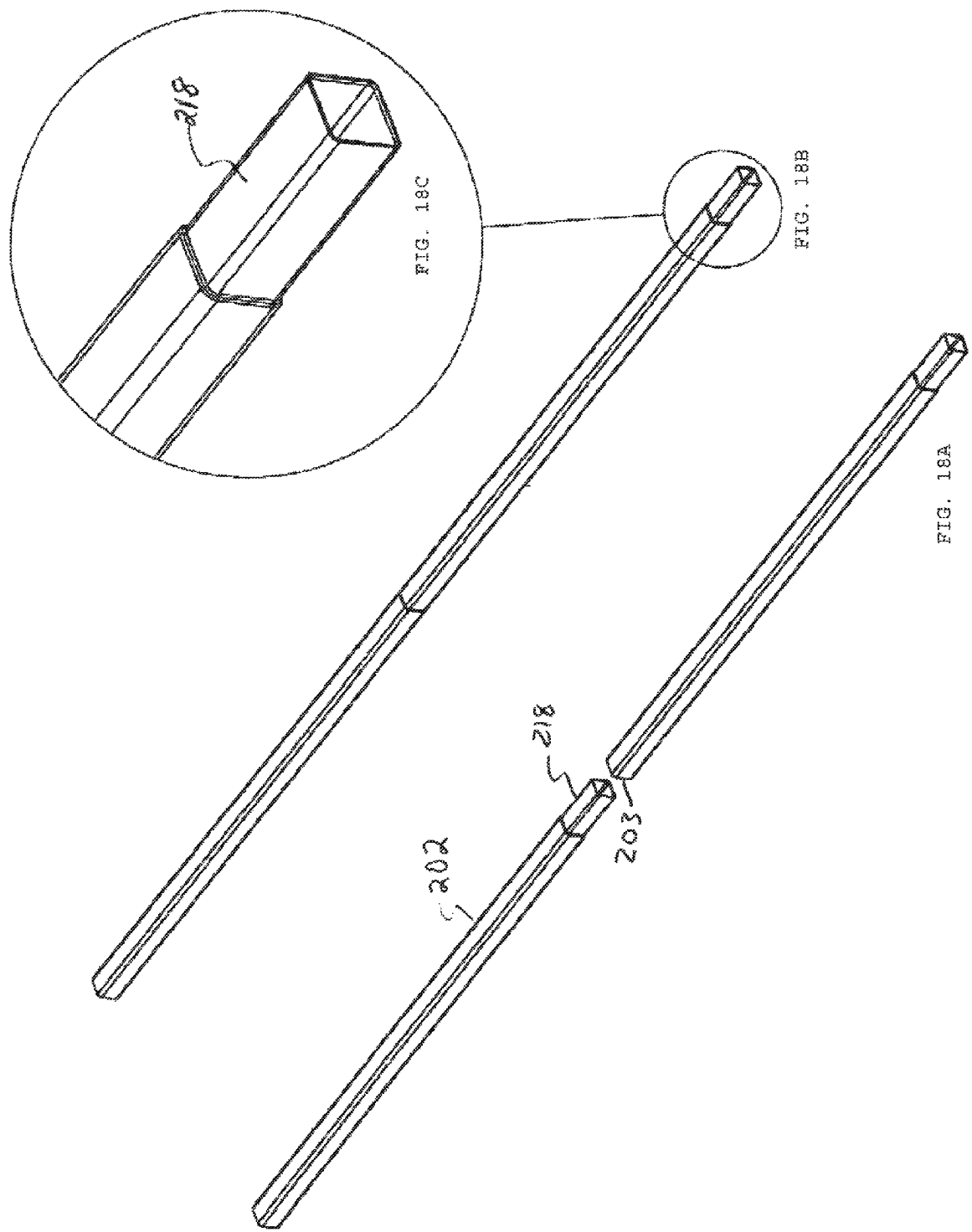

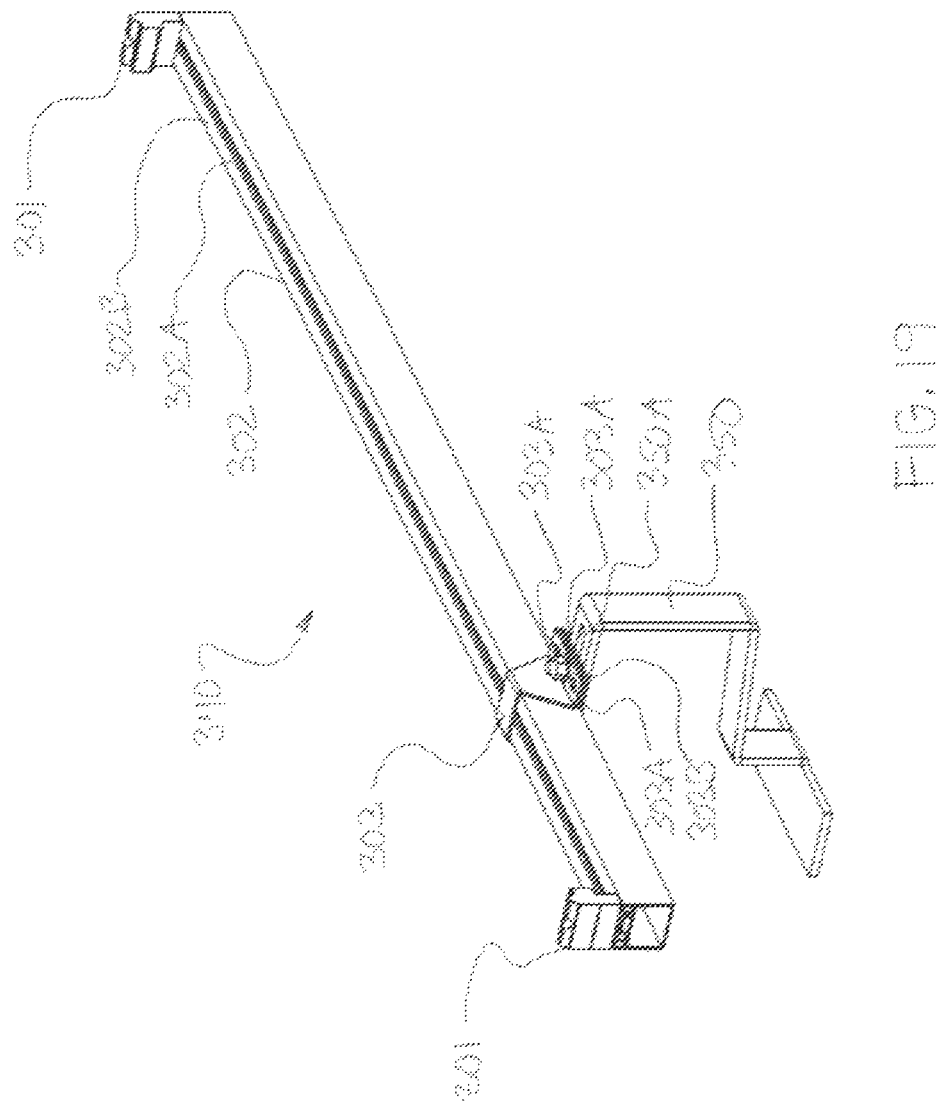

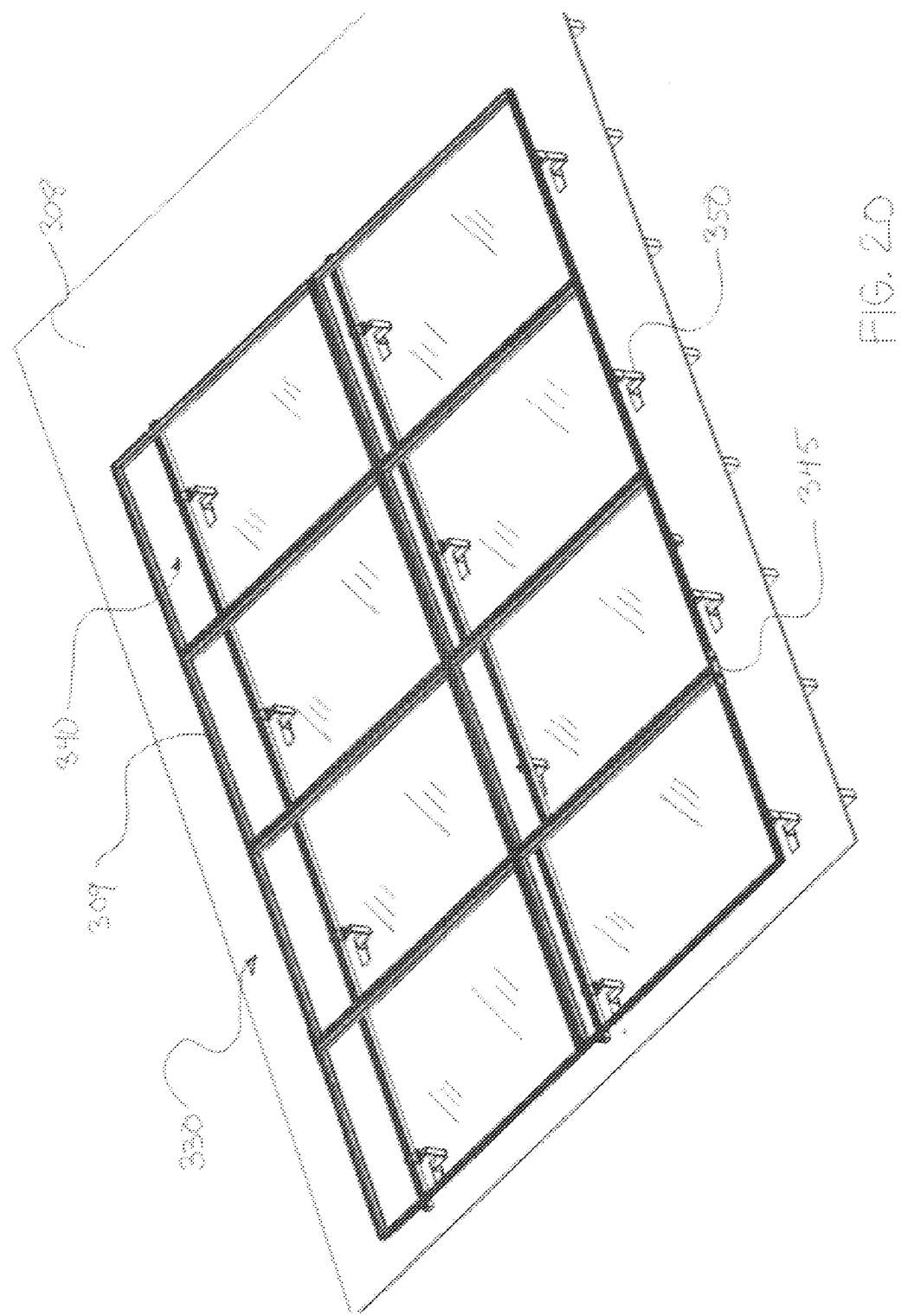

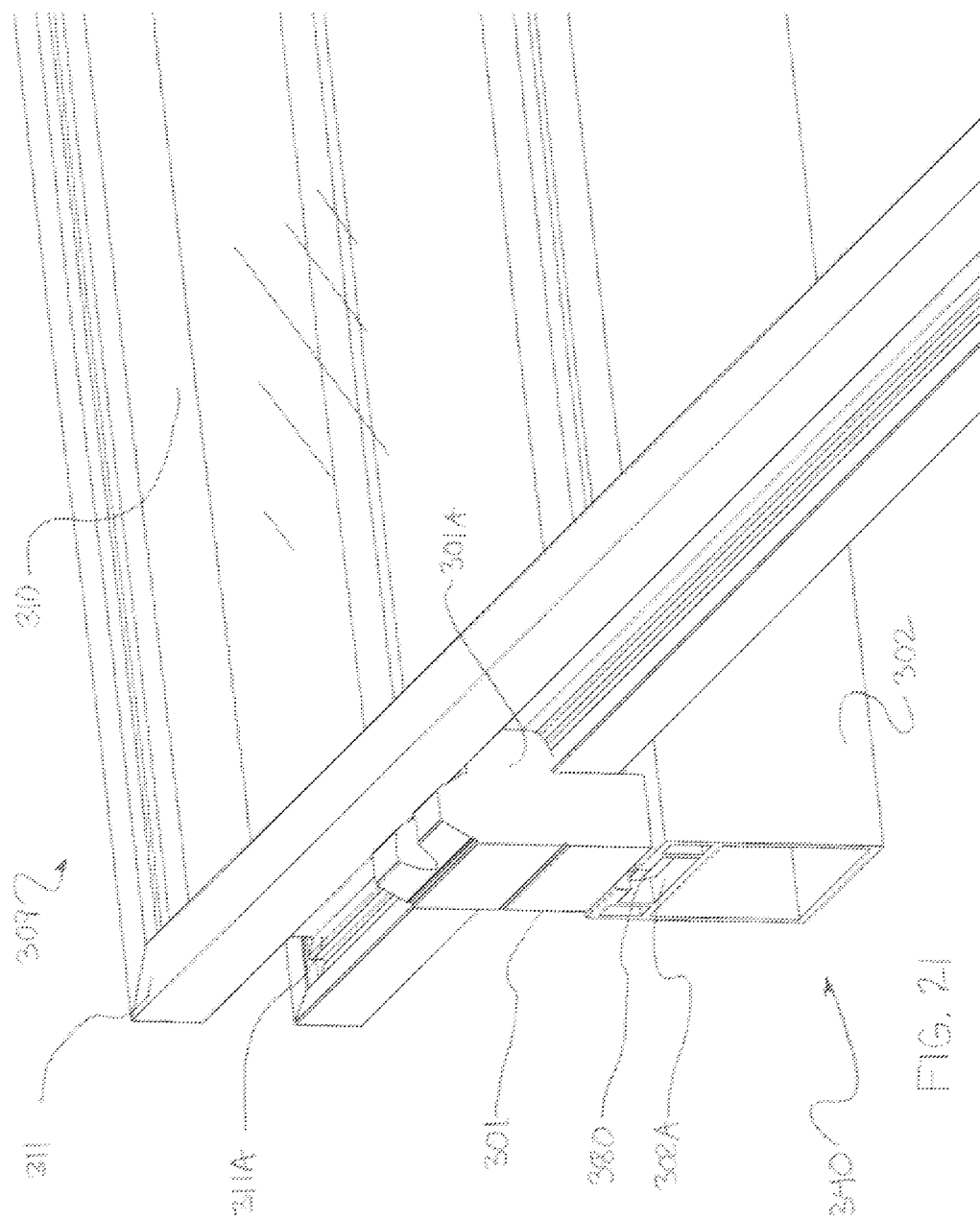

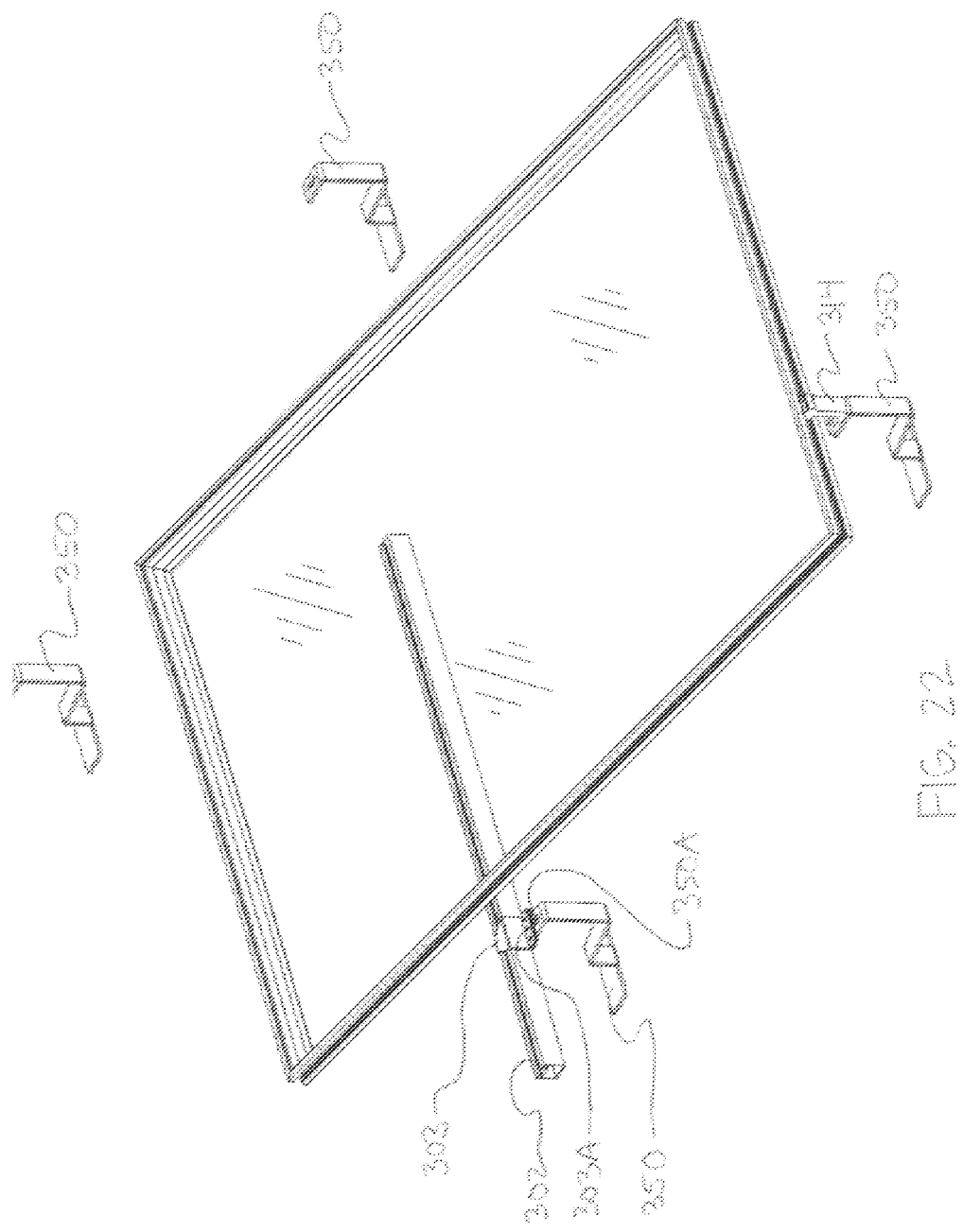

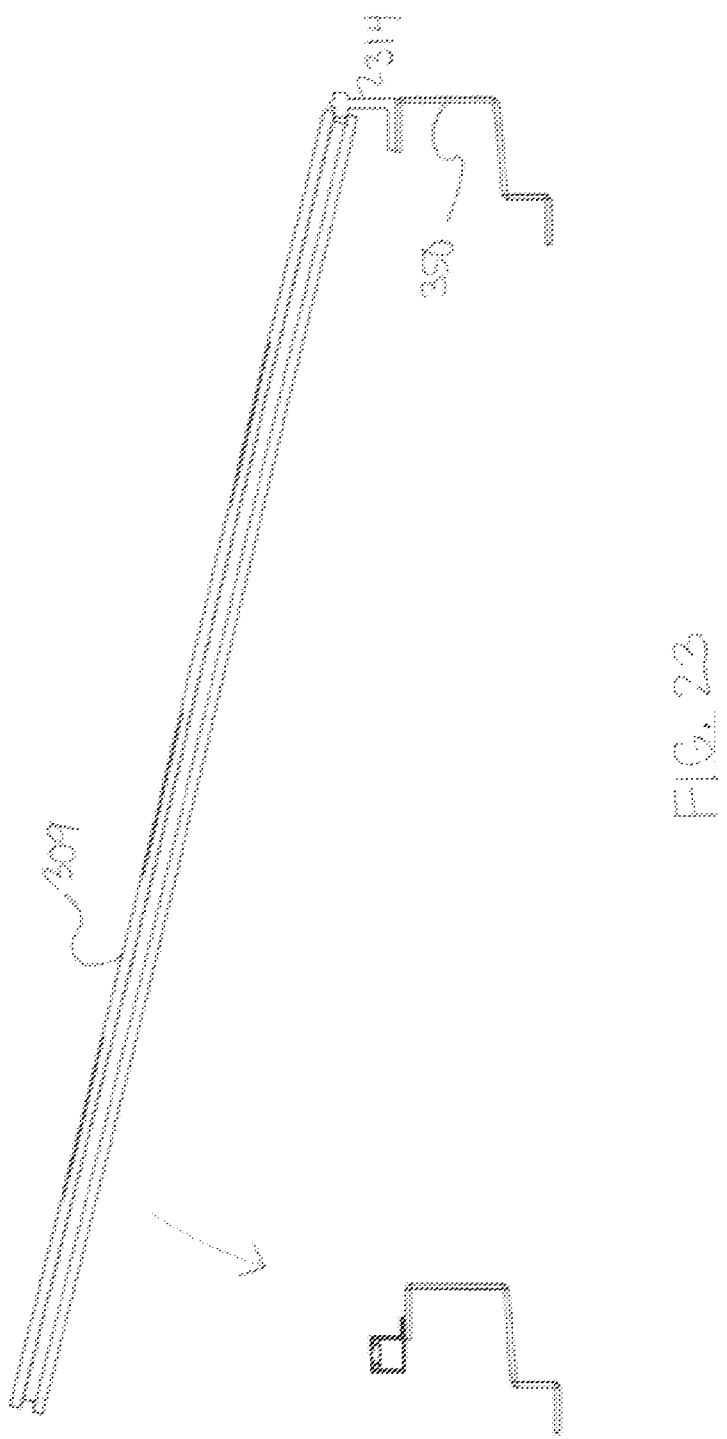

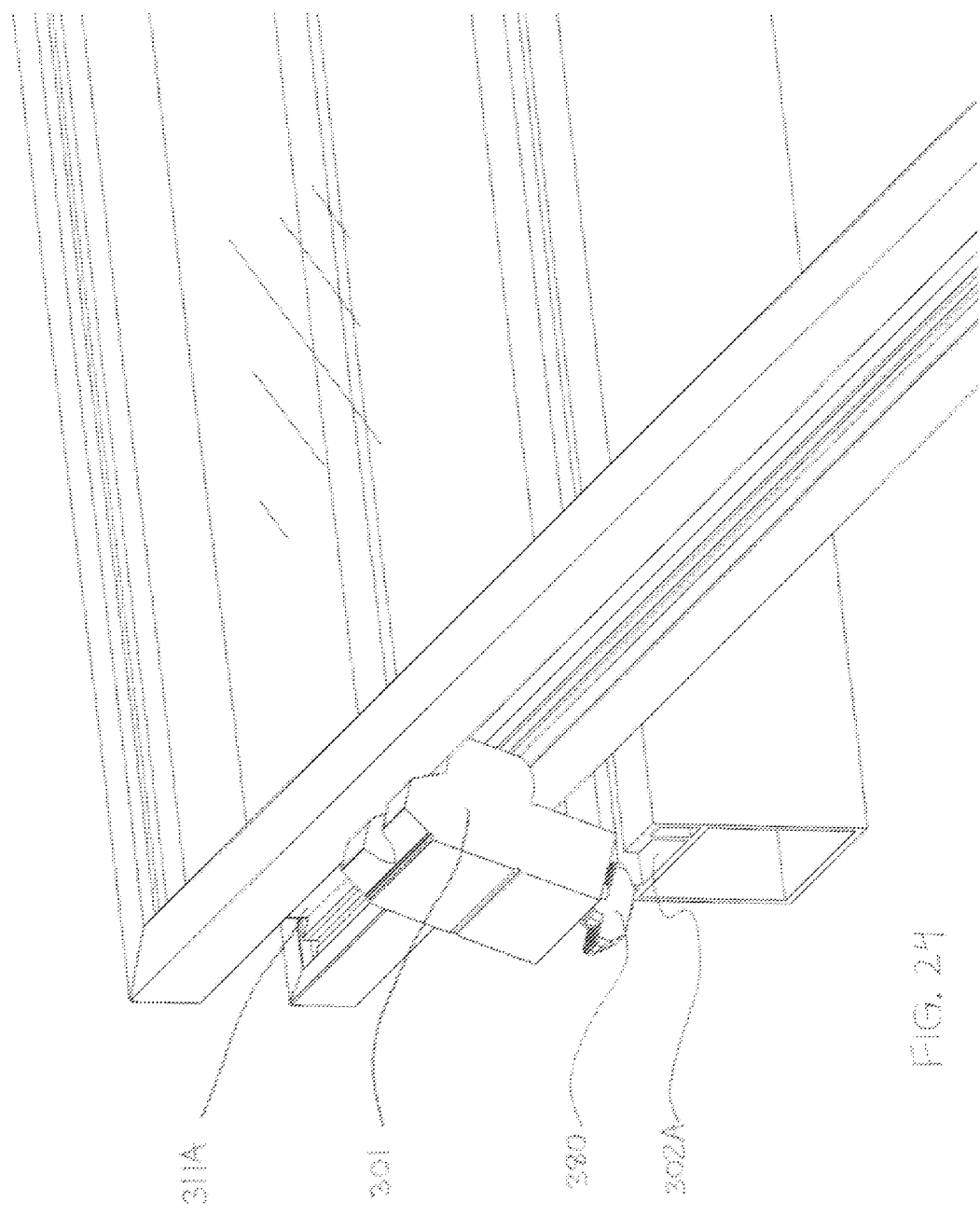

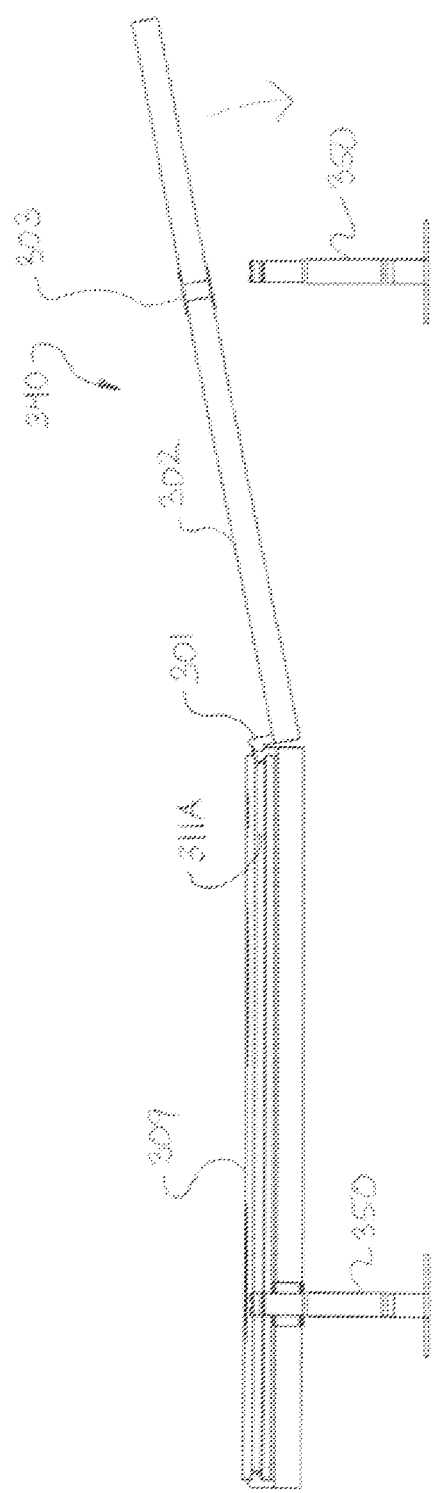

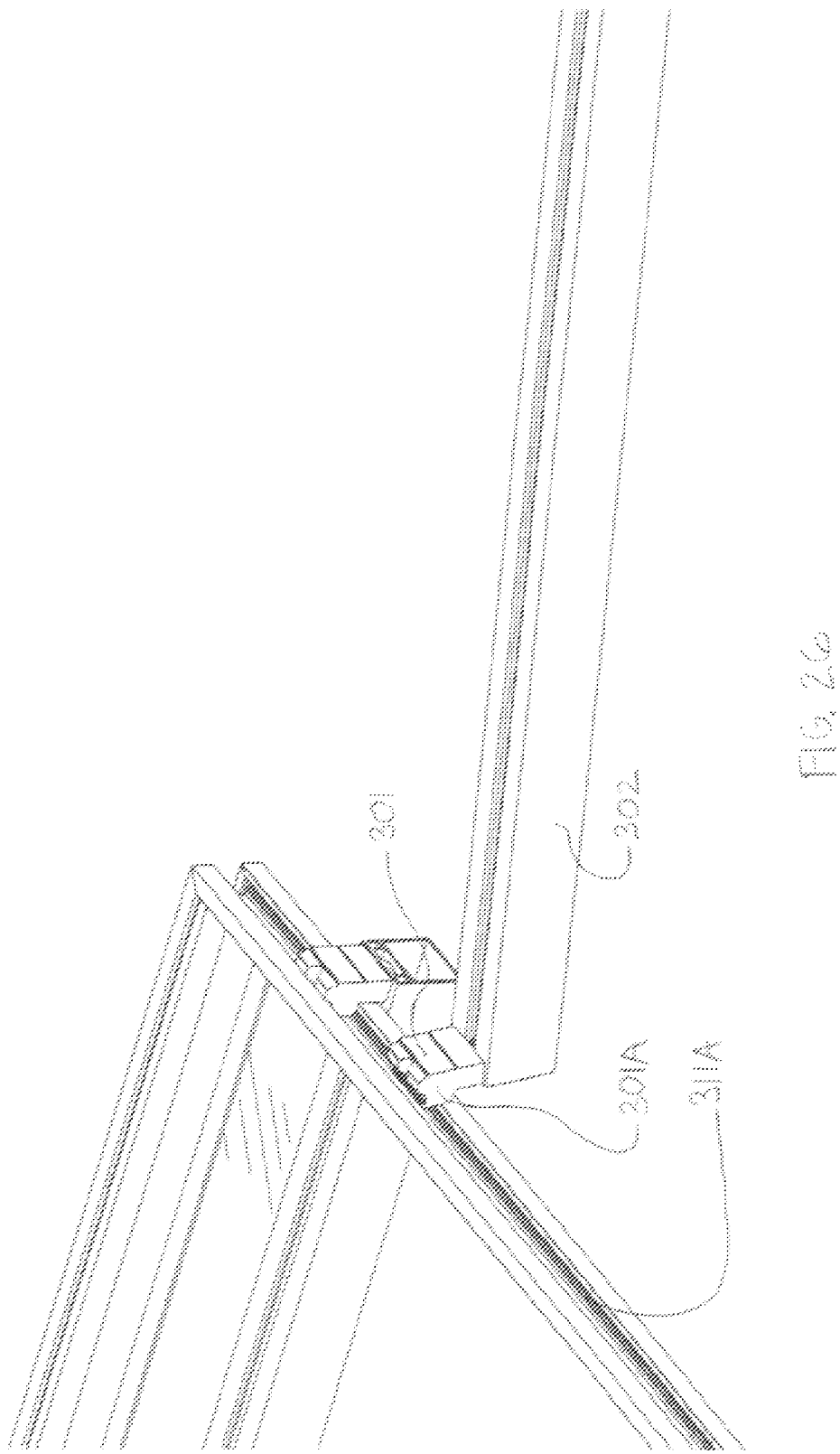

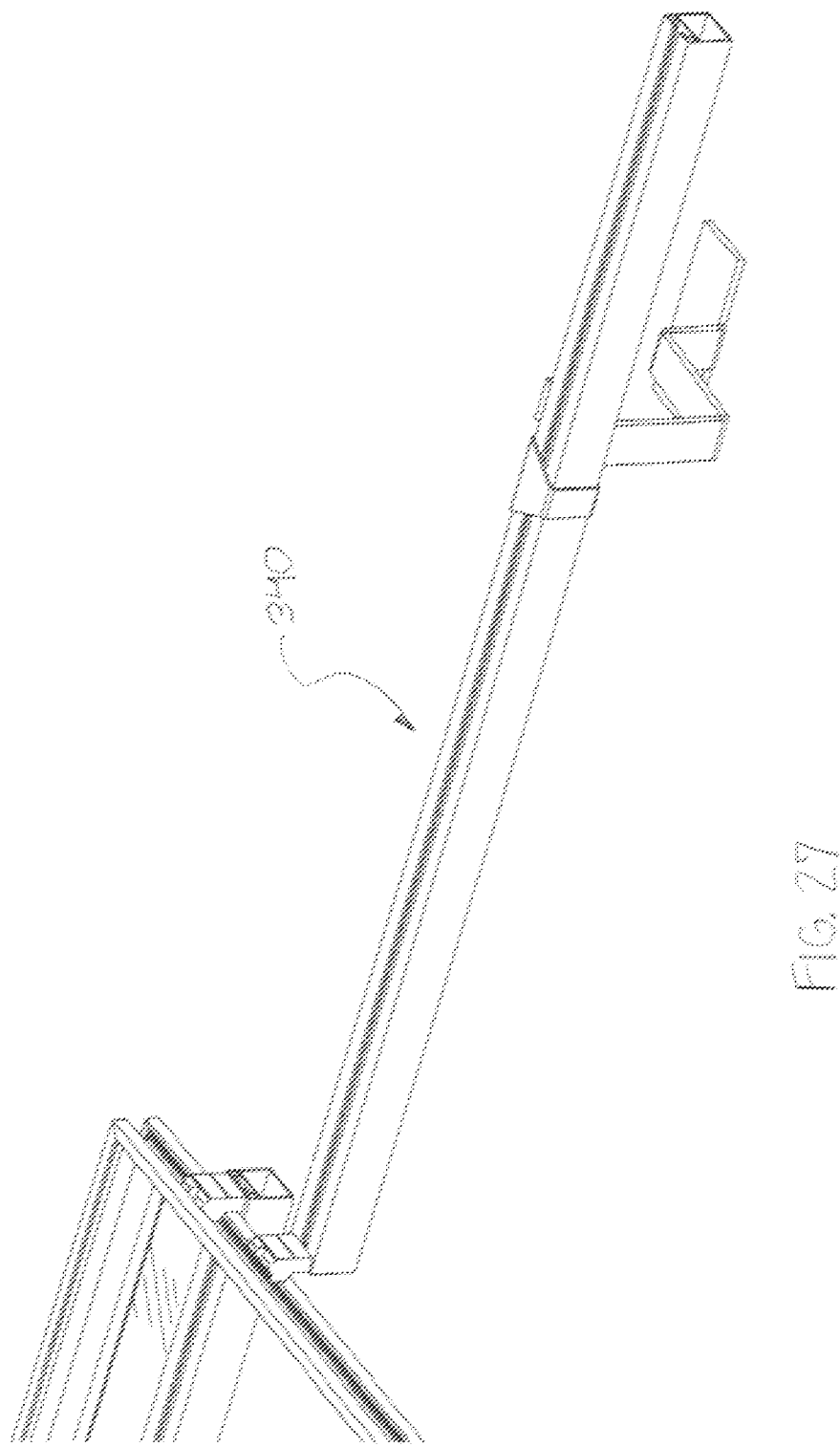

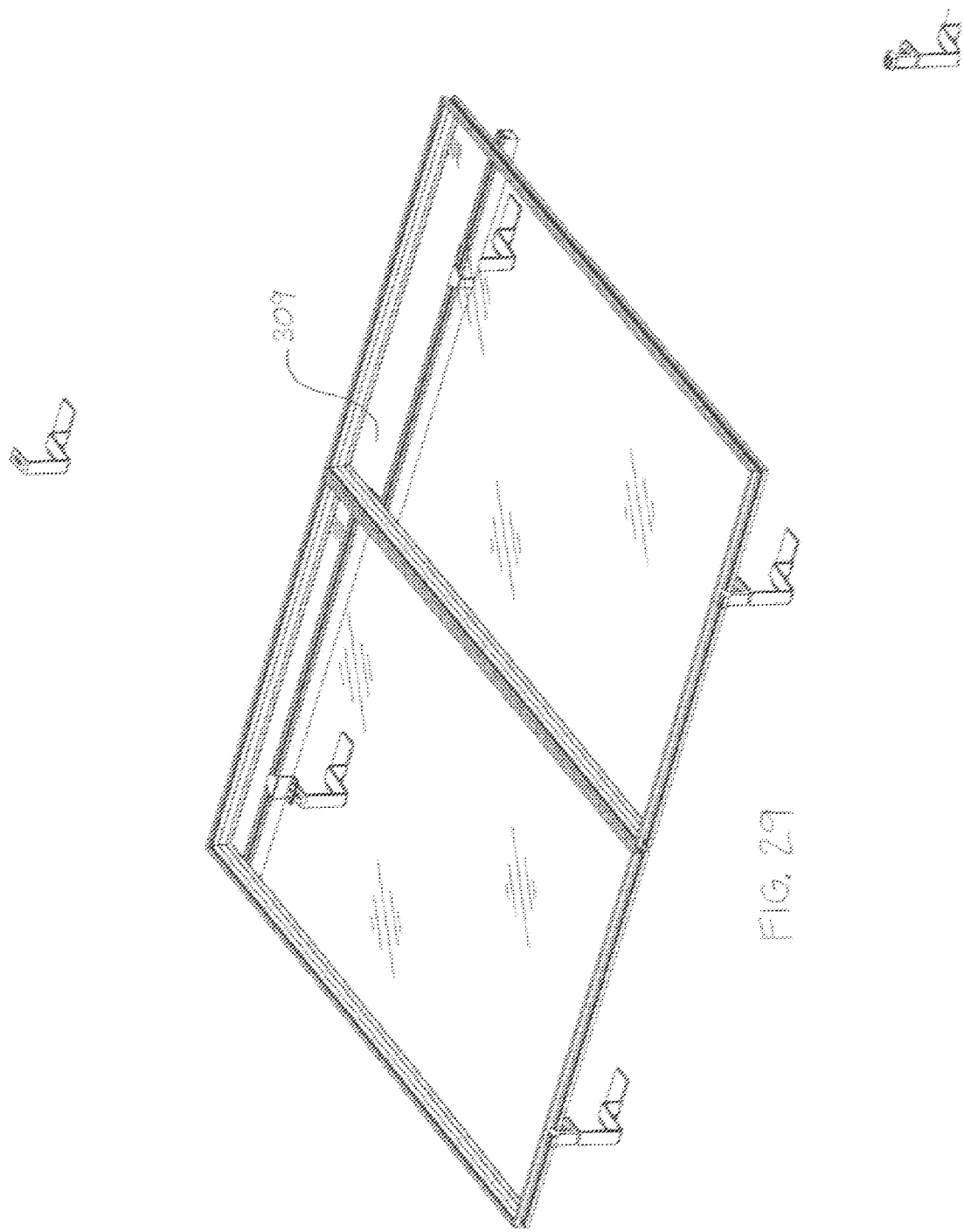

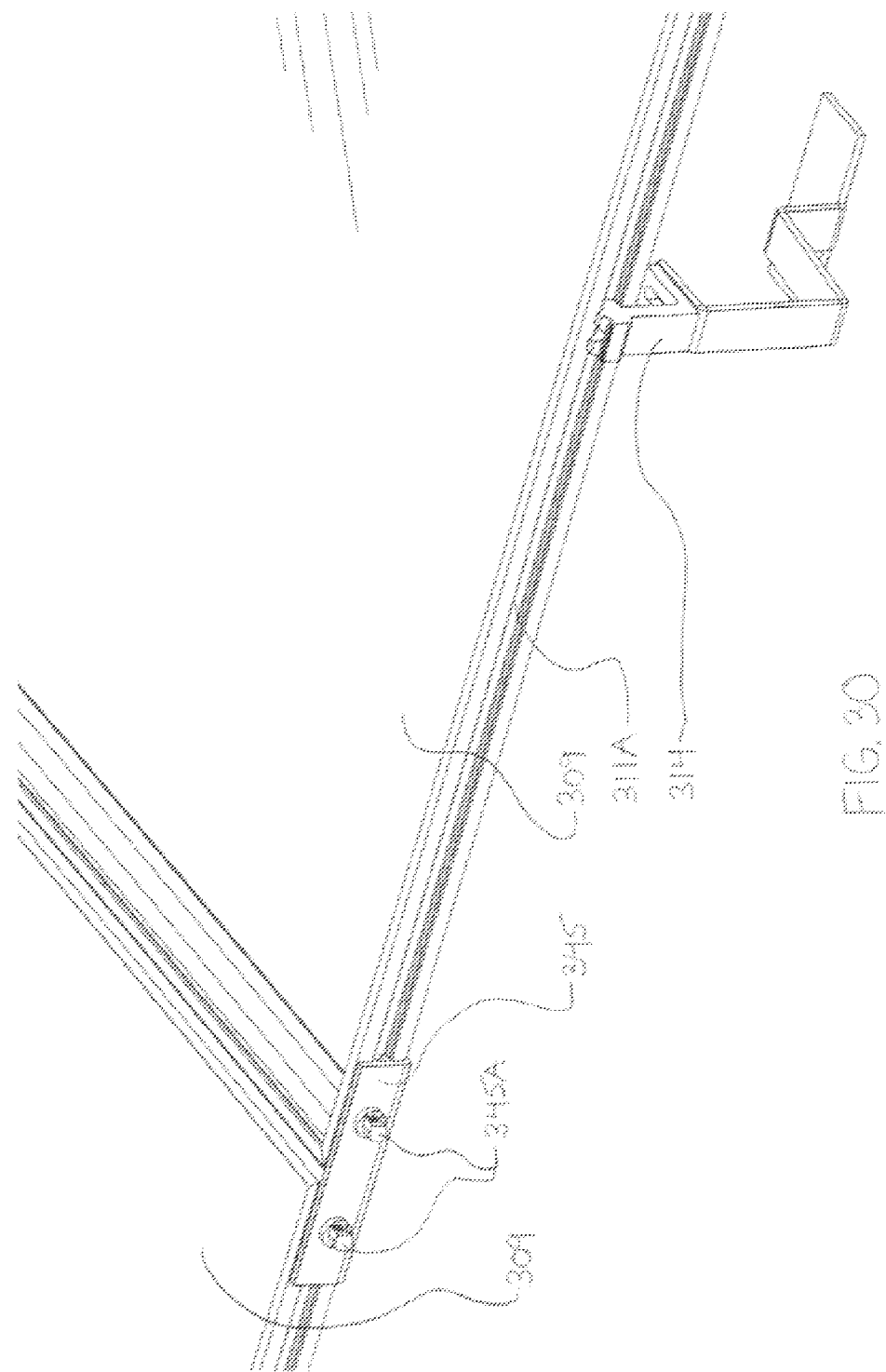

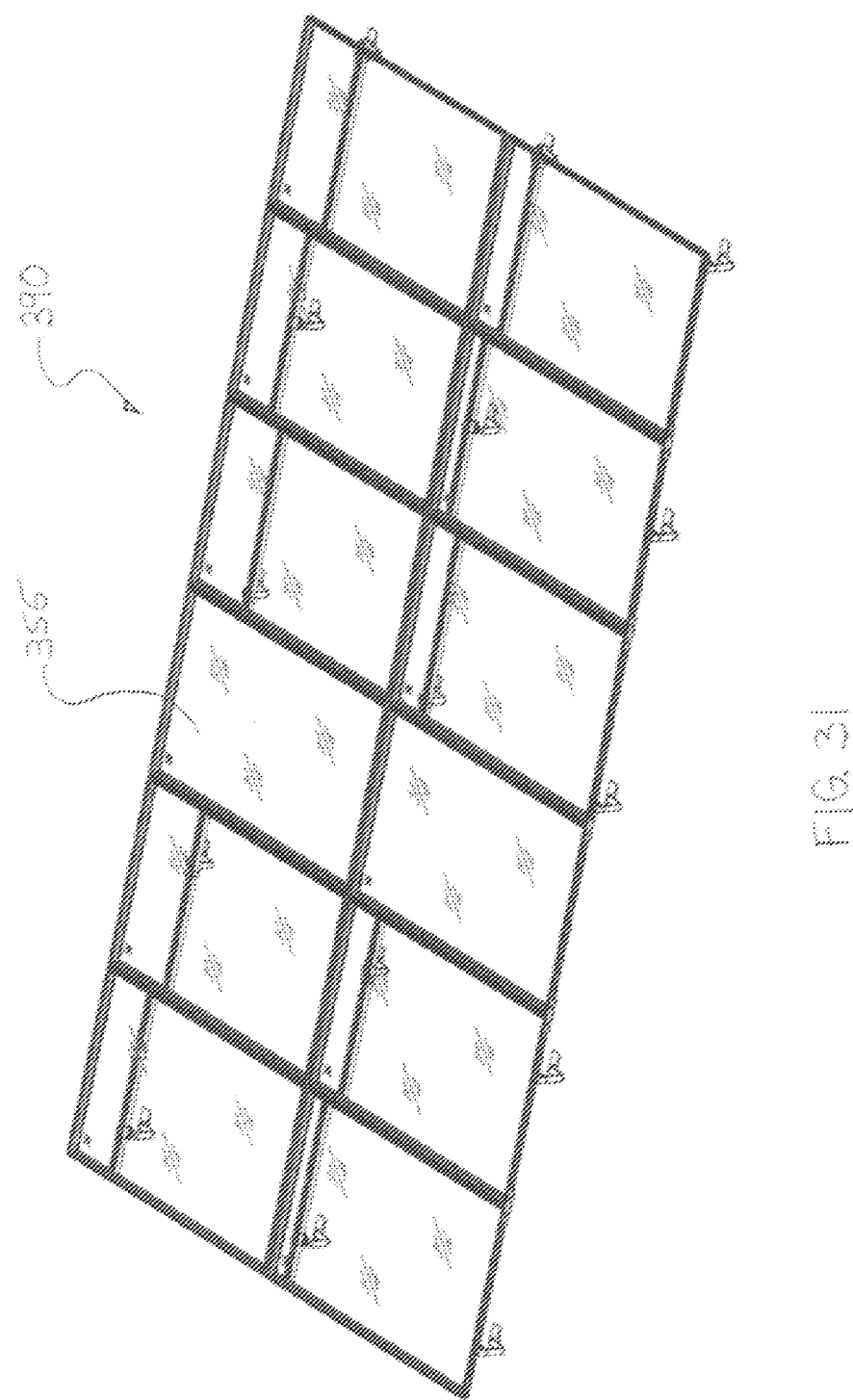

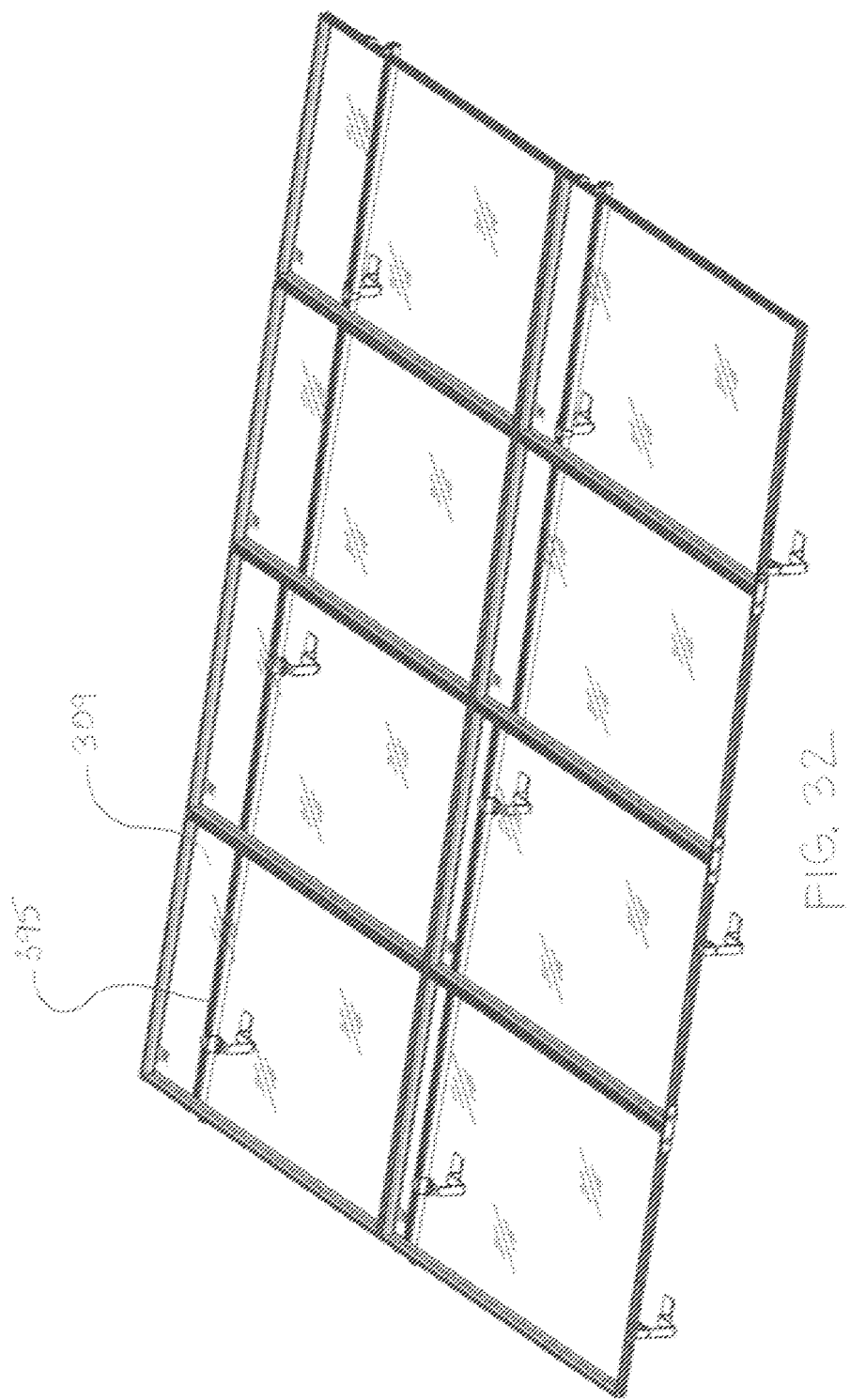

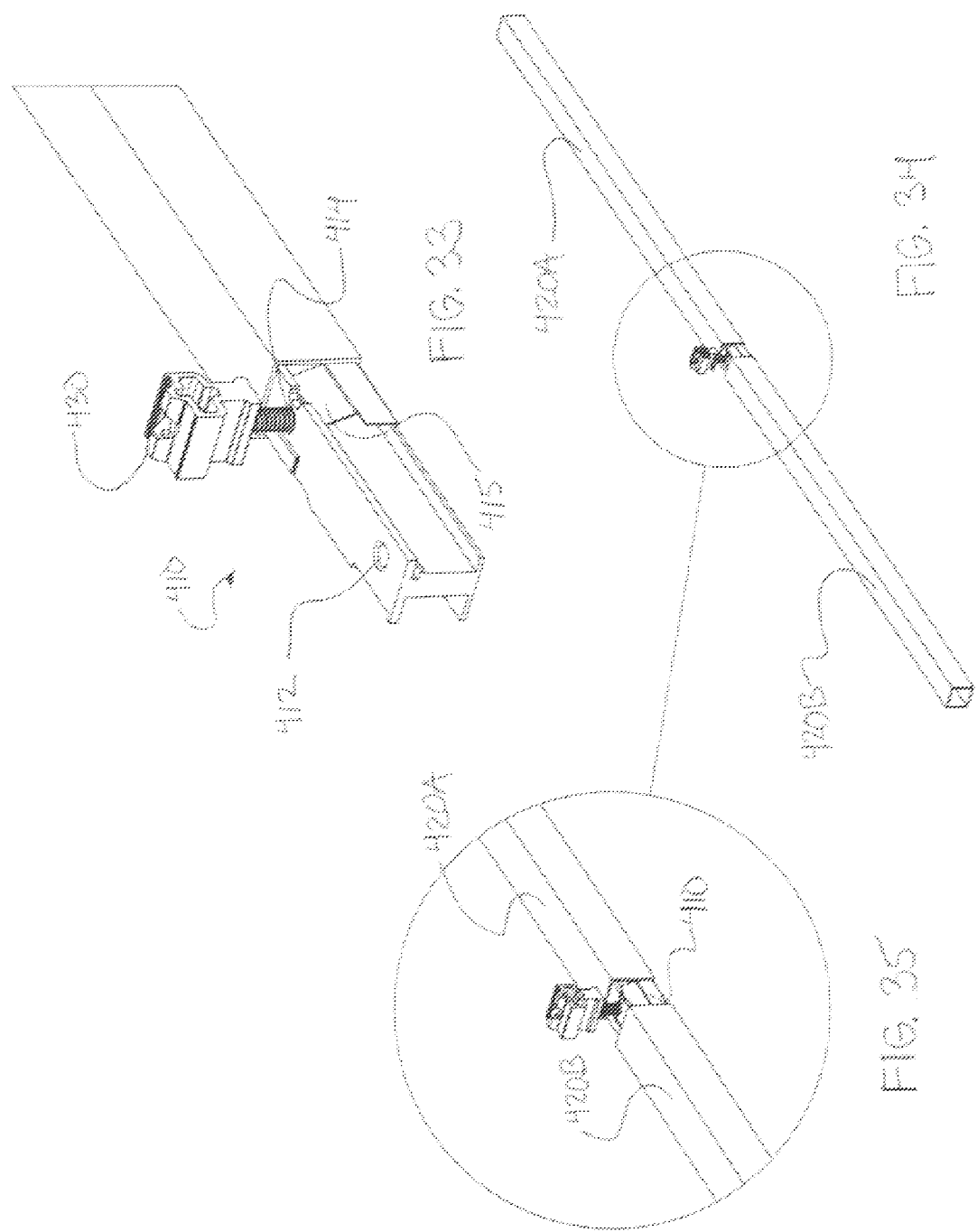

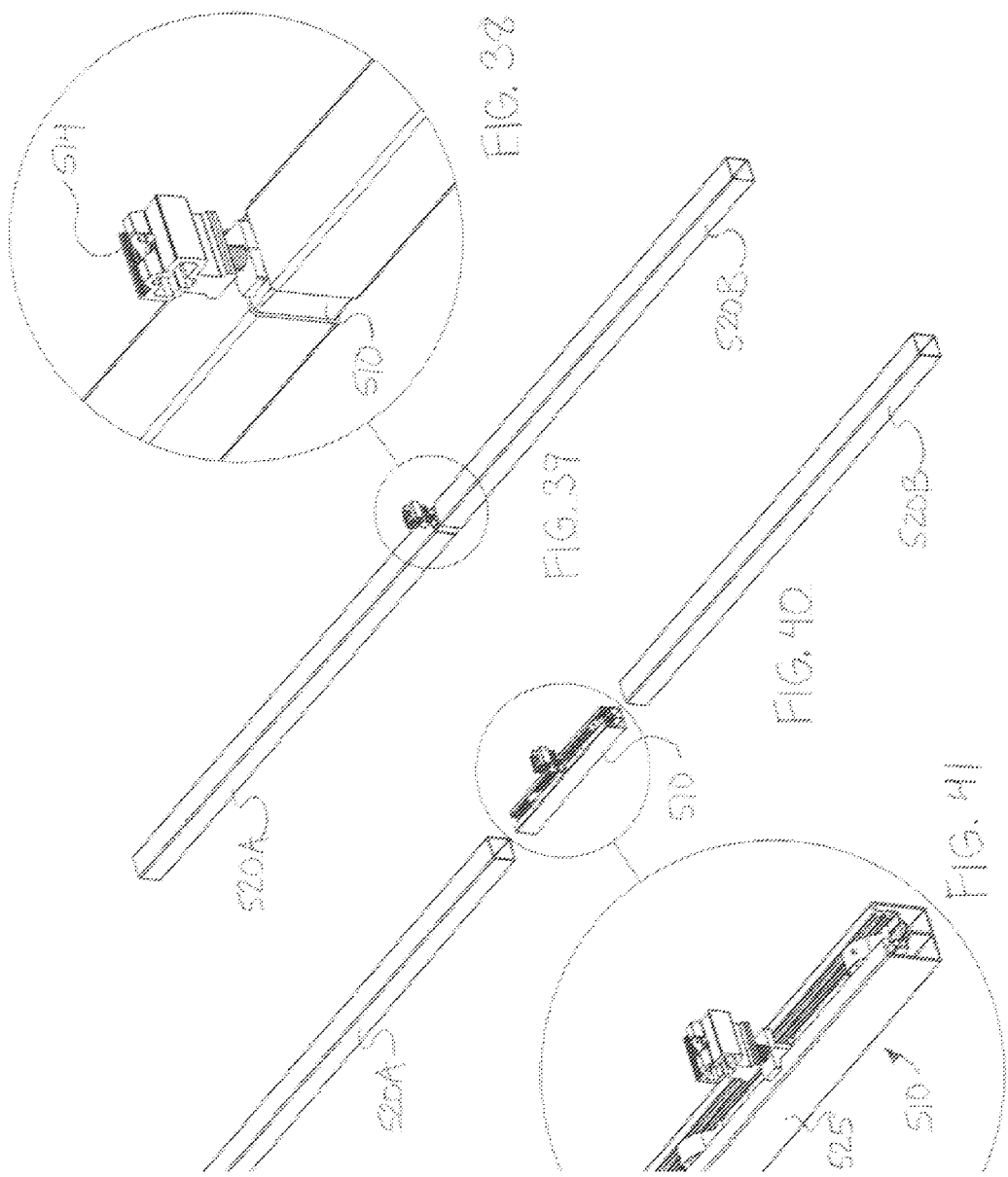

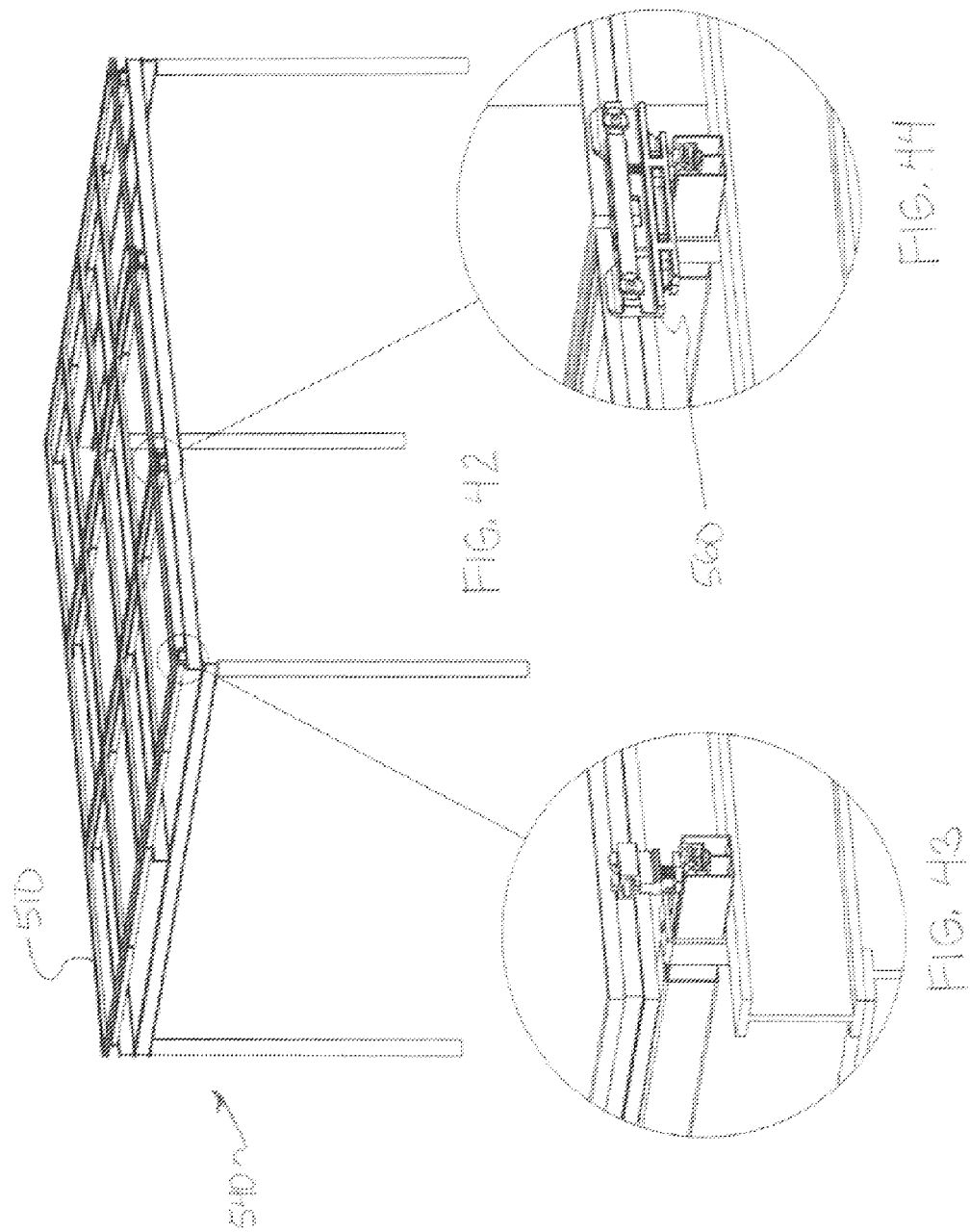

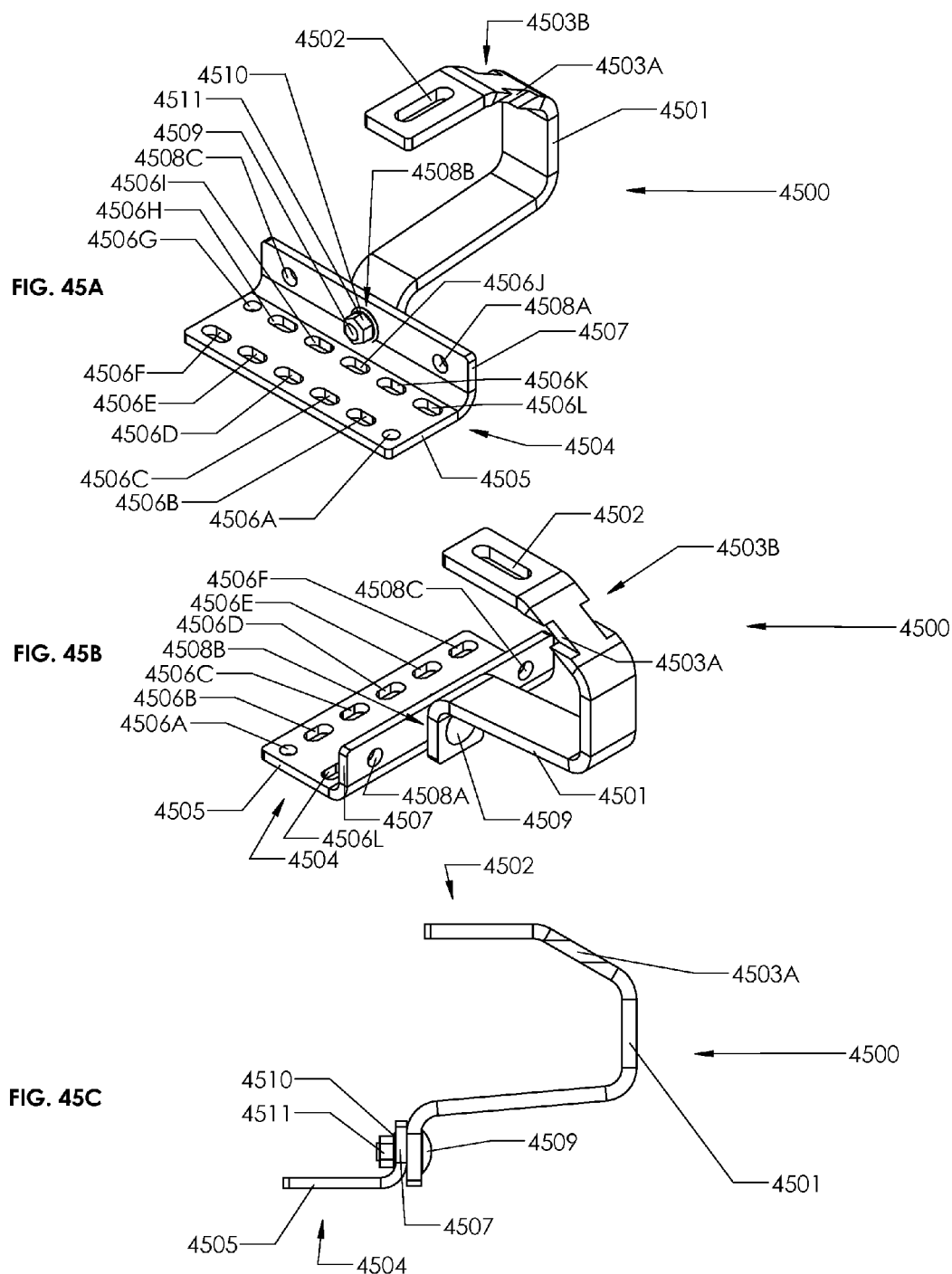

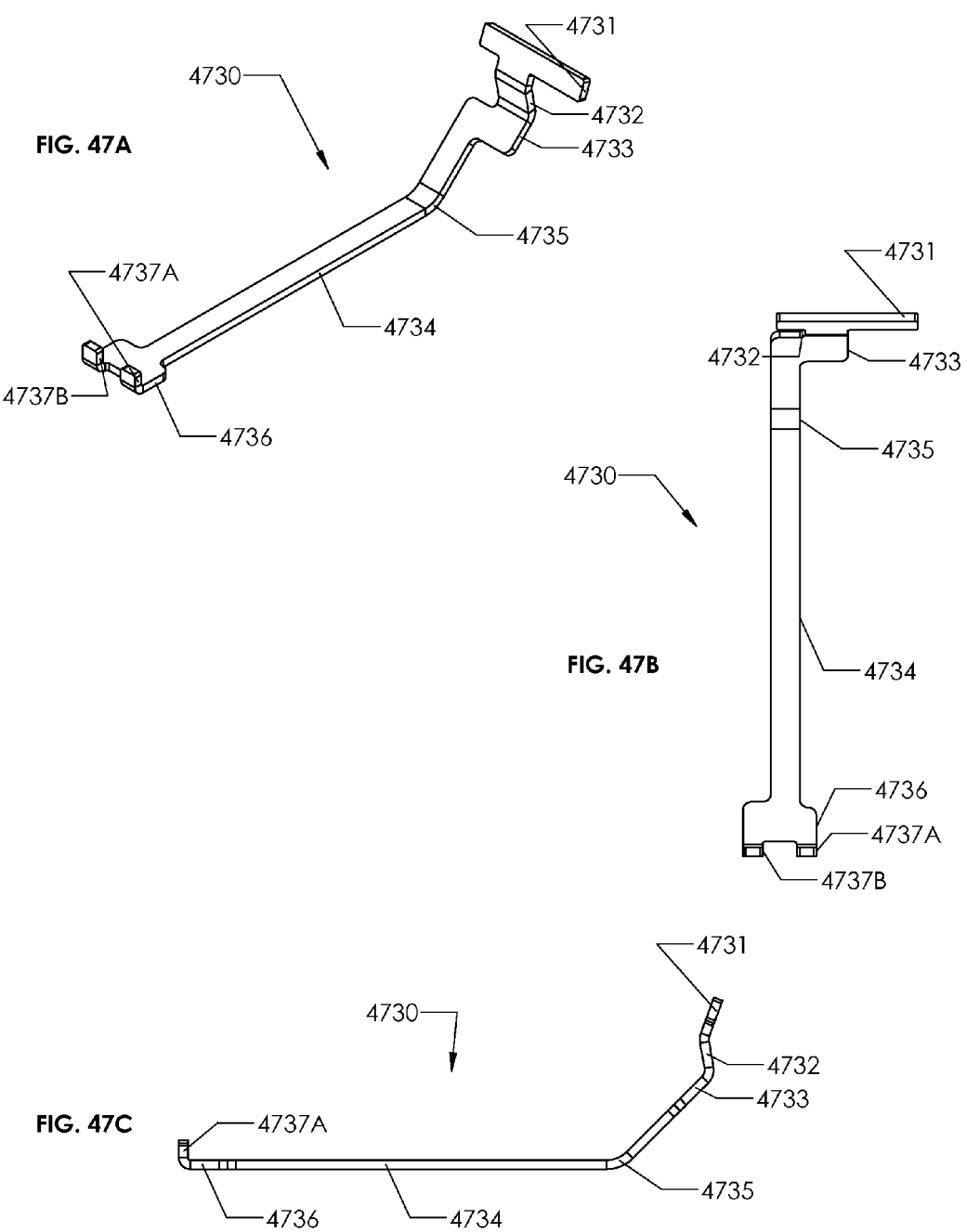

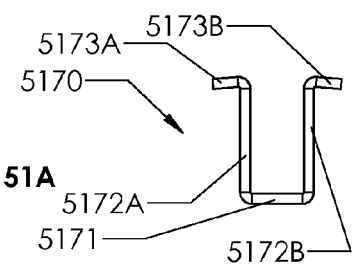
FIG. 51A
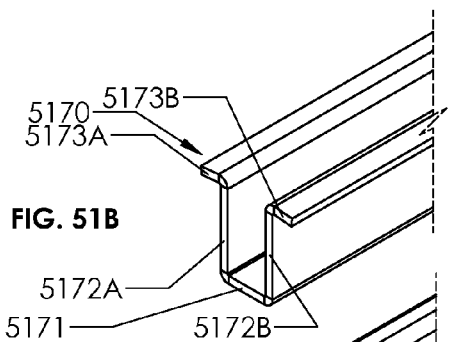
FIG. 51B
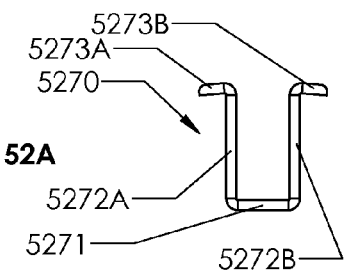
FIG. 52A
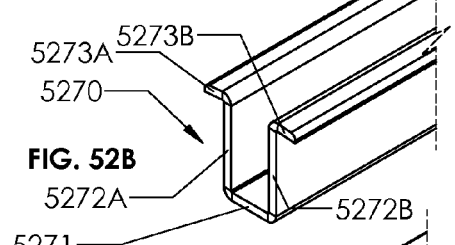
FIG. 52B
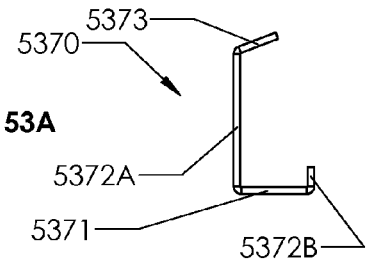
FIG. 53A
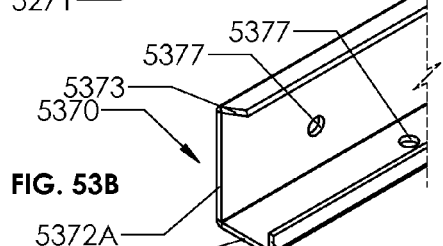
FIG. 53B
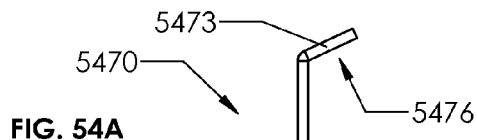
FIG. 54A
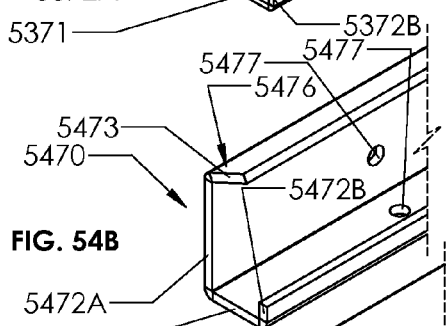
FIG. 54B
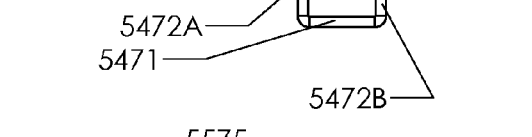
FIG. 55A
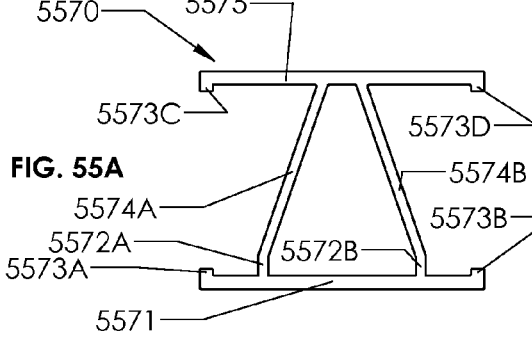
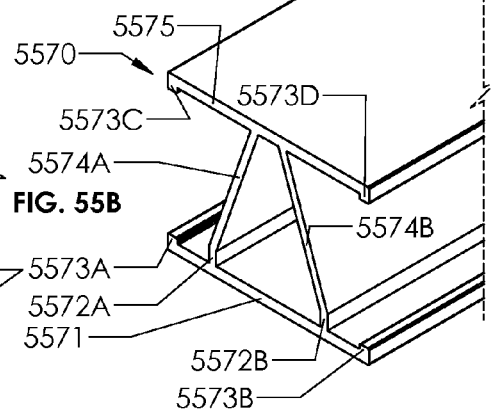
FIG. 55B

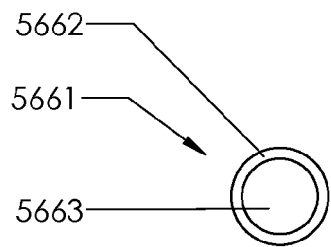
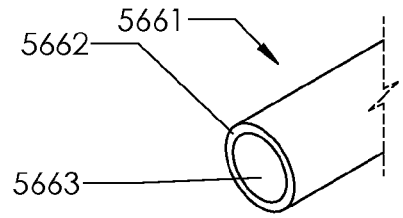
FIG. 56A  FIG. 56B
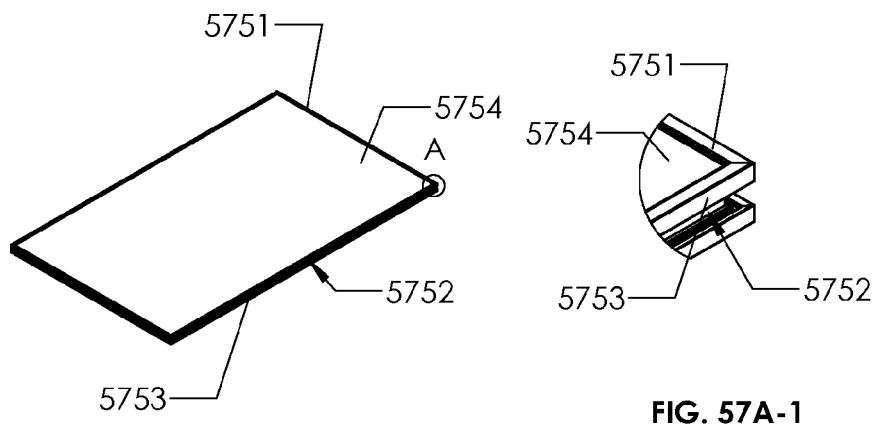
FIG. 57A  FIG. 57A-1
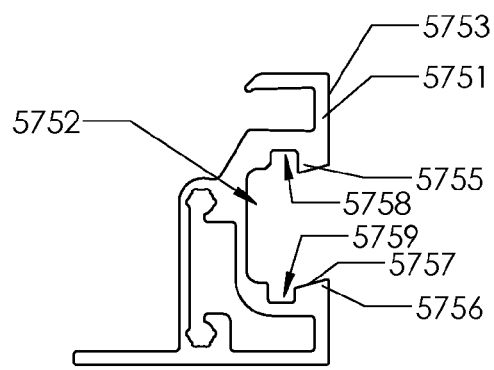
FIG. 57B

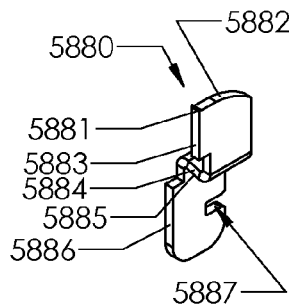
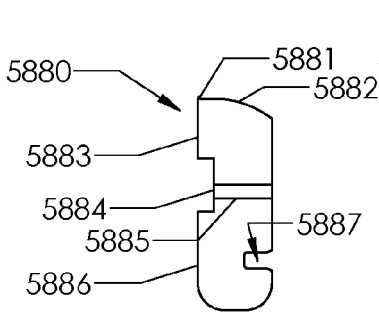
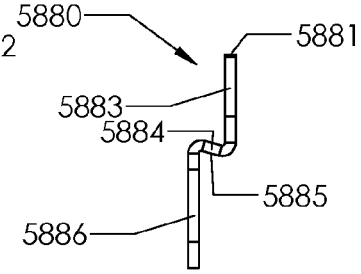
FIG. 58A  FIG. 58B  FIG. 58C
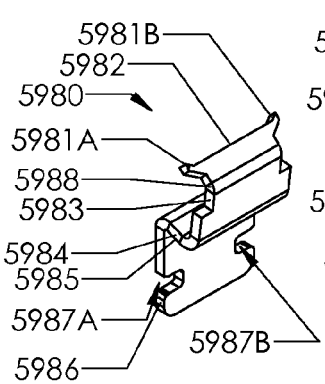
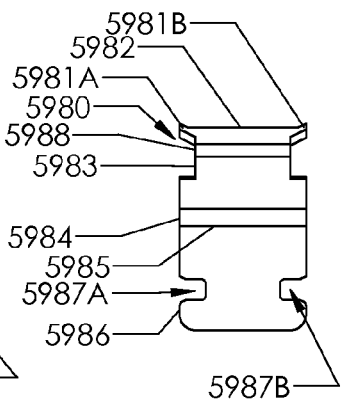
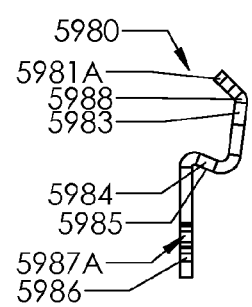
FIG. 59A  FIG. 59B  FIG. 59C
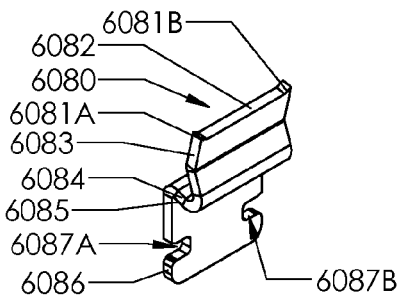
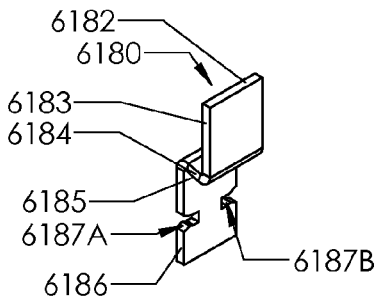
FIG. 60  FIG. 61
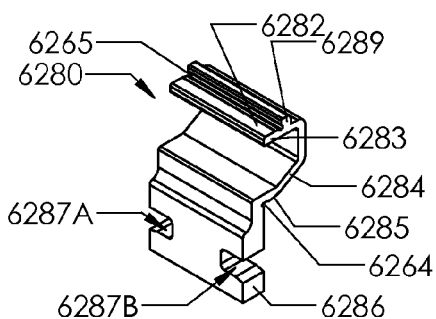
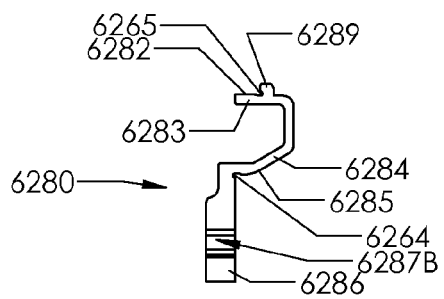
FIG. 62A  FIG. 62B

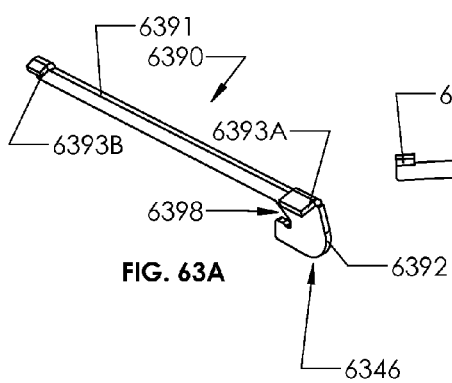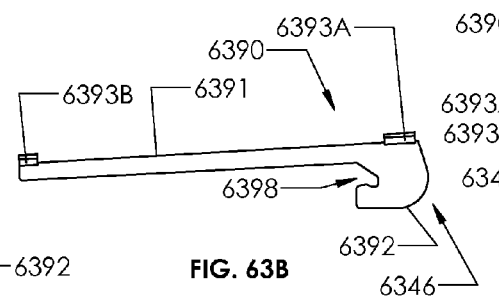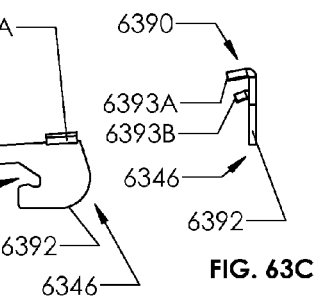
FIG. 63A  FIG. 63B  FIG. 63C
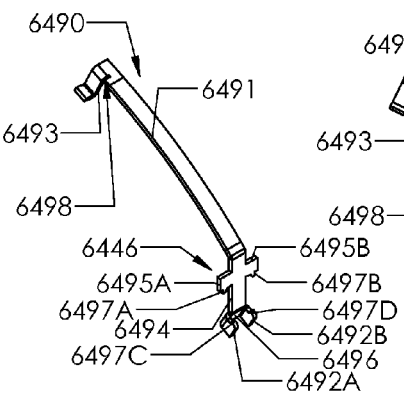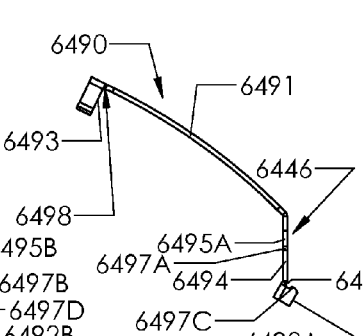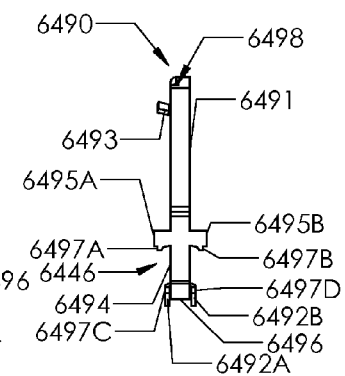
FIG. 64A  FIG. 64B  FIG. 64C
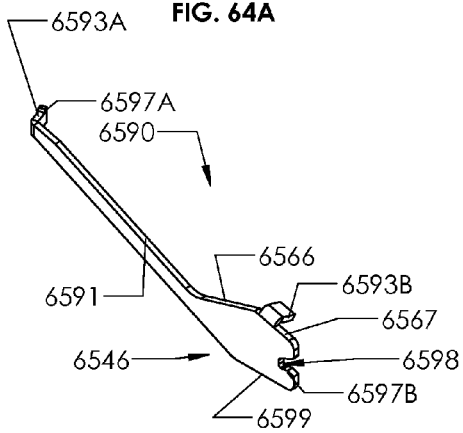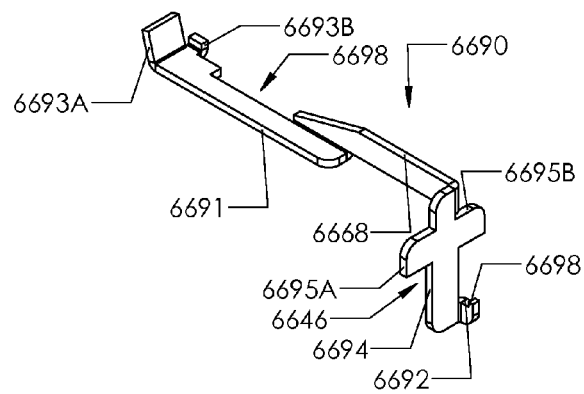
FIG. 65  FIG. 66

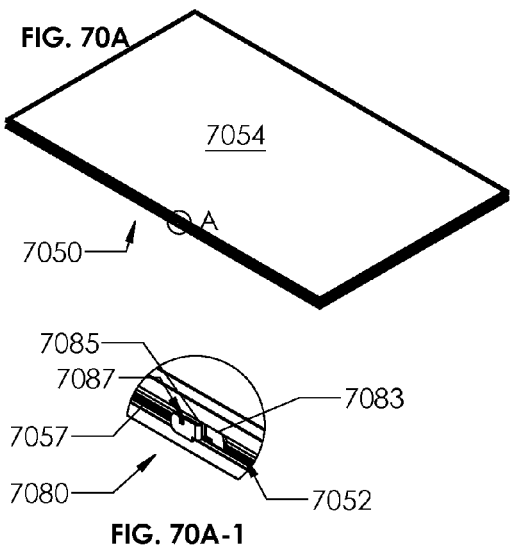
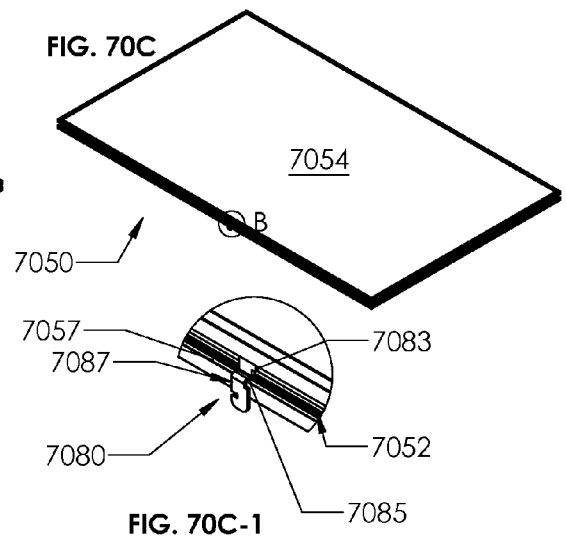
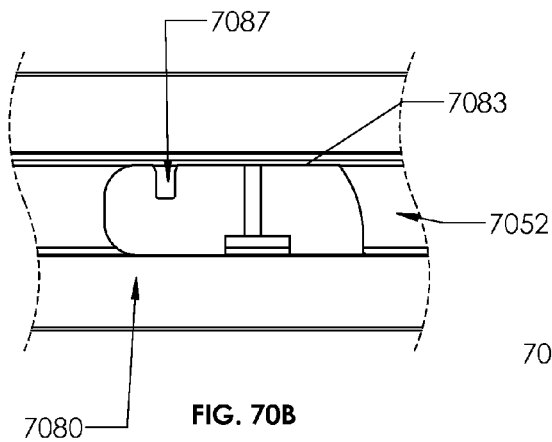
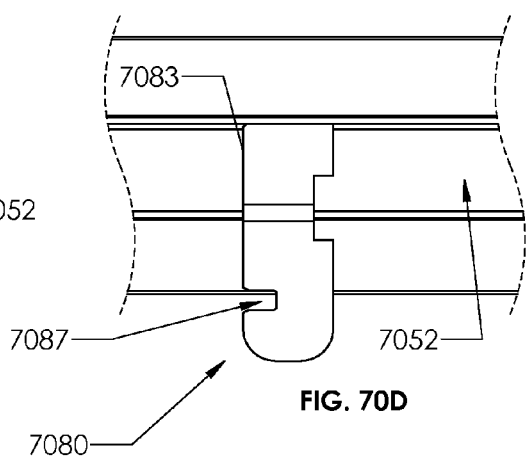
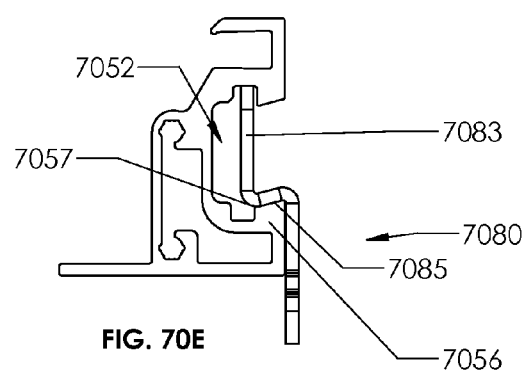

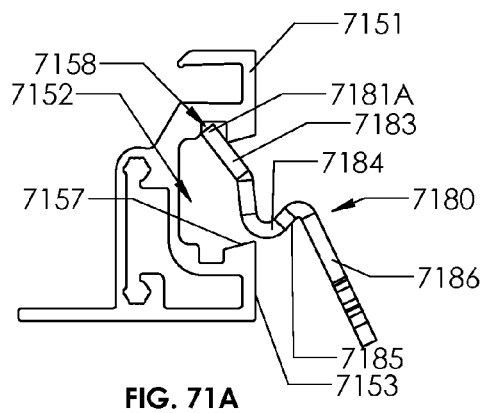
FIG. 71A
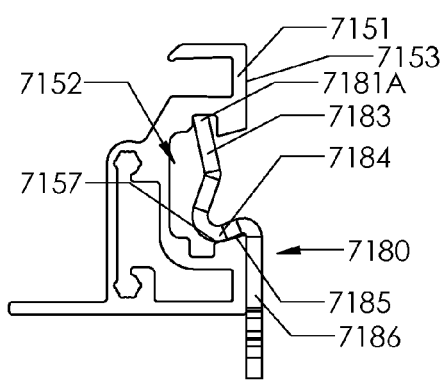
FIG. 71B
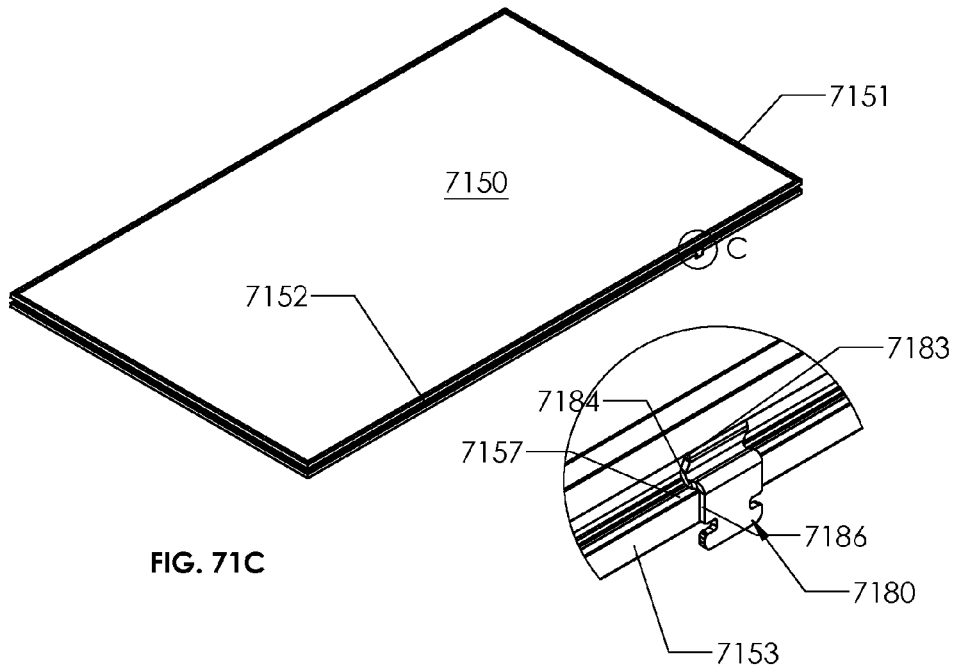
FIG. 71C
FIG. 71C-1

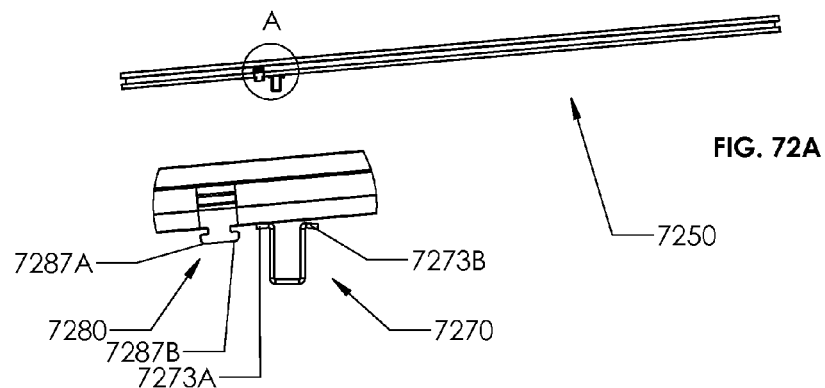
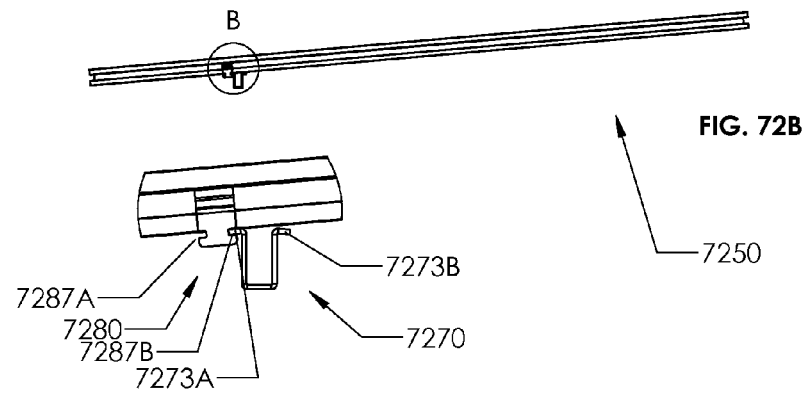
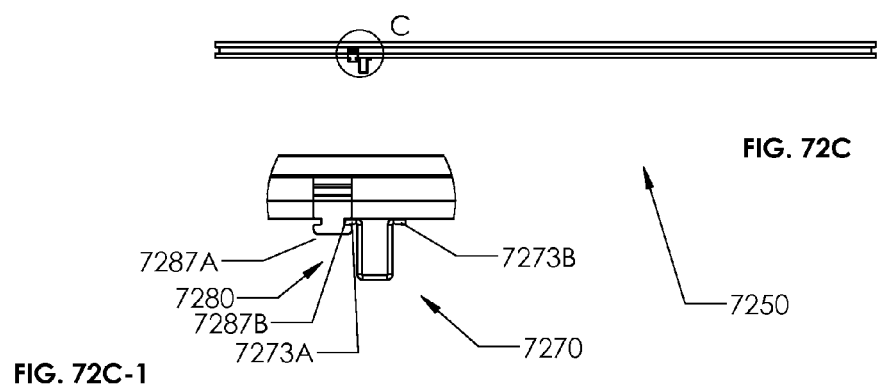

DISCRETE ATTACHMENT POINT APPARATUS AND SYSTEM FOR PHOTOVOLTAIC ARRAYS

CROSS REFERENCES

The present application is a continuation in part of (i) U.S. application Ser. No. 13/325,054, filed Dec. 13, 2011, and (ii) U.S. application Ser. No. 13/402,860, filed Feb. 22, 2012, and claims the benefit of the filing date of U.S. Provisional Patent Application Ser. No. 61/656,240 filed Jun. 6, 2012 and U.S. Provisional Patent Application Ser. No. 61/827,219 filed May 24, 2013. The foregoing applications are incorporated by reference in their entirety as if fully set forth herein.

BACKGROUND

Many photovoltaic (PV) arrays are mounted on structures that require discrete attachment points. For example, tile and slate roofs and various types of ground mounted structures may include a support structure for a PV array that requires attachment of the PV array to the structure at discrete locations in one of or both the x and y axes of a PV array mounting plane. In the case of tile roofs, this may be due to the difficulty of installing an attachment device at anywhere other than a specific place relative to the tile. For example, some tile products may only allow an attachment device to be installed within a small range of the overall reveal (length showing) of the tile and the underlying roof may require attachment to the rafters, which typically runs on a discrete schedule. Thus, locations for mounting along the y-axis may be restricted as by the tile and locations for mounting along the x-axis may be restricted as by the locations of the rafters. Ground mount structures may also require discrete attachment points in the x and/or y axes as may be due to fixed locations of the structural members and/or the need to line up the structural members with specific locations on the PV module.

Some attempts have been made to address the need for discrete attachment point mounting systems. Most utilize long rails to span between discrete attachment points, thereby freeing up the x and/or y axes. The rails may be connected directly to the PV module frame as by a compression clamp. The rails may be connected to the support structure below as by means of an attachment device such as a tile hook, standoff, hanger bolt, false tile, or mounting foot.

Such conventional systems suffer from a number of drawbacks. The long rails utilized, which can be often 10-20 feet long, may be difficult to warehouse, ship, and move onto a roof, or other support surface. These rails may also limit mounting options on complicated roofs which may have numerous smaller roof surfaces and/or numerous obstructions (such as vent pipes, chimneys, and so on) since rails may need to be cut on site, potentially wasting time and materials. Since rafters typically run in the direction from ridge to gutter, conventional long rail systems may be less cost-effective if the PV modules are oriented in "landscape" as opposed to "portrait" manner, since rails parallel to the rafters may require more total rail length or be prohibited, as by the PV module manufacturer or local building codes.

The mounting technology used to connect PV modules to these described long rails may also be cumbersome and time-consuming due to large numbers of small parts, including fasteners. The attachment devices utilized may also be expensive and time-consuming to install. Such conventional systems may further suffer from a lack of adaptability to uneven roof surfaces as well as time-consuming and unreliable grounding hardware. There may also be very little integration with other required equipment in the overall PV system, such as electrical junction and combiner boxes, wire management devices, and other equipment.

Prior discrete attachment point systems and related photovoltaic arrays may frequently require more attachment devices and/or more material per device than needed for acceptable structural performance of the system. For example, typical tile roof mounting systems, which may not interconnect the rows, may require two rows of rails per row of PV modules, or may require rails that traverse the distance under an entire row or column of PV modules, or at least many modules in a row or column of PV modules. This constraint may limit the ability of a system designer to optimize the structural support system so that the level of support provided is substantially matched to the level of support required, based on various site conditions such as wind, snow, roof structure, and so on. Lack of structural optimization could waste a significant quantity of materials relative to a more optimized approach.

The foregoing examples of the related art and limitations related therewith are intended to be illustrative and not exclusive. Other limitations of the related art will become apparent to those of skill in the art upon a reading of the specification and a study of the figures.

SUMMARY

A discrete attachment point apparatus and system for photovoltaic arrays is disclosed as well as an installed photovoltaic array using attachment apparatus. The following embodiments and aspects thereof are described and illustrated in conjunction with systems, apparatus, tools, and methods which are meant to be exemplary and illustrative, not limiting in scope. In various embodiments, one or more of the above-described problems have been reduced or eliminated, while other embodiments are directed to other advantages or improvements.

One embodiment provides an installed photovoltaic array, comprising a first photovoltaic module; a second photovoltaic module adjacent to the first photovoltaic module; a third photovoltaic module adjacent to the second photovoltaic module; a rail member located substantially beneath at least a portion of the second photovoltaic module and comprising a first end located near a first gap between the first and second photovoltaic modules and a second end located near a second gap between the second and third photovoltaic modules; a first attachment bracket located near the first end, and; a second attachment bracket located near the second end; wherein (i) the second photovoltaic module is substantially coplanar with and located between the first and third photovoltaic modules and (ii) the rail member is connected to the first, second, and third photovoltaic modules and attached to a support structure by the first and second attachment brackets. Another embodiment provides an installed photovoltaic array comprising: a photovoltaic module; a rail located substantially beneath the photovoltaic module; and a lever clip, the lever clip comprising a head portion connecting the photovoltaic module to the rail, a lever portion extending away from the head portion, and a retaining portion near an end of the lever portion; wherein the lever portion acts as a lever to rotate the head portion during installation such that the head portion secures the photovoltaic module to the frame.

In summary, it is shown below in this disclosure, with at least one embodiment disclosing (a) two or more substantially coplanar photovoltaic modules; (a) a rail member connected to two, and alternately connected to three, photovoltaic modules and attached to a support structure by one, two or more attachment brackets, such as tile hooks or the like; (c) a rail member that is adjustably connected to two or more brackets in a direction substantially parallel with a plane defined by a top surface of a light-receiving side of a photovoltaic laminate of a photovoltaic module; (d) apparatus, structure, and system wherein adjustment of a rail member enables connection of two, three, or more photovoltaic modules to the rail member when associated attachment brackets do not align with gaps between the photovoltaic modules; one or more attachment brackets, associated with two or more photovoltaic modules, align with the tiles of a roof or other support structure; (e) at least a portion of a rail member spans between a gap (between two photovoltaic modules) and an attachment bracket; (f) attachment brackets substantially align with roof tiles; (g) at least one attachment bracket is connected to a rail member by a lever clip; (h) at least one lever clip comprises a head portion connecting to an attachment bracket and a spring arm is securing the lever clip to a rail member (see also the description of FIGS. 63A-68 below); (i) an attachment bracket which is shaped to fit beneath a roof tile; (j) an attachment bracket (such as a tile hook, or the like) comprises one or more notches for receiving at least a portion of a rail member; (k) a photovoltaic module is mounted to a support structure (such as a roof) without a continuous rail located therebeneath (for example, beneath the photovoltaic module, for example, in FIGS. 50A and 50B are shown a rail portion, not a continuous rail, located beneath photovoltaic modules 5050D and 5050B, and photovoltaic modules 5050A shows no rail portion located under or therebeneath it.); (l) a photovoltaic module is connected to an attachment bracket without a rail (for example, in FIGS. 50A and 50B is shown tile hook 5000A connected to photovoltaic module 5050A without a rail or rail member); (m) a coupling that connects a first photovoltaic module to a second photovoltaic module; and (n) a coupling that is height-adjustably connected to a rail member.

In further summary, it is shown below in this disclosure, with at least one embodiment disclosing (o) a lever clip retaining portion that engages a photovoltaic module in a location laterally displaced from a rail to resist a rotation of the lever clip in a removal direction; (p) a lever portion comprising an arm, with at least one embodiment of arm being substantially rigid; (q) a lever portion arm which acts as a spring that applies a force that at least partially holds a retaining portion in an installed position; (r) a lever clip rotates clockwise (or counterclockwise) to install; (s) a lever clip retaining portion that rests above at least a portion of a photovoltaic module and exerts a downward force thereon (to that module); (t) a lever clip retaining portion that rests below at least a portion of a photovoltaic module and exerts an upward force thereon (to that module); (u) a lever clip that is deployable as a single unit without requiring a separate tool to install; (v) an installed photovoltaic array comprising a bracket which is fully secured to a photovoltaic module prior to installation of that photovoltaic module on a roof, the bracket comprising a slot for receiving at least a portion of a rail during installation, with an optional embodiment that the bracket enables a drop-in connection of the photovoltaic module to the frame; (w) a lever clip lever portion that pivots about a portion of a lever clip head portion during installation; (x) a lever clip head portion that applies a preload to a joint between a photovoltaic module and a rail; (y) a lever clip head portion that comprises a pivot portion, the head portion pivoting about the pivot portion during installation, with an optional embodiment that the pivot portion resists upward movement of the photovoltaic module; (z) a lever clip head portion that connects below at least a portion of a rail; (aa) photovoltaic array comprising a photovoltaic module located adjacent to another photovoltaic module having a lever clip head portion comprising a first pivot portion engaging the photovoltaic module and a second pivot portion engaging the adjacent photovoltaic module; (bb) a lever clip that cuts into a frame of a photovoltaic module to create an electrical ground path between the lever clip and a rail; (cc) a lever clip is made of metal, such as sheet metal; and (dd) a lever clip that is cast, molded, stamped, extruded, or formed or otherwise made by any method as known to one skilled in the art.

In addition to the exemplary aspects and embodiments described above, further aspects and embodiments will become apparent by reference to the figures and by study of the following detailed descriptions.

BRIEF DESCRIPTION OF THE DRAWINGS

Demonstrative embodiments are illustrated in referenced figures and drawings. It is intended that the embodiments and figures disclosed herein are to be considered illustrative rather than restrictive.

FIG. 3 shows a orthogonal view of a cam foot in contact with a PV array over spanner bars.

FIG. 9A is a perspective view of two spanner bars with a double male connector.

FIG. 9B is a perspective view of two spanner bars, which are connected.

FIGS. 10A and 10B are side views of a skirt connecting to a cam foot.

FIG. 18A is a perspective view of two spanner bars each with a double male connector.

FIG. 18B is a perspective view of two connected spanner bars.

FIG. 18C is a perspective view of an enlargement of an end of a spanner bar showing a double male connector.

FIG. 19 is a perspective view of a spanner bar connected to a tile hook.

FIG. 20 is a perspective view of a PV array with spanner bars and tile hooks.

FIG. 21 is an enlarged perspective view of a portion of a PV module and spanner bar.

FIG. 22 is a perspective view of a PV module, spanner bar, and tile hooks.

FIG. 23 is a side view of a PV module and tile hooks.

FIG. 24 is an enlarged perspective view of a portion of a PV module and spanner bar.

FIG. 25 is a side view of a PV module, spanner bars, and tile hooks.

FIG. 27 is an enlarged perspective view of a portion of a PV module and spanner bars and a tile hook.

FIG. 29 is a perspective view of PV modules, spanner bars, and tile hooks.

FIG. 30 is an enlarged perspective view of a portion of two PV modules and an interlock.

FIG. 31 is a perspective view of a PV array showing spanner bars and tile hooks.

FIG. 32 is a perspective view of a PV array showing spanner bars and tile hooks.

FIG. 33 is a perspective view of a coupling.

FIG. 34 is a perspective view of two spanner bars and a coupling.

FIG. 35 is an enlarged view of a portion of FIG. 34.

FIG. 36 is a perspective view of a portion of a spanner bar and a coupling.

FIG. 38 is am enlargement of a section of FIG. 39.

FIG. 39 is a perspective view of two spanner bars and a coupling.

FIG. 40 is a perspective view of two spanner bars and a coupling.

FIG. 41 is an enlargement of a portion of FIG. 40.

FIG. 42 is a perspective view of a PV array and a ground mount structure.

FIG. 43 is an enlargement of a portion of FIG. 42.

FIG. 44 is an enlargement of a portion of FIG. 42.

FIG. 45A is a perspective view of a tile hook.

FIG. 45B is a rear perspective view of a tile hook.

FIG. 45C is a side view of a tile hook.

FIG. 47A is a perspective view of a lever clamp.

FIG. 47B is a top view of a lever clamp.

FIG. 47C is a side view of a lever clamp.

FIG. 51A is an orthogonal view of a rail.
FIG. 51B is a perspective view of a rail.
FIG. 52A is an orthogonal view of a rail.
FIG. 52B is a perspective view of a rail.
FIG. 53A is an orthogonal view of a rail.
FIG. 53B is a perspective view of a rail.
FIG. 54A is an orthogonal view of a rail.
FIG. 54B is a perspective view of a rail.
FIG. 55A is an orthogonal view of a rail.
FIG. 55B is a perspective view of a rail.
FIG. 56A is an orthogonal view of a pipe.
FIG. 56B is a perspective view of a pipe.
FIG. 57A is a perspective view of a PV module.
FIG. 57A-1 is a detail view of the corner of a PV module.
FIG. 57B is an orthogonal view of the frame of a PV module.
FIG. 58A is a perspective view of a bracket.
FIG. 58B is a side view of a bracket.
FIG. 58C is a front view of a bracket.
FIG. 59A is a perspective view of a bracket.
FIG. 59B is a side view of a bracket.
FIG. 59C is a front view of a bracket.
FIG. 60 is a perspective view of a bracket.
FIG. 61 is a perspective view of a bracket.
FIG. 62A is a perspective view of a bracket.
FIG. 62B is a side view of a bracket.
FIG. 63A is a perspective view of a lever clip.
FIG. 63B is a side view of a lever clip.
FIG. 63C is a front view of a lever clip.
FIG. 64A is a perspective view of a lever clip.
FIG. 64B is a side view of a lever clip.
FIG. 64C is a front view of a lever clip.
FIG. 65 is a perspective view of a lever clip.
FIG. 66 is a perspective view of a lever clip.
FIG. 70A is a perspective view of a PV module and a bracket.

FIG. 70A-1 is a detail view of a perspective view of a PV module and a bracket.

FIG. 70B is a side view of a PV module and a bracket.
FIG. 70C is a perspective view of a PV module and a bracket.

FIG. 70C-1 is a detail view of a perspective view of a PV module and a bracket.

FIG. 70D is a side view of a PV module and a bracket.
FIG. 70E is an orthogonal view of a PV module and a bracket.

FIG. 71A is an orthogonal view of a bracket entering the groove of a frame.

FIG. 71B is an orthogonal view of a bracket installed in the groove of a frame.

FIG. 71C is a perspective view of a bracket installed in a frame.

FIG. 71C-1 is a detailed view of a bracket installed in a frame.

FIG. 72A is a side view of a frame with a bracket being installed on a rail.

FIG. 72A-1 is a detail view of a frame with a bracket being installed on a rail.

FIG. 72B is a side view of a frame with a bracket being installed on a rail.

FIG. 72B-1 is a detail view of a frame with a bracket being installed on a rail.

FIG. 72C is a side view of a frame with a bracket being installed on a rail.

FIG. 72C-1 is a detail view of a frame with a bracket being installed on a rail.

FIG. 73A-1 is a detail view of a lever clip attaching a PV module to a rail.

FIG. 73B-1 is a detail view of a lever clip attaching a PV module to a rail.

FIG. 73C-1 is a detail view of a lever clip attaching a PV module to a rail.

FIG. 74A-1 is a detail view of two PV modules being connected to a rail by a lever clamp.

FIG. 74B-1 is a detail view of two PV modules being connected to a rail by a lever clamp.

FIG. 74C-1 is a detail view of two PV modules being connected to a rail by a lever clamp.

FIG. 74D-1 is a detail view of two PV modules being connected to a rail by a lever clamp.

FIG. 76-1 is a detail view of the above.

FIG. 77-1 is a detail view of a bracket of the above.

FIG. 77-2 is a detail view of a lever clip of the above.

FIG. 82-1 is a detail view of the above.

DETAILED DESCRIPTION OF THE INVENTION

Figure 1A:
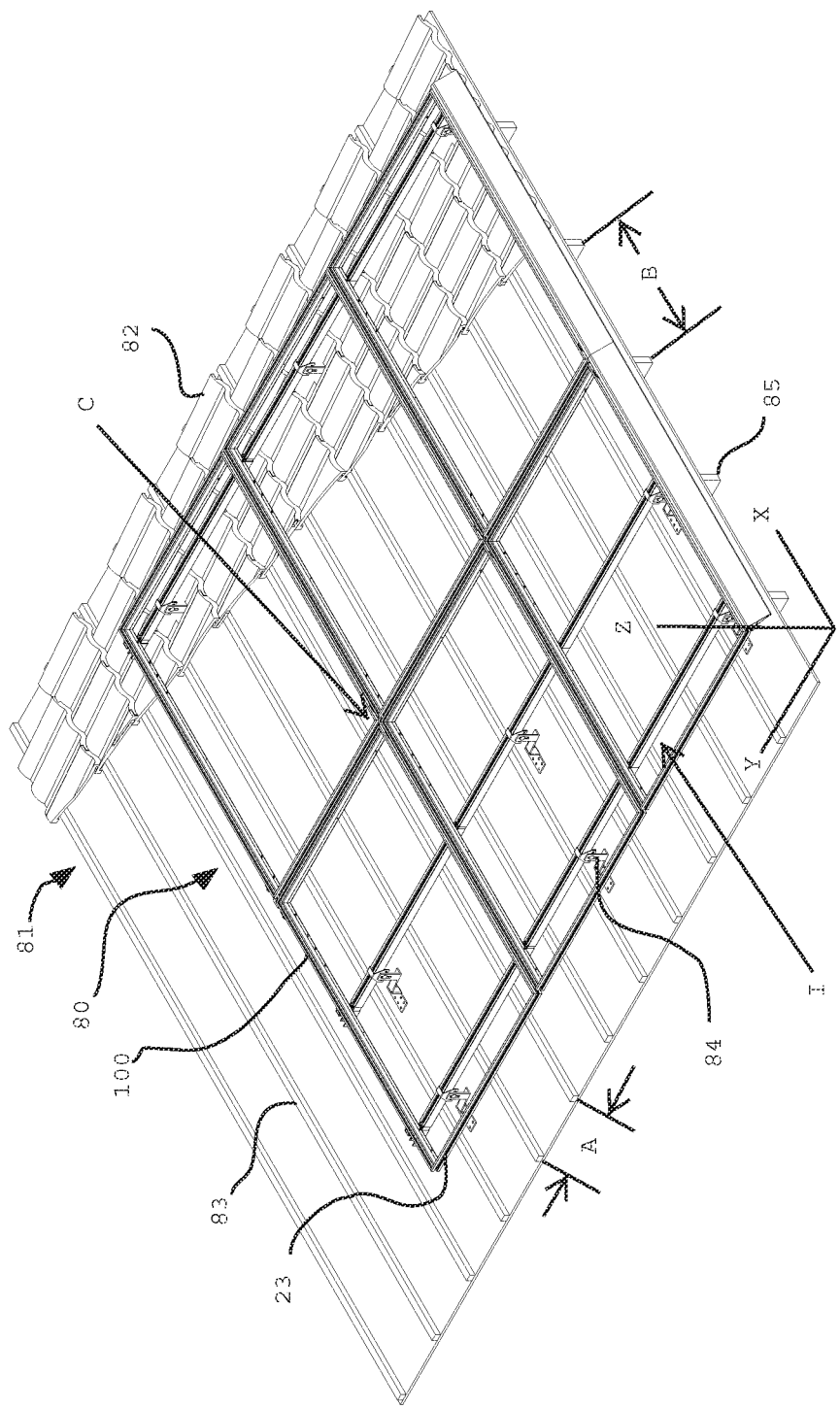
FIG. 1A shows a perspective view of a PV array on a roof.

Terms. With reference to the figure and description herein:

Adjacent refers to being positioned next to or adjoining or neighboring, or having a common vertex or common side. Thus, adjacent PV panels would include PV panels that have one side close to (from a few inches apart to abutting) and facing one side of another PV panel, such as shown in FIGS. 1A and 20. Sometimes, but not always, the corners of adjacent panels align; so four adjacent panels would have one corner each that nearly or actually touch the other three corners, such as exemplified at Point C in FIGS. 1A and 20, and its descriptions.

Adjustable refers to the capability of being changed so as to match or fit.

Adjustably connected refers to an object, item, mechanism, apparatus, combination, feature, link or the like that loosely, slidable, or rigidly links, interlocks, joins, unites or fastens two or more things together in a manner that can be changed so as to match or fit.

Attach or attachment refers to one or more items, mechanisms, objects, things, structures or the like which are joined, fastened, secured, affixed or connected to another item, or the like in a permanent, removable, secured or non-permanent manner. For example, a tile hook may be attached to a support structure, such as a roof, as exemplified at tile hook 84 in FIG. 1A, and its descriptions. As another example, a PV module may be attached to a support span as exemplified at cam foot 101 in FIG. 3 and its descriptions.

Attachment bracket refers to a simple, essentially rigid structure in the general shape of an L, one arm of which extends approximately 70-110 (often close to 90) degrees from the other arm which can join, fasten, secure, affix or connect to another item, or the like in a permanent, removable, secured or non-permanent manner. A tile hook such as tile hook 4500 in FIG. 45A is an example of an attachment bracket.

Auto-grounding or automatic grounding refers to electrically connecting a device, equipment, chassis, frame, or the like to a metal structure or earth in a manner essentially independent of external influence or control, or working by itself with little or no direct human control, or happening automatically when another operation is performed for ensuring a common electrical potential; in some situations being connected to the Earth or a large mass of conductive material may provide a position of zero potential. One such automatic grounding device is exemplified as pin 115 in FIG. 6b, and its descriptions.

Axis of rotation refers to a center around which something rotates, sometimes considered a straight line through all fixed points of a rotating rigid body around which all other points of the body move in a circular manner. Some exemplar axis of rotations for coupling portions are exemplified at Point A in FIG. 3, along with related descriptions.

Beneath refers to extending or being situated directly or substantially underneath, typically with close proximity or contact. For example, rails 8070 are beneath PV modules 8050 in FIG. 80.

Between refers to being situated, located, or otherwise oriented at, in, or across the space separating two objects or regions. For example, PV module 5050D is between PV module 5050E and PV module 5050C in FIG. 50A.

Bracket refers to a simple, essentially rigid structure in the general shape of an L, one arm of which extends approximately 70-110 (often close to 90) degrees from the other arm. A bracket is often an overhanging member that projects from a structure (such as a portion of a wall or frame) and may be designed to support a load with a vertical component, such as a skirt. A bracket may also refer to a fixture projecting from a wall, column, frame or the like which may be used for holding, securing, positioning or supporting another object. One such bracket attaching a groove to a support span is exemplified as cam foot 101 in FIG. 3, and its descriptions. As another example, a bracket attaching a PV module to a support span is exemplified as cam foot 101 in FIG. 11A, and its descriptions.

Connect or connecting refers to loosely, slidably, or rigidly bringing together or into contact with or joining or fastening to form a link or association between two or more items, mechanisms, objects, things, structures or the like. For example, a spanner bar connected to another spanner bar may be exemplified at splice 118 in FIG. 9A, and its descriptions. For another example, a spanner bar connected to a groove in a PV module frame may be exemplified at cam foot 101 in FIG. 11B, and its descriptions. For an additional example, a spanner bar connected to a tile hook may be exemplified at clamp 103 in FIG. 8, and its descriptions.

Connector refers to an object, item, mechanism, apparatus, combination, feature, link or the like that loosely, slidable, or rigidly links, interlocks, joins, unites or fastens two or more things together. May also include a device, an object, item, mechanism, apparatus, combination, feature, link or the like for keeping two parts of an electric or electronic circuit in contact. For example, a connector for connecting or coupling the end of one rail to an end of another rail may be exemplified at splice 118 in FIG. 9A and its descriptions.

Coplanar refers to the circumstance where two or more objects are situated, located, or otherwise substantially oriented in the same plane. For example, PV modules 5050E and 5050D are coplanar in FIG. 50A.

Couple refers to loosely, slidably, or rigidly joining, linking, interlocking, connecting or mating two or more objects or items, mechanisms, objects, things, structures or the like together. For example, two modules may be coupled together, as exemplified at interlock 45 in FIG. 30, and its descriptions.

Coupling refers to an object, item, mechanism, apparatus, combination, feature, link or the like that loosely, slidably, or rigidly joins, links, mates, interlocks, or connects two things together. For example, a two rails may be coupled together by a coupling device, as exemplified at interlock 45 in FIG. 30, and its descriptions.

Double male connector refers to a connector (see above) having two male or insertable members, usually used for connecting two female or receiving parts or coupling members together. An example double male connector may be exemplified at splice 118 in FIG. 9a, and its descriptions.

Disengage refers to detaching, freeing, loosening, extricating, separating or releasing from something that holds-fast, connects, couples or entangles. See Engagement below.

Enable refers to facilitating or making possible, able, feasible, practical, operational, or easy; or to cause to operate.

End refers to a final part, termination, extent or extremity of an object, item, mechanism, apparatus, combination, feature, or the like that has a length. For example, an end of a rail may be exemplified at Location E in FIG. 7a, and its descriptions.

Engage refers to interlocking or meshing or more items, mechanisms, objects, things, structures or the like. See Disengage above.

Frame refers to an essentially rigid structure that surrounds or encloses a periphery of an item, object, mechanism, apparatus, combination, feature, or the like. For example, a PV module may have a frame around its edges as exemplified at frame 23 in FIG. 3, and its descriptions.

Freely refers to being without or exempt from substantial restriction or interference by a given condition or circumstance. May also refer to being unobstructed, unconstrained, unrestricted or not being subject to external restraint. For example, double male connector which is locked to a rail and freely insertable into another rail may be exemplified at Location F in FIG. 9a, and its descriptions.

Gap refers to a break, void, opening, cleft, breach, aperture, separation, or space, as well as an interruption of continuity, between two objects, or within an object. For example, a gap appears between spanner bars 5020B and 5020A in FIGS. 50A and 50B.

Groove refers to a long, narrow cut, rut, indentation, channel, furrow, gutter, slot or depression often used to guide motion or receive a corresponding ridge or tongue. Some grooves in the frame wall of a PV module are exemplified at Area G in FIG. 2, and its descriptions.

Height adjustable refers to change or adapt to bring items, objects, mechanisms, apparatus, combinations, features, components or the like into a proper, desired or preferred relationship of a distance or elevation above a recognized level, such as the ground or a support surface. Some height adjustable devices are exemplified at Area H in FIG. 5, and its descriptions.

Insertable refers to an object, item, mechanism, apparatus, combination, feature, link or the like which is capable of being put in, entered into, set within, introduced, inset, inserted, placed, fit or thrust into another an object, item, mechanism, apparatus, combination, feature, link or the like. An example double male connector which may be insertable into a support span is exemplified at splice 118 in FIG. 9a, and its descriptions.

Integer multiple refers to a product of any quantity and a member of the set of positive whole numbers {1, 2, 3, . . . }. An integer multiple of a width of a PV module may actually be somewhat longer or shorter than the absolute width of the PV module, so as to permit or facilitate connection to a PV module, as by attachment to one or more frame members of a PV module, as may be exemplified at Area I in FIG. 1A, and its descriptions.

Integral with refers to being essential or necessary for completeness, constituent, completing, containing, entire, or forming a unit. May also refer to consisting or composed of parts that together constitute a whole. An example frame integral with & supporting a PV laminate is exemplified at frame 23 in FIG. 3, and its descriptions.

Laminate or PV laminate refers to a photovoltaic device having an interconnected assembly of solar cells, also known as photovoltaic cells which is frequently, but not always, laminated with glass and/or other materials, as more fully described below, for example in paragraphs 199 and 203-204.

Length refers to a measurement or extent of an object, item, mechanism, apparatus, combination, feature, link or the like from end to end, usually along the greater or longer of the two or three dimensions of the body; in distinction from breadth or width. An example of a length of a spanner bar is exemplified at Notation L in FIG. 8, and its descriptions.

Located refers to where an object or a series of objects is physically situated with respect to one or more other objects. For example, a portion of bracket 7180 is located in groove 7152 in FIGS. 71C and 71C-1.

Locked refers to fastened, secured or interlocked. An example double male connector locked to a support span may be exemplified at Location K in FIG. 9c, and its descriptions.

Orthogonally refers to relating to or composed of right angles, perpendicular or having perpendicular slopes or tangents at a point of intersection. An example spanner bar orthogonally connected to one of various locations along a PV module frame is exemplified at cam foot 101 in FIG. 3, and its descriptions.

Near refers to a short distance from an object or location. For example, PV module 7450B is near PV module 7450A in FIG. 74A.

Perimeter refers to an essentially continuous line forming the boundary, periphery or circuit of a closed geometric figure; the outer limits of an area. An example perimeter of a PV laminate surrounded by a frame is exemplified at frame 23 in FIG. 1A, and its descriptions.

Photovoltaic module (sometimes referred to as a PV module, solar panel, or photovoltaic panel) refers to a packaged, interconnected assembly of solar cells, also known as photovoltaic cells, frequently, but not always, laminated with glass and other materials and sometimes surrounded by a frame. A plurality of PV modules are commonly used to form a larger photovoltaic system referred to as a PV array (see below), to provide electricity for commercial, industrial and residential applications. An example photovoltaic module is exemplified at module 7050 in FIG. 70A, and its descriptions.

Pivotally refers to or relates to an object, item, mechanism, apparatus, combination, feature, link or the like serving as a pivot or the central point, pin, shaft or contact on which another object, item, mechanism, apparatus, combination, feature, link or the like turns, swings, rotates or oscillates. An example spanner bar pivotally connected to a PV module frame is exemplified at spanner bar coupling 302 in FIG. 23, and its descriptions.

Positionable refers to an object, item, mechanism, apparatus, combination, feature, link or the like which is capable of being positioned, placed or arranged in a particular place or way. An example of rails which are independently positionable relative to a PV module are exemplified at span bar 102 in FIG. 3, and their descriptions.

Preload refers to the force that must be overcome to separate a joint once force is applied to attach a coupling to the joint. The applied force deforms the coupling and/or one or more of the components of the joint and becomes the force that must be overcome to separate the joint.

PV laminate refers to a photovoltaic device having an interconnected assembly of solar cells, also known as photovoltaic cells which is frequently, but not always, laminated with glass and/or other materials. A PV laminate with an integral frame which may support the PV laminate is sometimes referred to as a PV module (see below). An example PV laminate is exemplified at laminate 300 in FIG. 1A, and its descriptions.

PV module refers to a photovoltaic module (sometimes referred to as a solar panel or photovoltaic panel) is a packaged interconnected assembly of solar cells, also known as photovoltaic cells, frequently, but not always, laminated with glass and other materials and sometimes surrounded by a frame. A plurality of PV modules are commonly used to form a larger photovoltaic system referred to as a PV array (see below), to provide electricity for commercial, industrial and residential applications. An example PV module is exemplified at module 10 in FIG. 1A, and its descriptions.

PV array refers to s plurality of photovoltaic modules (see above) connected together often in a pattern of rows and columns with module sides placed close to or touching other modules. An example PV array is exemplified at array 81 in FIG. 1A, and its descriptions.

Quarter turn or ¼ turn refers to an angle of rotation of an object, item, mechanism, apparatus, combination, feature, link or the like which is usually measured in degrees or radians having a range of between approximately 70 to 110 degrees, or sometimes between 80 to 100 degrees. An example of a coupling receiving a ¼ turn when connecting to a rail is shown or described at cam foot 101 in FIG. 3, and its descriptions.

Rail refers to refers to a relatively straight, usually essentially evenly shaped along its length, rod, beam, girder, profile or structural member or the like, or plurality of such, of essentially rigid material used as a fastener, support, barrier, or structural or mechanical member. For example, two rails coupled together by a coupling device are exemplified at span bar 102 in FIG. 23, and its descriptions.

Rail member refers to a structural entity, element or unit (or part of such entity, element, or unit) that acts as or embodies a rail. An example of rail includes rail 5170 as shown in FIG. 51A and its description.

Removable refers to one or more items, mechanisms, objects, things, structures or the like which are capable of being removed, detached, dismounted from or taken-away from another item or the like, or combination.

Rectilinear refers to one or more items, mechanisms, objects, things, structures or the like which are essentially bounded by, characterized by or forming straight and substantially parallel lines. An example rectilinear double male connector may be exemplified at splice 118 in FIG. 9*a*, and its descriptions.

Rigidly couples refers to joining, linking, connecting or mating two or more objects or items, mechanisms, objects, things, components, structures or the like together in a non-flexible manner that is difficult to bend or be forced out of shape. For example, two span bars may be rigidly coupled together, as exemplified at splice 118 in FIG. 9*a*, and its descriptions.

Roof refers to a structure or protective covering that covers or forms the upper covering or top of a building. The upper surface of a roof is often used as a support surface for mounting, connecting or otherwise attaching a PV module or a PV array. For example, some roofs are exemplified at Roof 83 in FIG. 1A, and its descriptions.

Rotatably refers to one or more items, mechanisms, objects, things, structures or the like which are capable of being rotated, revolved or turned around or about an axis or center. For example, a portion of a coupling adapted to rotatably engage a PV module is exemplified at coupling 107 in FIG. 3, and its descriptions.

Skirt refers to an edging, molding or covering that may be fixed to the edge of a PV module to conceal or block the bottom area under a PV array when the PV array is mounted to a support surface. Some skirts are exemplified at skirt 104 in FIG. 10A, and its descriptions.

Span refers to an extent or measure of space between, or the distance between two points or extremities. For example, a spanner bar which solely spans a width of a PV module is exemplified at span bar 102 in FIG. 10A, and its descriptions.

Spanner bar refers to a relatively straight, usually evenly shaped along its length, rod, beam, girder, profile or structural member of essentially rigid material used as a fastener, support, barrier, or structural or mechanical member which spans a distance between an edge of a PV module and an attachment device, such as a tile hook, stand-off, hanger bolt or the like. For example, a spanner bar which spans a width of a PV module is exemplified at span bar 102 in FIG. 10A, and its descriptions.

Support or supporting refers to one or more items, mechanisms, objects, things, structures or the like which are capable of bearing weight or other force, often to keep the item or the like from falling, sinking, slipping or otherwise moving out of a position. For example, a frame which is shown as integral with and supporting a PV laminate is exemplified at frame 23 in FIG. 2, and its descriptions.

Support structure refers to a structure, such as a roof, table or the ground which may provide a base for securing PV modules to form a PV array. Some support surfaces are exemplified at roof 83 in FIG. 1A, and its descriptions.

Threaded refers to one or more items, mechanisms, objects, things, structures or the like which have, embody or include an essentially helical or spiral ridge or rib, as on a screw, nut, or bolt. An example of a threaded adjustment member for varying distance between a point on module and a rail may be exemplified at threaded stud 113 in FIG. 5, and its descriptions.

Various locations refers to places, positions or sites that are different from one another, more than one, individual or separate. For example, a spanner bar which may connect at various locations along a frame of a PV module is exemplified at span bar 102 in FIG. 3, and its descriptions.

Vertical height adjustment refers to change or adapt to bring items, mechanisms, objects, things, components, structures or the like or components into a proper, desired or preferred relationship of a distance or elevation above a recognized level, such as the ground or a support surface. Some vertical height adjustment devices are exemplified at Area J in FIG. 5, and its descriptions.

Width refers to the state, quality, or fact of being wide or a measurement or extent of something from side to side; in distinction from breadth or length. For example, a spanner bar which spans a width of a PV module is exemplified at span bar 102 in FIG. 3, and its descriptions.

Referring now to FIG. 1A, there is shown a perspective view of a PV array including a plurality of PV modules 100 laid out in an x-y reference plane on a roof or support structure 81 such as a roof. PV modules 100 are shown in various Figs. with an integral frame 23 and as being faced with clear glass instead of a typical PV laminate with encapsulated PV cells in order to enable a view beneath PV modules 100 that reveals the mounting system hardware. One skilled in the art will recognize that PV modules 100 may comprise various types and numbers of PV cells. FIG. 1A also shows typical roofing tiles, such as tiles 82 and typical batons such as batons 83. Other types and forms of batons and tiles are hereby expressly contemplated, such as roofing materials that are flat tiles, rolled-on or other flat or shaped materials. Various tiles 82 are shown in the Figs. only partially covering support structure 81 in order to enable a more complete view of support structure 81 and hardware beneath tiles 82. Support structure 81 is herein shown as including a generally planar surface, however it may be a structure with thickness, width, depth, length and/or other dimension(s). In reference to any appropriate mounting structure, such as support structure 81, the height adjustment of a coupling described hereinafter is considered relative to any essential surface or essential plane, such as a top surface. For ease of understanding this embodiment, a y-direction corresponds to the north-south dimension of the array, and an x-direction corresponds to the east-west direction. In the embodiment of FIG. 1A, the reference plane is effected as being coextensive with a surface of various PV modules 10, when PV modules 100 are positioned in their final installed positions. However, in further and various other embodiments, some of which are illustrated below, a reference plane may be above an upper surface of PV modules 10, or below the lower surfaces of PV modules 100.

A PV array 80 may be assembled together and attached to support structure 81 as by means of a discrete attachment point mounting system, which may comprise any or many of: cam feet, spanner bars, array skirts, double-tongue feet, brackets, feet, leveling feet, interlocks, parallel couplings, double-key couplings, key couplings and/or the like, some of which are explained in more detail below. Other components may be coupled to array 80 such as for example a grounding coupling, also further explained below. The PV array 80 of FIG. 1A is shown by way of example only. It is understood that PV array 80 may have more or less PV modules 100, such as in the x and/or y direction. In the embodiment shown in FIG. 1A, the support structure 81 may be a roof, such as a slanted roof of a residential dwelling or the like. However, it is understood that the PV array 80 may be supported on a wide variety of other support surfaces, such as for example a flat roof, a ground-mounted structure, a vertical support structure, or other structures which are understood by one of skill in the art. The defined x-y reference plane for the PV array 80 is substantially parallel to support structure 81, and may be oriented in any of a wide variety of angles from horizontal to vertical. In other embodiments an x-y reference plane may be at an angle to support structure 81.

FIG. 1A further shows a series of tile hooks 84 attached to rafters 85 in any usual manner, such as with a lag screw (not shown) or the like. Tiles 82 are connected to battens 83 in any reasonable or usual manner. As seen on the right side of FIG. 1A, tile hooks 84 may slip between tiles 82 at approximately the low point of curved tile 82 profile. The exposed y-axis length, commonly referred to as a "reveal", of one or more tiles 82 may set a distance A between available discrete attachment points in the y-axis; and rafter location may set a distance B between available discrete attachment points along the x-axis. Therefore PV array 80 may be said to comprise discrete, rather than continuous, attachment points.

Figure 1C:
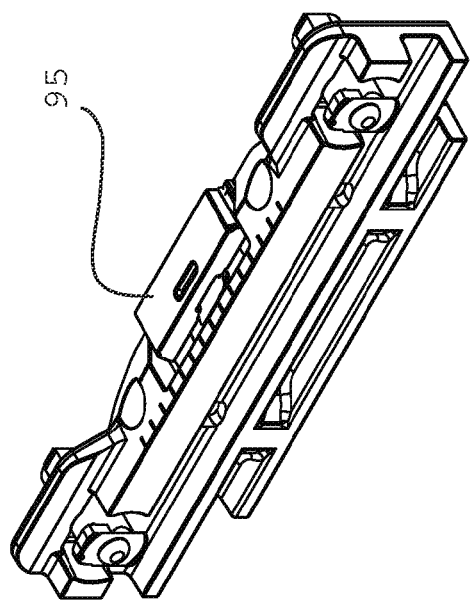
FIG. 1C is a perspective view of an interlock.
Figure 1B:
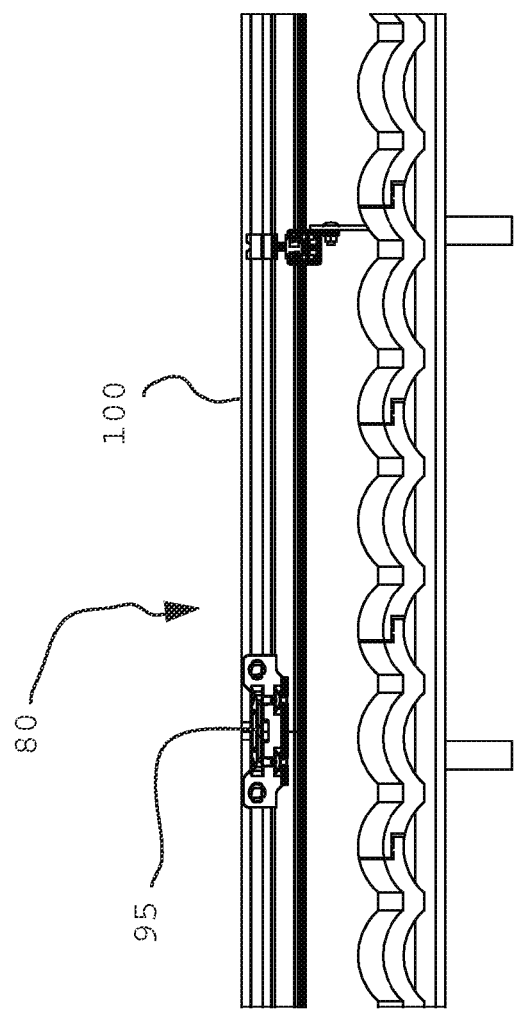
FIG. 1B shows a orthogonal view of a portion of an array on a roof.

FIG. 1B shows PV array 80 from a perspective up-roof from PV array 80 and shows an installed interlocking device, such as interlock 95, which may provide a structural and ground bond connection between PV modules 100 at PV module 100 corner locations. Interlocks are discussed in further detail below.

FIG. 1C shows interlock 95 which provides both X and Y axis structural and ground bond connections. Interlock 95 may be installed by inserting into frame grooves 11A and rotating frame coupling components 45A roughly 90 degrees. It is specifically contemplated that interlock 95 may be made of aluminum and steel, but other reasonably rigid materials, such as other metals or plastics, may be suitable as well.

Figure 77:
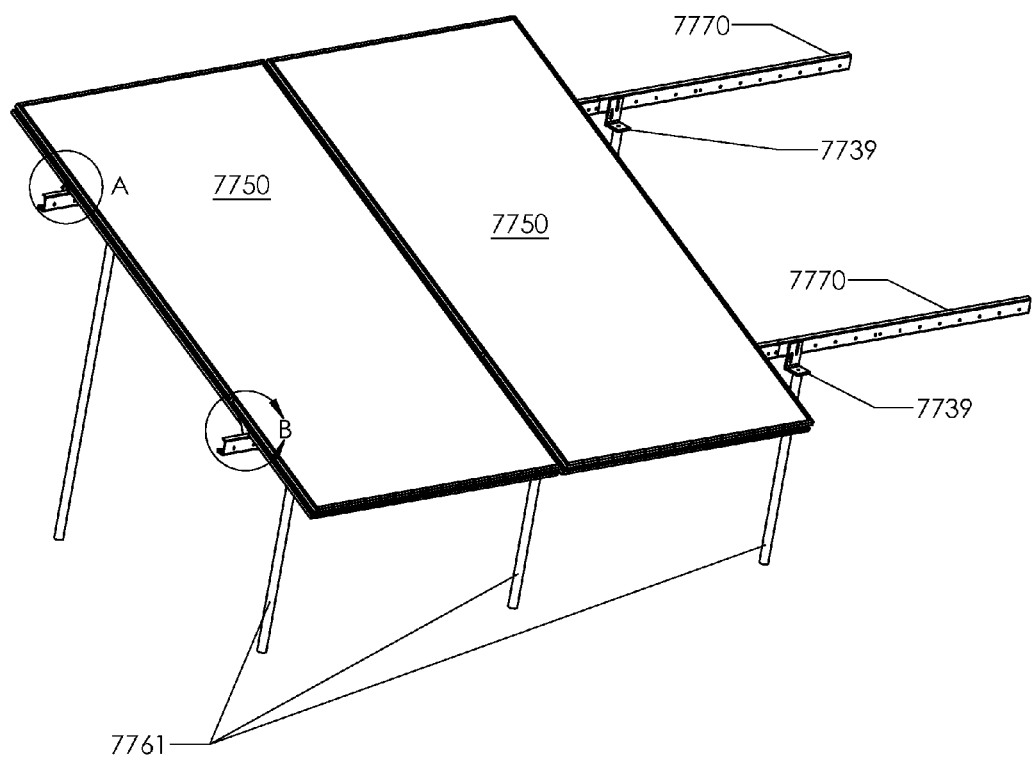
FIG. 77 is a perspective view of a PV array installed on pipes.
Figures 1, 77:
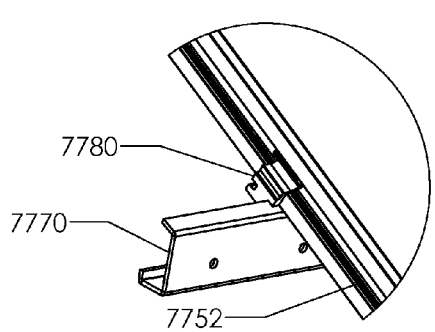
Figures 2, 77:
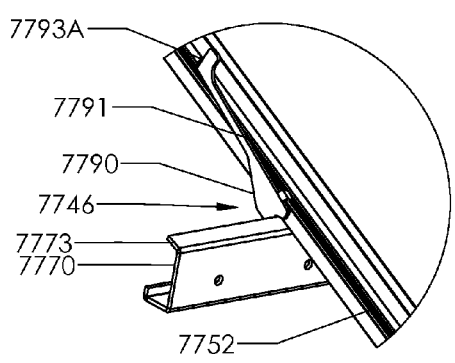
FIG. 2 is a orthogonal view of a PV module with a skirt.

FIG. 2 shows a side view of a photovoltaic module, such as PV module 100. As shown, attached to PV module 100 is a connector, such as a cam foot 101. As will be discussed in more detail below, cam foot 101 pivots into a groove of a PV module 100 frame 23, such as frame groove 105. Cam foot 101 is also connected, as by a cam nut 111, to an underlying support, such as a spanner bar 102, as discussed in greater detail below. As described in more detail below, cam foot 101 may also be connected to a skirt or other visual blocking or fire limiting device, such as an array skirt 104, and may connect array skirt 104 to PV module 100. Spanner Bar 102 may be coupled or otherwise connected to adjacent Spanner Bar 102a, as by way of a press-fit, slip fit, or other connection as discussed further below. Spanner Bar 102 may also be inserted through a clamp, such as bar clamp 103, as shown in FIG. 2, the function of which will be described further below. It is specifically contemplated that frame 23 of PV module 100 may be made of aluminum, but other reasonably rigid materials, such as other metals or plastics, may be suitable as well. It is also contemplated that cam foot 101, spanner bar 102, bar clamp 103, and array skirt 104 may be made of aluminum, steel, or a combination thereof, but other reasonably rigid materials, such as other metals or plastics, may be suitable as well.

FIG. 3 shows cam foot 101 with a short tongue side, such as short tongue side 106, and a long tongue side, such as long tongue side 107. Also shown is a hump on the lower side of short tongue side 106, such as hump 108. Short side tongue 106 of cam foot 101 is shown connecting to a frame groove, such as frame groove 105 by means or way of a pivot-fit. A fully engaged home position of cam foot 101 may be defined by a slight rise 131 in the curved portion of hump 108. Slight rise 131 may provide resistance to forces that would tend to rotate cam foot 101 back out of engagement with frame 23. In the shown embodiment of FIG. 3, installation may be tool-free, that is, installation of PV array 80 of PV modules 100 may be effected without using mechanical or electrical tools. The installation of cam foot 101 into frame groove 105 provides a rapid, tool-free (in some embodiments), auto-grounding (in some embodiments), means or system for adjustably connecting cam foot 101 to PV module 100. Cam foot 101 is adjustable in the x-axis as by variably attaching to frame groove 105 to line up with rafter 85 or location of attachment, such as a tile hook, as further described below. As described below, cam foot 101 may further provide pivot-fit or drop-in connections to up-roof modules. In other embodiments, cam foot 101 may connect to frame groove 105 via a ¼ turn key-in and may require a tool. Other embodiments discussed below may also provide auto-grounding connections; for example whereby a stainless steel pin (not shown here) in short tongue side 106 may pierce frame 23 to create a ground bond connection.

Figure 4:
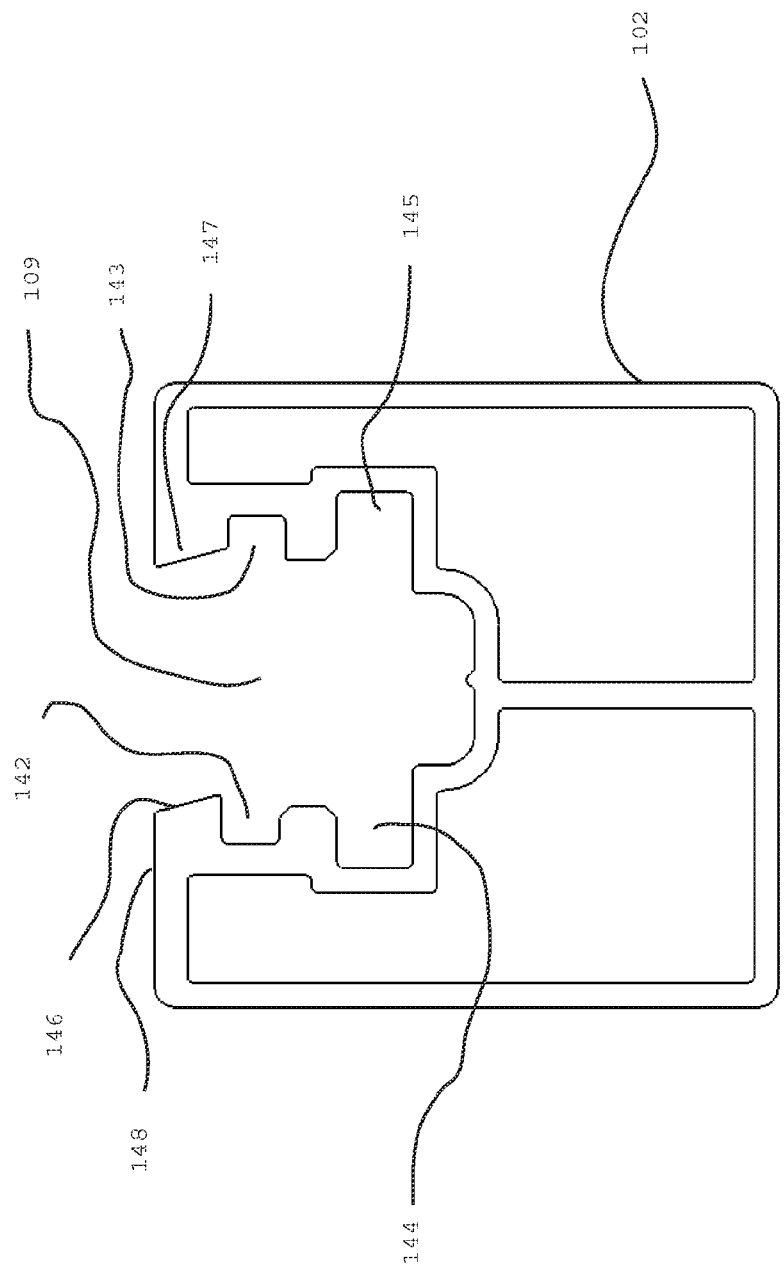
FIG. 4 is a cutaway view of a spanner bar.

FIG. 4 shows a cross-sectional view of spanner bar 102 and a groove feature such as spanner groove 109. Spanner groove 109 may comprise upper key slots 142, 143, lower key slots 144, 145, and lips 146, 147. In some embodiments a shape of an upper portion of spanner groove 109 may be substantially similar to a shape of frame groove 105, thereby enabling compatible equipment, such as such as spring clips for retaining wires, snap-in electrical boxes, PV module electronic devices, and so on, to be capable of connecting to both frame groove 105 and spanner groove 109.

Figure 5:
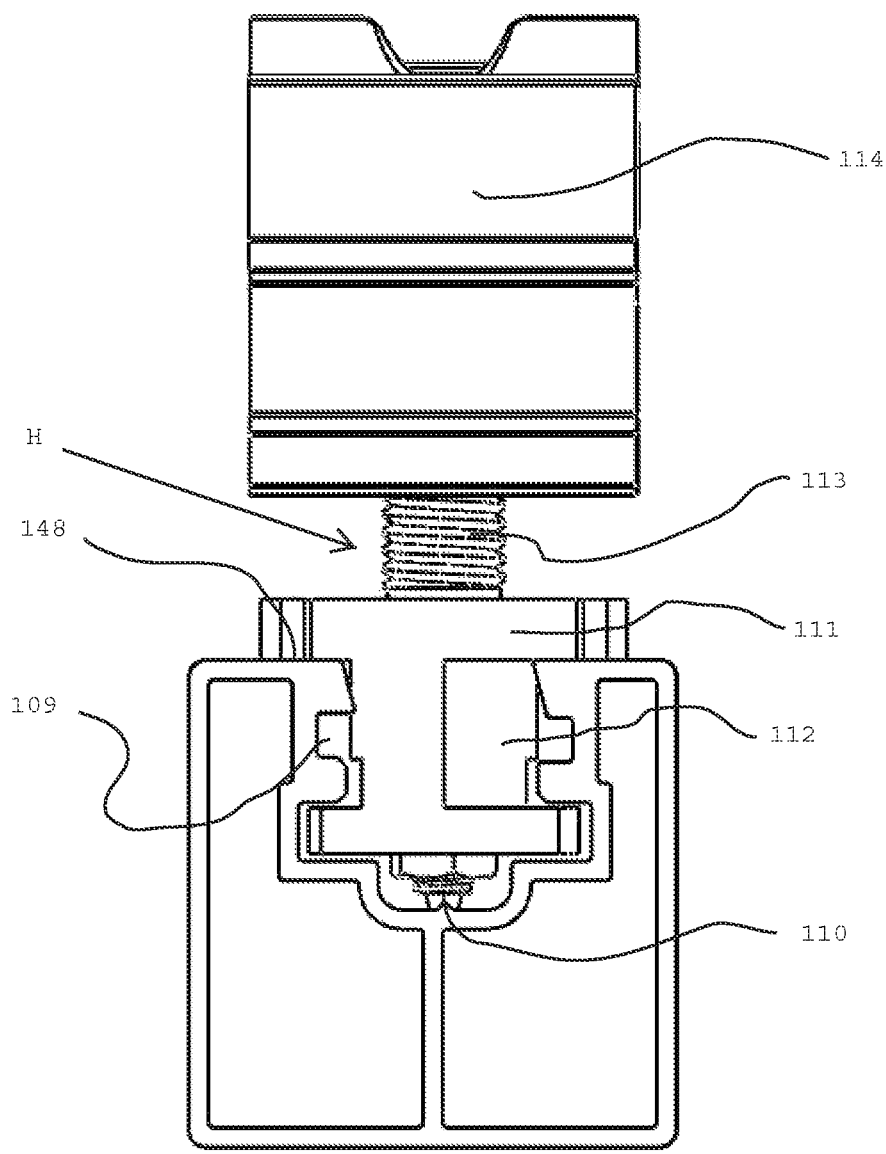
FIG. 5 is a perspective and partial cut away view of a cam foot inserted into a cutaway spanner bar.

FIG. 5 shows cam foot 101 installed in spanner groove 109. Also shown are various sub-components of cam foot 101. A cup point or cone point bonding feature may be provided, such as cone point 110, which is shown in FIG. 5 as contacting a bottom surface of spanner groove 109. The connection between cone point 110 and spanner groove 109 may be accomplished by compression (see below) which causes cone point 110 to cut into spanner bar 102 to create a ground bond connection. A cam nut, such as cam nut 111, is shown partially inserted into spanner groove 109. A camming surface, such as camming surface 112, is shown engaged in spanner groove 109. Cam nut 111 and camming surface 112 will be described in more detail below. A threaded stud, such as stud 113, may be rotatably captured by cam nut 111 at a first end and threaded into coupling such as double tongue coupling 114 at a second end. Stud 113 causes coupling 114 to fall and rise in the z-axis when stud 113 is rotated clockwise and counter-clockwise respectively. In another embodiment (not shown), the direction of rotation of stud 113 will cause coupling 114 to rise and fall when stud 113 is rotated clockwise and counter-clockwise respectively.

Such rotation may provide a simple mechanism to enable rapid height adjustment of PV module 100, and other height adjustment mechanisms, such as ratchets or other devices, are hereby expressly contemplated.

Figure 6B:
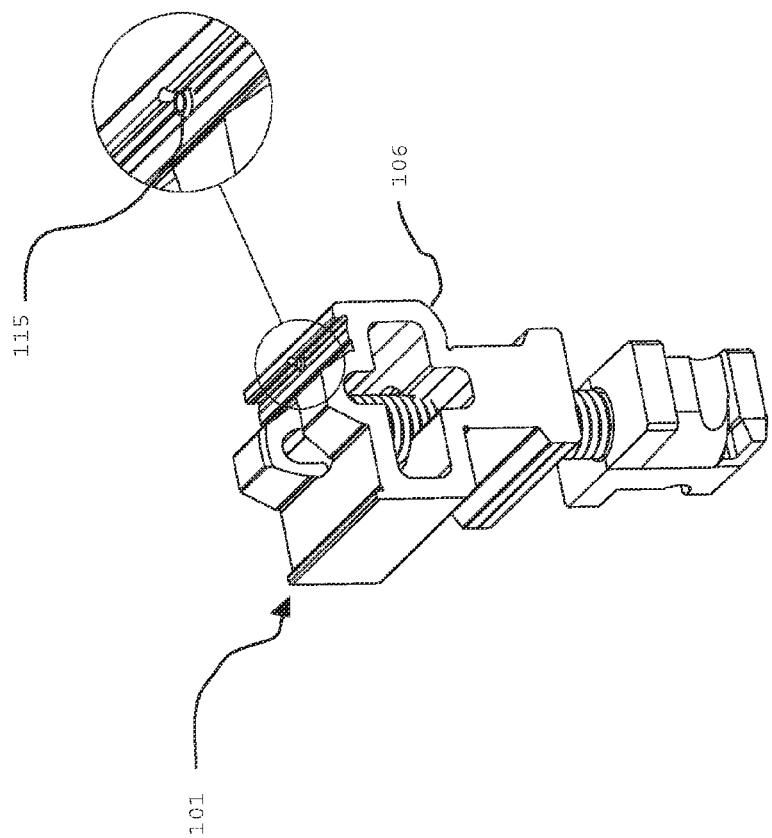
FIG. 6A and FIG. 6B is a perspective view of a cam foot.
Figure 6A:
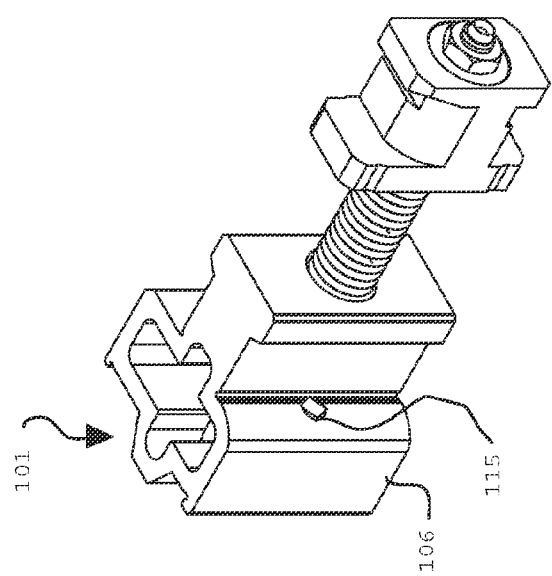

FIG. 6A and FIG. 6B show another embodiment whereby a metal pin, such as pin 115, may be installed in short tongue side 106 of cam foot 101 and may create a ground bond connection between coupling 114 and groove 105 of PV module 100 by cutting into module groove 105. FIG. 6A shows pin 115 protruding from a bottom side of short tongue 106; and FIG. 6B shows pin 115 protruding from a top side of short tongue 106. In other embodiments pin 115 only protrudes from either the top or bottom of short tongue 106. In combination with the grounding action of cone point 110 (see above), the grounding action of pin 115 may create a reliable grounding path from spanner bar 102 to module frame 105.

Figure 7B:
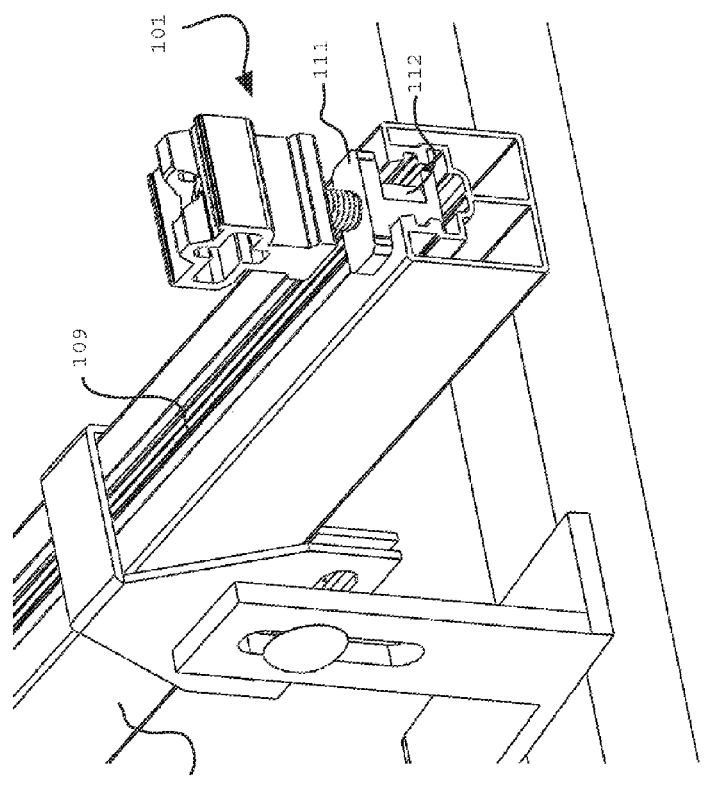
FIGS. 7A and 7B is a perspective view of a cam foot inserted into a spanner bar.
Figure 7A:
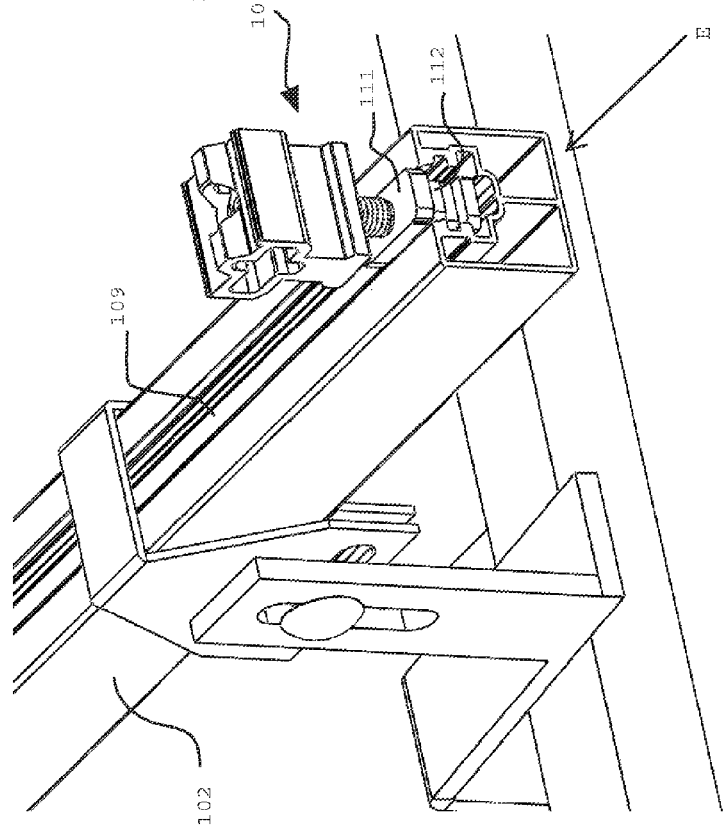

FIG. 7A shows cam foot 101 inserted into spanner groove 109. FIG. 7B shows cam foot 101 fully engaged with spanner groove 109 and with cam nut 111 rotated approximately 90 degrees (for example, from between 50 to 130 degrees, or 60 to 120 degrees, or 70 to 110 degrees) from its position in FIG. 7A. When cam nut 111 is rotated approximately 90 degrees from its position in FIG. 7A, camming surface 112 may press against and spread spanner groove 109. This action may be complemented by lower key 138 on cam nut 111 jamming into lower key slots 144, 145 and cone point 110 cutting into spanner bar 102 to form a substantially rigid connection between cam nut 111 and spanner bar 102. This connection arrangement may provide a rapid, auto-grounding connection that may require less than 360° of rotation, such as approximately 90°, with between 70° to 110° of rotation (see description above), and may provide adjustability in the y-axis since cam foot 101 may be able to be connected to spanner bar 102 at essentially any point substantially along its whole length. In other embodiments the orientation of spanner bars is rotated 90° from the orientation of FIG. 1, thereby enabling cam foot 101 to spanner bar 102 connections substantially anywhere along the x-axis of PV array 80. In another embodiment, cam nut 111 may comprise a camming surface that expands against other surfaces of spanner groove 109, such as upper key slots 142, 143, lower key slots 144, 145 or other walls of spanner groove 109.

Figure 8:
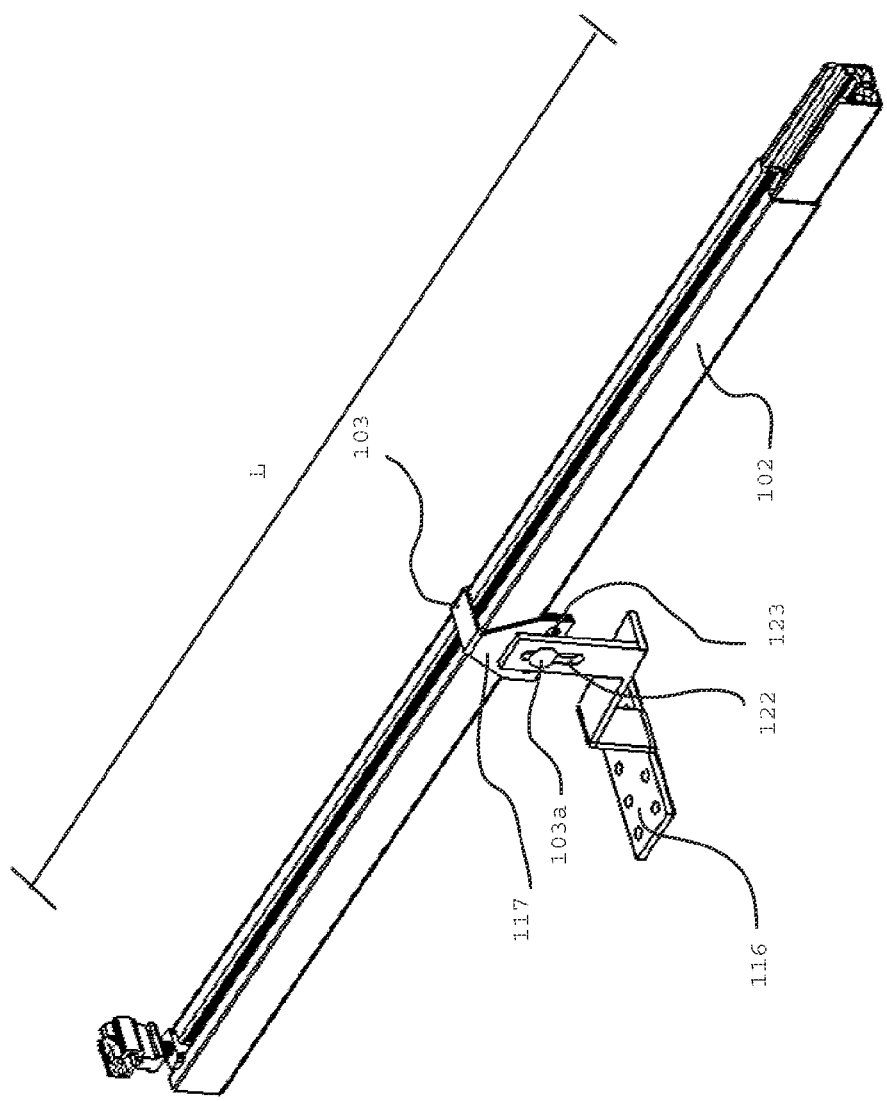
FIG. 8 is a perspective view of a spanner bar connected to a tile hook.

FIG. 8 shows bar clamp 103 connected to a tile hook, such as tile hook 116. In other embodiments, bar clamp 103 may be connected to other types of tile hooks or other components such as stand-offs, stanchions, threaded rods, and/or the like. Bar clamp 103 may be connected to tile hook 116 via a carriage bolt 103a and nut (not shown). In other embodiments, bar clamp 103 may be connected as by other fastener types such as snap-in, press-fit, cam lock, or other mechanical connections known in the art. FIG. 8 also shows surface 117 of bar clamp 103. Surface 117 may, in various embodiments, be oriented perpendicular or in other manner to its orientation as shown in FIG. 8. For example, tile hook 116 may be replaced by a tile hook with a substantially flat plate top surface, instead of a vertical wall as shown in FIG. 8, and bar clamp 103 may be rotated approximately 90° counter-clockwise to connect to it. The variable orientations in which bar clamp 103 may be installed, may allow it to be mated with a wide variety of roof tile hooks and other roof attachment types or mechanisms. The connection of bar clamp 103 to tile hook 116 or other attachment hardware types as described above, may provide simple and rapid means for connecting bar clamp 103 to standard roof attachment systems such as tile hooks, stand-offs, stanchions, threaded rods, and others which are common or known in the art.

FIG. 8 also shows bar clamp 103 connected to spanner bar 102. Spanner bar 102 may be inserted through bar clamp 103 as shown. The connection between spanner bar 102 and bar clamp 103 may be made via a wrap-around friction connection, whereby a bolt 103a may deform the approximately square shape of bar clamp 103 as it may be tightened around approximately square spanner bar 102. In other embodiments, other connection types such as snap-in, press-fit, cam lock, and other mechanical connections known in the art may be used. Some embodiments may provide dimples (not shown) on bar clamp 103 to ensure proper angular alignment with x-y reference plane. The connection between spanner bar 102 and bar clamp 103 may provide a means for rapid and rigid connection of these components.

Figure 9D:
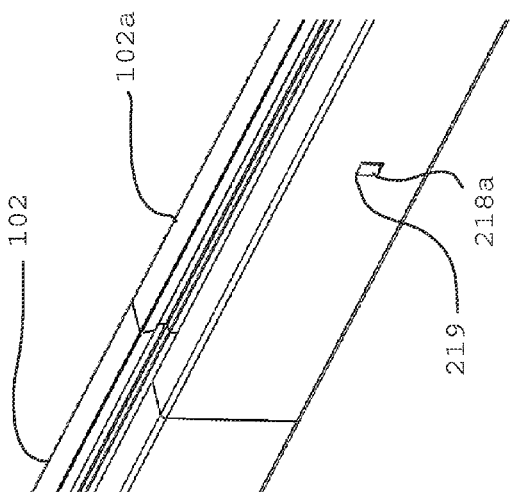
FIG. 9D is a perspective view of two spanner bars, which are connected.
Figure 9C:
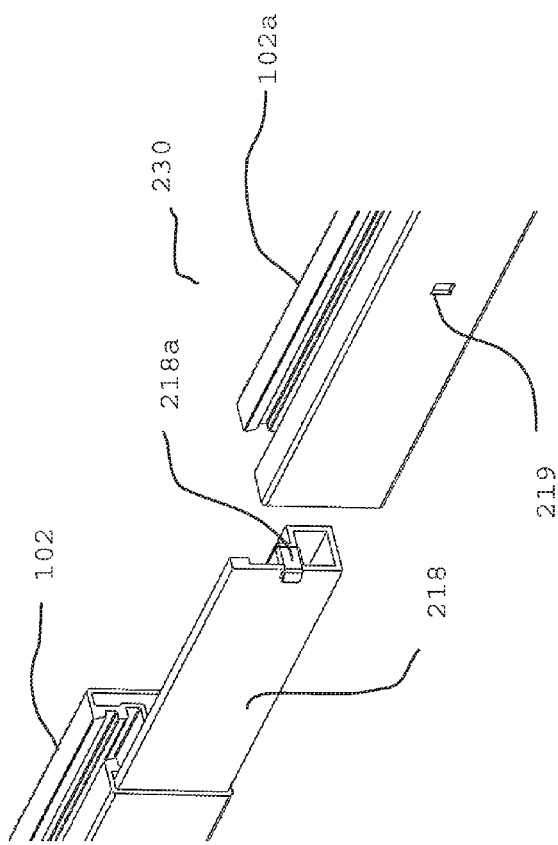
FIG. 9C is a perspective view of two spanner bars with a double male connector.

FIG. 9a shows spanner bars 102 and 102a and a splicing device, such as double male connector 118, which is installed at one end of spanner bar 102. FIG. 9B illustrates how spanner bar 102 and spanner bar 102a may be coupled together by pressing end 119 of spanner bar 102a onto double male connector 118. This connection may be accomplished by means of an interference or press fit but may, in other embodiments, be accomplished by a slip-fit, bolted connection or the like. A preferred connector, such as connector 118, may resist dislocation of connection along the length of the connected spanner bars 102, 102a due to application of a non-length-wise force, such as shown by a transverse force noted at F, or other force applied at an angle to the length of connector 118 or either spanner bar 102, 102a. Similarly, FIGS. 9C and 9D show an alternative double male connector 218 for insertion into or connection of spanner bars 102 and 102a. Double male connector 218 may include a locking or catching member, such as clip 218a, which on one or both ends of double male connector 218 (or anywhere along its length, and on any applicable side or surface, where such length will be inserted into a spanner bar, such as spanner bar 102 or 102a) for connection, capture, or mating with a notch, gap, hole, space, or the like (herein "capture member") such as hole 219. FIG. 9D shows a portion of clip 218a extending out of hole 219 after double male connector 218 is fully installed into spanner bars 102 and 102a. Catching member clip 218a is shown as male and capture member hole 219 is shown as female, however either may be male, female, hermaphroditic, or otherwise formed, so long as the interconnection between such catching member and capture member will inhibit the separation of two spanner bars connected with a double male connector.

Figure 9E:
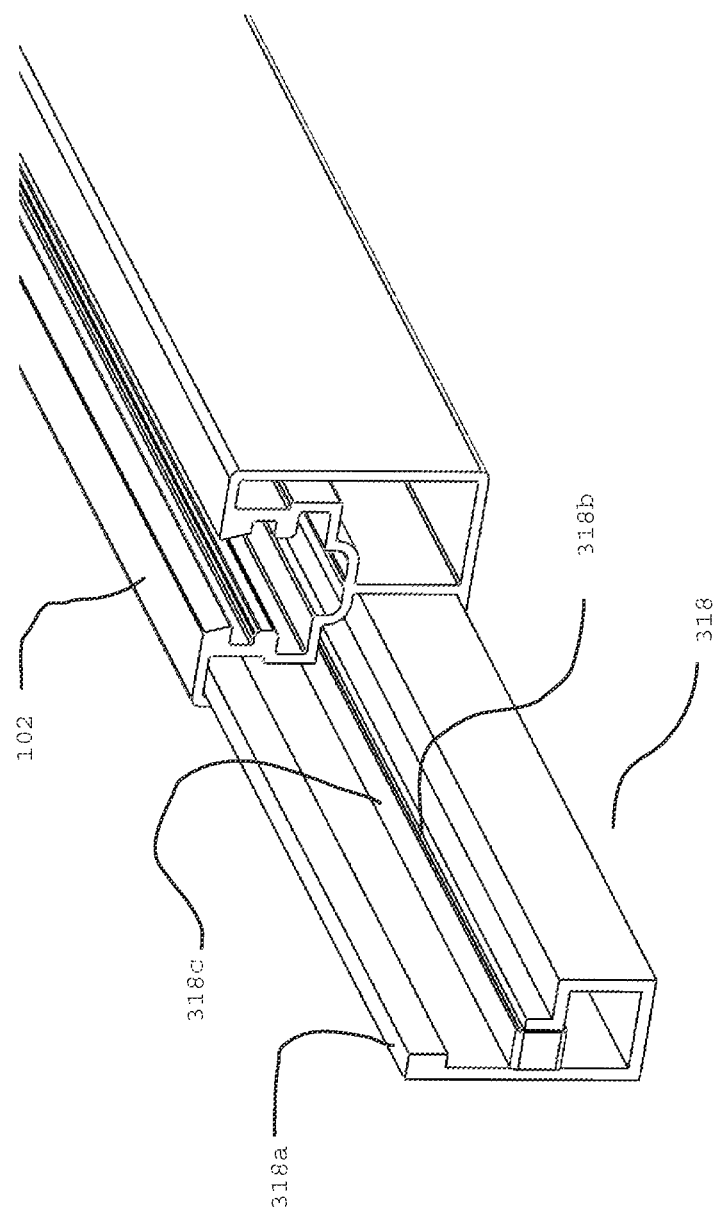
FIG. 9E is a perspective view of a spanner bar with a double male connector.

FIG. 9E shows spanner bar 102 with one double male connector 318 removed. Double male connector 318 may have two male or insertable members for inserting into female portions near or at the ends of spanner bars 102. Double male connector 318 as shown in FIG. 9E may comprise a resilient rubber or spring material 318b covered by a protective layer (not shown). Spring material 318b may help to take up dimensional variations in the materials utilized and/or prevent rattle. Protective cover may help to prevent damage to spring material 318b during insertion. Double male connector 318 may also comprise a substantially rectilinear shape along its length that is primarily characterized by straight and substantially parallel lines. Other embodiments contemplate chamfered or tapered forms. Approximately half of a length of double male connector 318 may be inserted into spanner bar 102. The remaining approximately half of double male connector 318 may be inserted into spanner bar 102a. While spanner bar 102 comprises 2 double male connectors 318, other embodiments (whether shown or not shown herein) comprise spanner bars with only one double male connector 318.

As shown in FIGS. 10A and 10B, array skirt 104 may be connected to cam foot 101 for rapid, snap-on installation. FIG. 10A shows a groove, such as skirt groove 121, placed onto short tongue side 106 of cam foot 101. FIG. 10B shows the final position of installed array skirt 104. FIGS. 10A and 10B illustrate a method of installation, whereby array skirt 104 may be pivoted downward from the position illustrated in FIG. 10A to the position illustrated in FIG. 10B. When in the fully engaged position, as shown in FIG. 10B, a lip of skirt groove snaps into recess formed by slight rise 131 on lower side of short tongue 106 (as discussed above). In the embodiment shown in FIGS. 10A and 10B, installation may be tool-free. The installation of cam foot 101 into frame groove 105 may provide a rapid, tool-free (in some embodiments), auto-grounding (in some embodiments), means and method for adjustably connecting cam foot 101 to array skirt 104. In still other embodiments coupling 114 may further comprise a lock or an anti-rotation component which may be inserted full skirt engagement in order to resist disengagement of skirt 104.

Figure 11B:
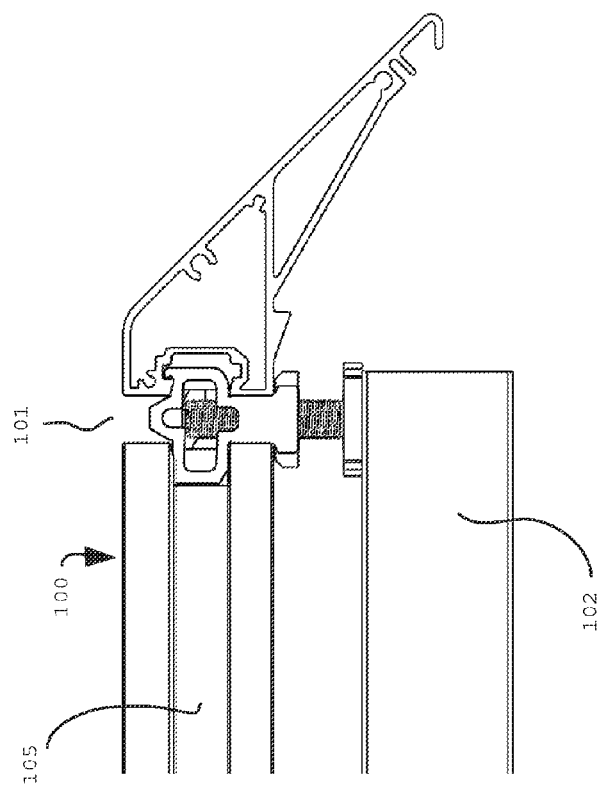
FIGS. 11A and 11B are side views of a cam foot connecting to a skirt and a PV module.
Figure 11A:
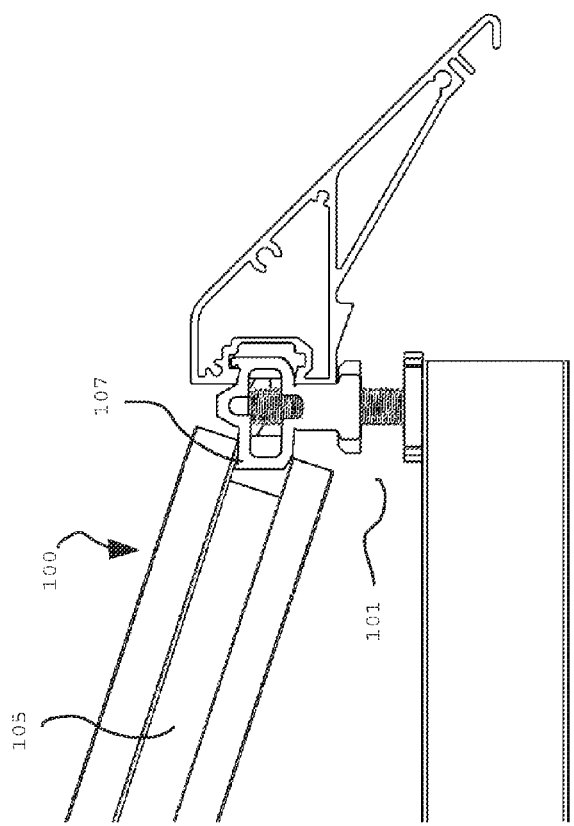
Figure 12:
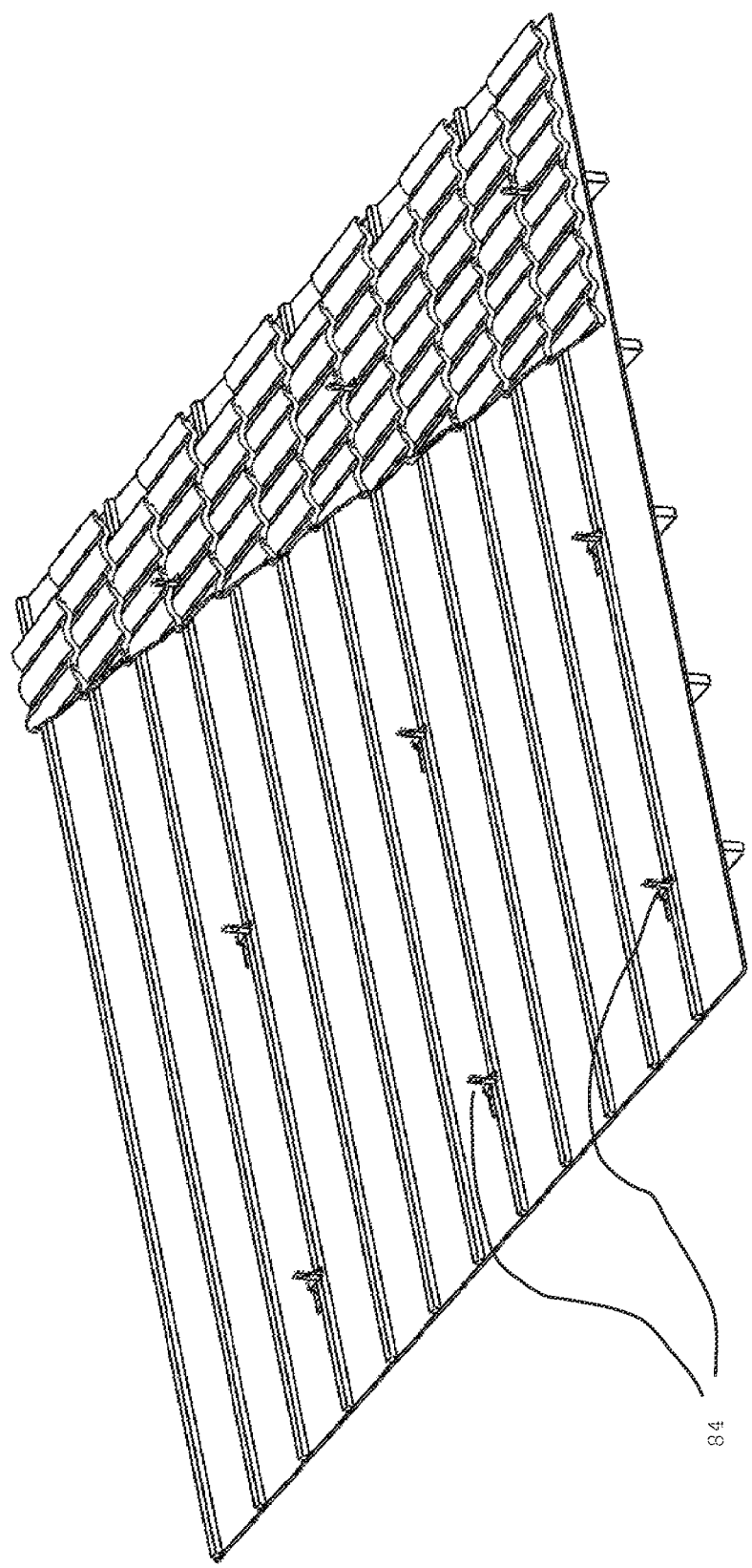
FIG. 12 is a perspective view of a roof with tile hooks.
Figure 13:
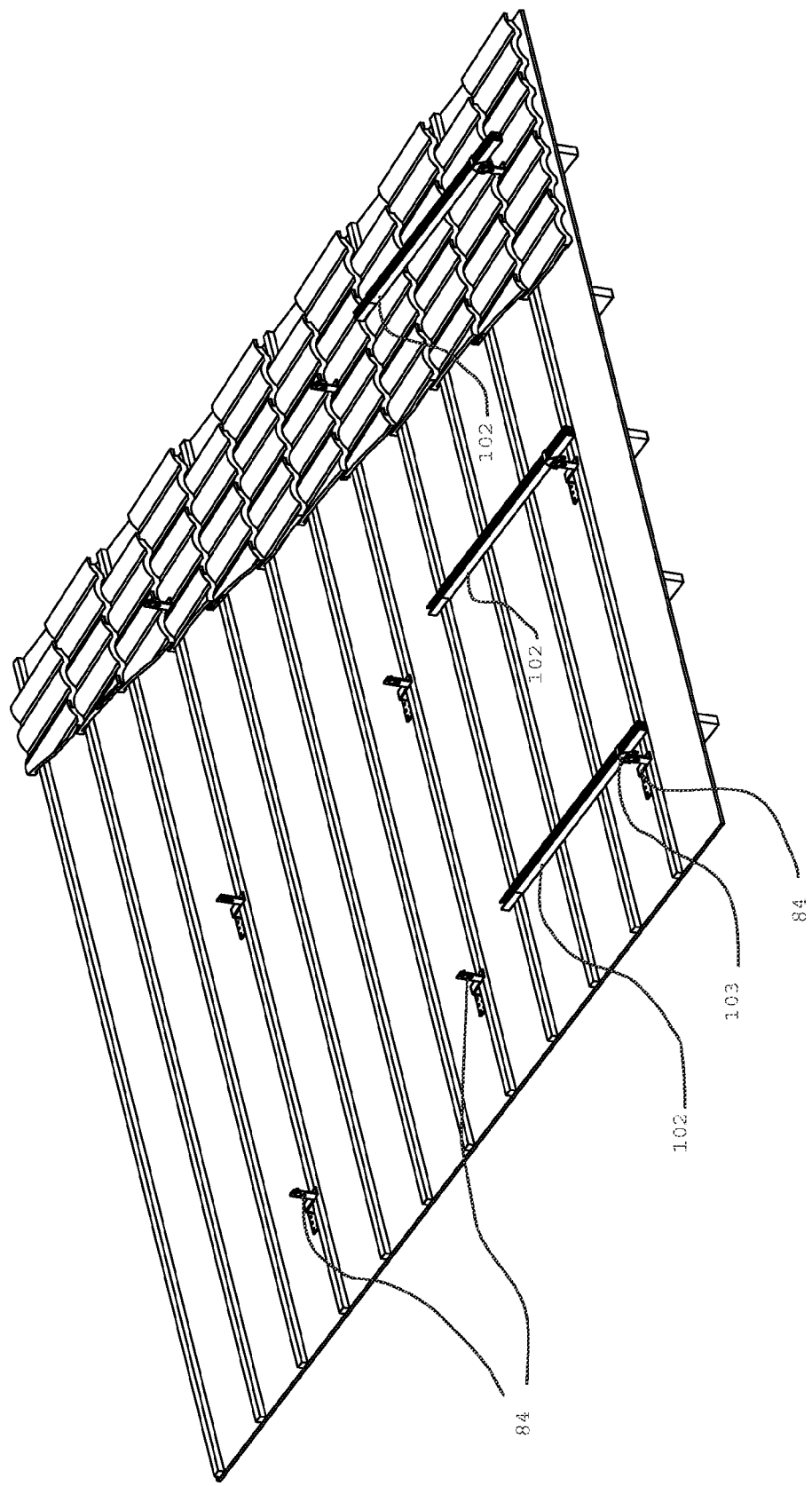
FIG. 13 is a perspective view of a roof with tile hooks and spanner bars.
Figure 14:
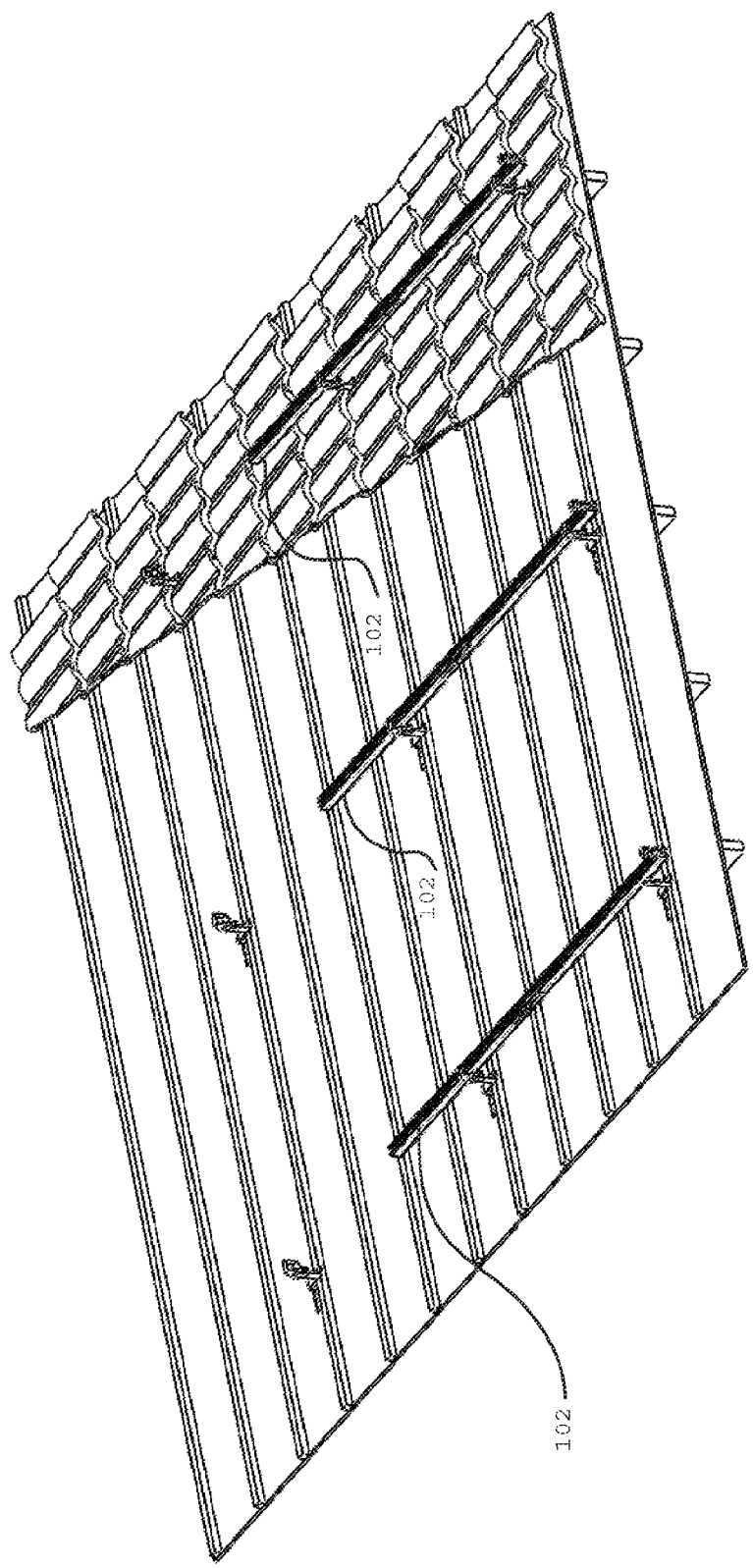
FIG. 14 is a perspective view of a roof with tile hooks and spanner bars.
Figure 15:
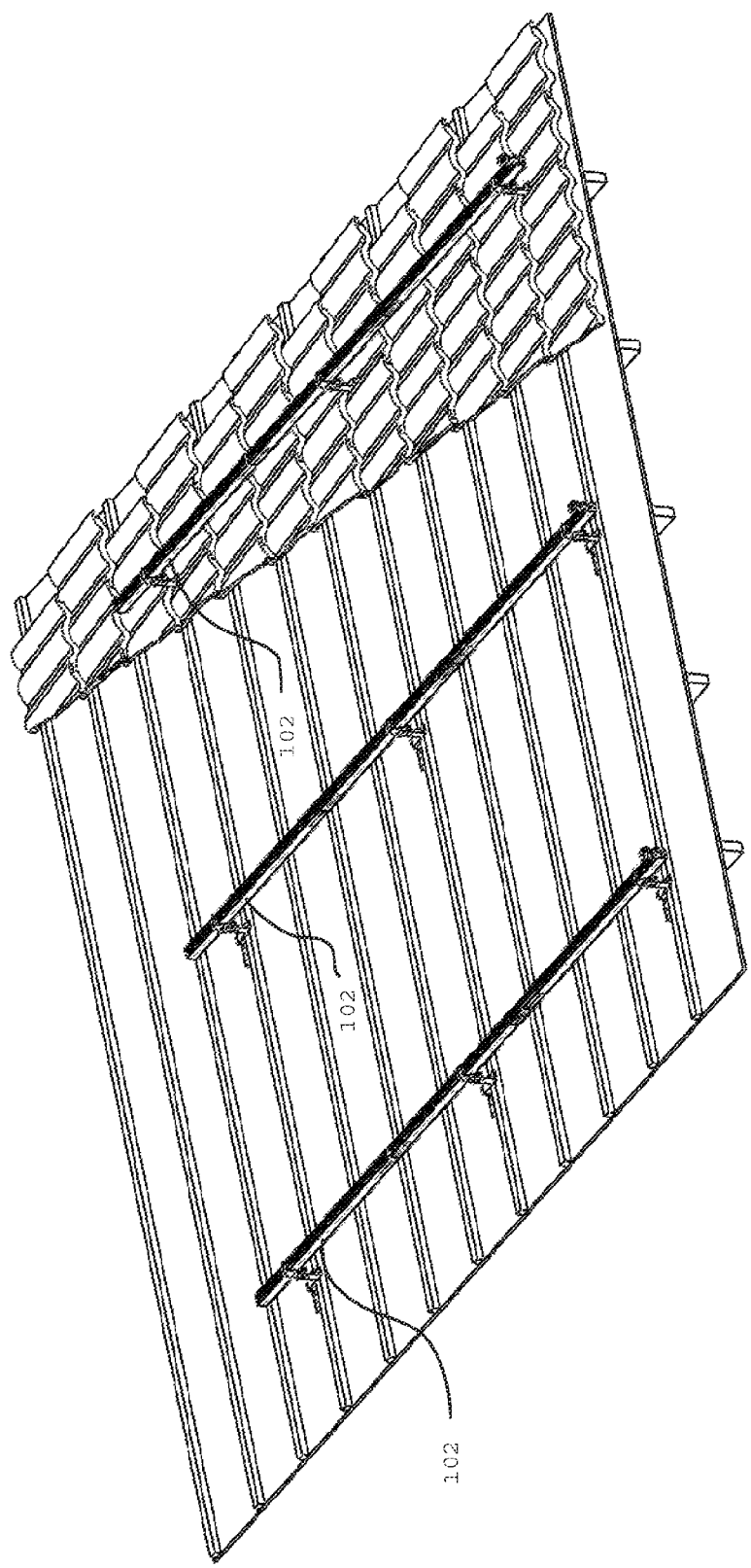
FIG. 15 is a perspective view of a roof with tile hooks and spanner bars.
Figure 16:
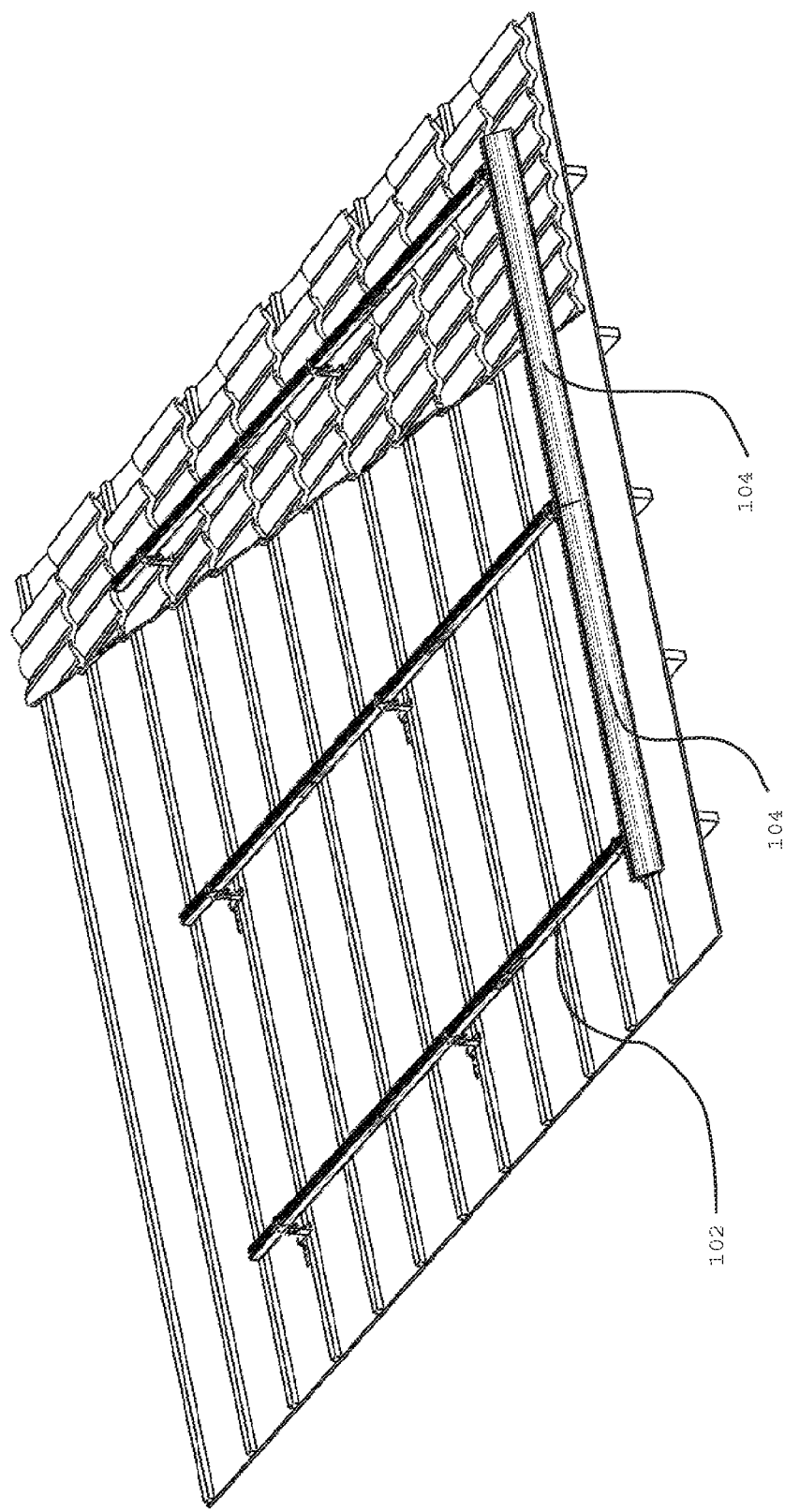
FIG. 16 is a perspective view of a roof with tile hooks and spanner bars and skirts.
Figure 17:
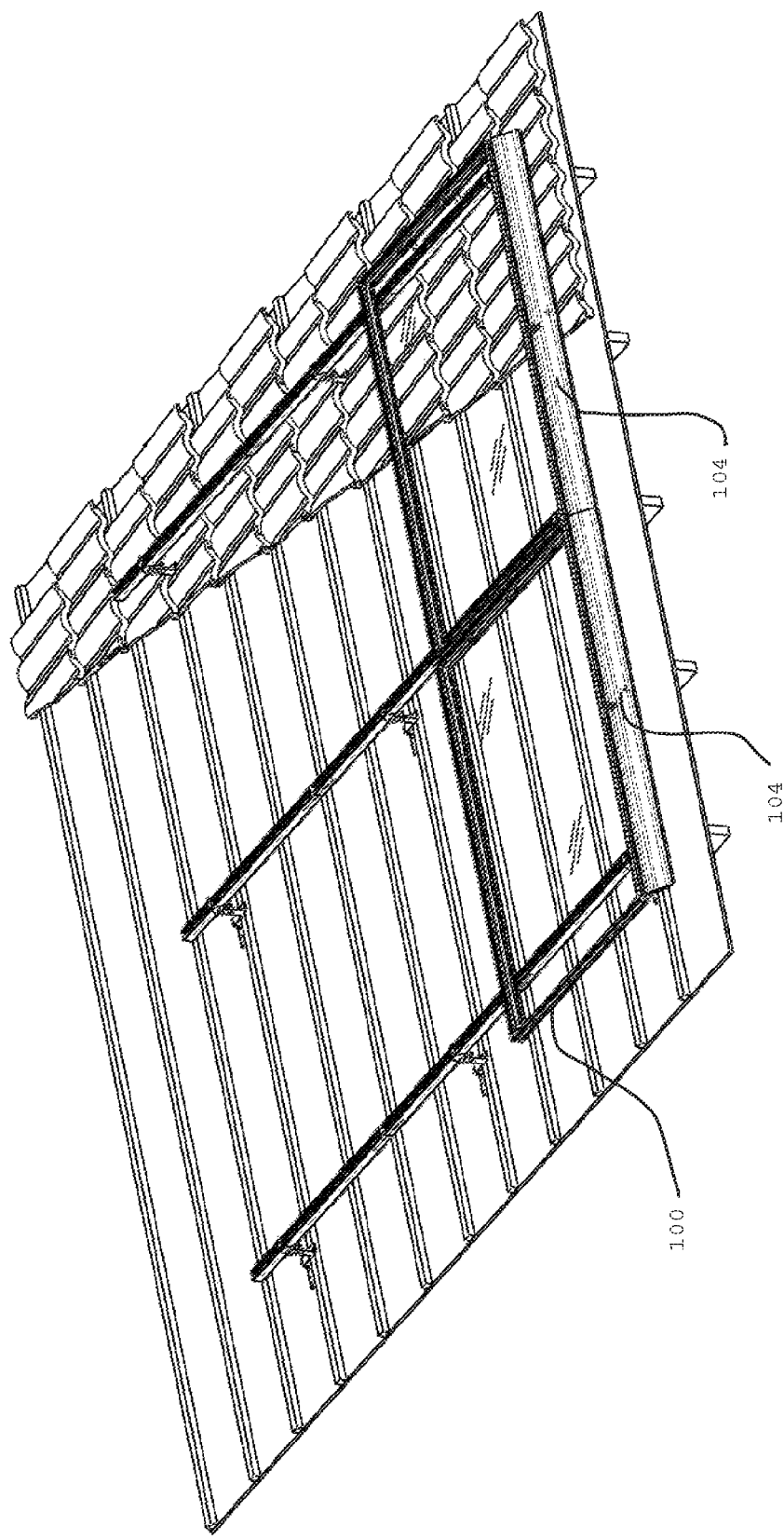
FIG. 17 is a perspective view of a roof with tile hooks, spanner bars, and a PV modules.

FIG. 11A and FIG. 11B show a pivot-fit method of installation whereby frame groove 105 may be placed on long tongue side 107 of cam foot 101 at a first angle of approximately 15-60 degrees (as in FIG. 11A) and rotated downward to a second angle of approximately 0° (as in FIG. 11B). Offset bearing points in frame groove 105 may allow insertion of long tongue into frame groove 105 at the first angle, then restrict movement in the z-axis between frame groove 105 and long tongue 107 at the second angle. Long tongue may be inserted into frame groove 105 to various depths in order to align PV module 100 with adjacent PV modules 100 (not shown). This installation method may offer rapid, tool-free (in some embodiments), auto-grounding (in some embodiments), means and method for adjustably connecting PV module 100 to cam foot 101. This installation method may allow adjustability in the x-axis by variably positioning PV module 100 onto cam foot 101 to line up with roof rafters or a location of attachment means, such as tile hook 116 described further above and below.

FIGS. 12 through 17 show a method of installing a PV array such as PV array 80 shown in FIG. 1A. In such a method, PV modules 100 (similar to PV modules 100 shown in FIG. 2) may be installed on tile roofs 81 using the following set of procedures:

1. Place tile hooks 84 at pre-determined north-south (N-S) and east-west (E-W) locations, as shown. These locations may be determined by referencing load tables (such as incorporated herein by reference) that present calculated N-S and E-W spacing based on inputs such as average wind speed, wind category, roof slope and snow load (see especially FIG. 12).
2. Attach first row of spanner bars 102 to tile hooks 84 by slipping bar clamp 103 over front row spanner bar 102, aligning tile hook slot 84A with a slot 123 in bar clamp 103, and using a bolt 103a and nut (not shown) or other common fasteners (see especially FIG. 13).
3. Attach second row of spanner bars 102 (see especially FIG. 14) by inserting spanner bar double male connector 118 into female end of spanner bar 102a. (see especially FIGS. 9a, 9b) Attach spanner bar 102 to a second row of tile hooks 84 (see especially FIG. 14) by once again slipping bar clamp 103 over spanner bar 102 and aligning tile hook slot 122 with spanner bar clamp slot 123 and using a bolt 103*a* and nut (not shown) or other common fasteners (see especially FIG. 8).

4. Attach cam foot 101 to spanner bar 102 located on the front row by inserting cam nut 111 into spanner groove 109 (see especially FIG. 8*a*) and rotating cam nut 111 a quarter turn within spanner groove 109 to widen groove 109 and create a spring force lock onto cam nut 111 (see especially FIG. 8*b*).

5. Attach remaining rows of spanner bars 102 by again inserting spanner bar double male connectors 118 and attaching spanner bars 102 as previously described (see especially FIG. 15).

6. Once all spanner bars 102 have been attached in place (see especially FIG. 16), install array skirt 104 (similar to skirt 104 in FIG. 16) to the front row of cam foot 101 (see especially FIGS. 10A, 10B).

7. Install first row of PV modules 100 (similar to PV modules 100 shown in FIG. 2) onto cam foot 101 (see especially FIGS. 11A, 11B). Connection of PV module 100 to cam foot 101 may create a continuous ground path from frame groove 105 to cam foot 101 and thus to the spanner bar 102 (see especially FIG. 11B).

8. Ensure PV modules 100, (similar to PV modules 100 in FIG. 2) are essentially level to each other and parallel to the rooftop 81. If they are sufficiently out of alignment, rotate threaded studs 113 in cam foot 101, to raise or lower appropriate PV module edges.

9. Install the next row of PV modules 100 (similar to PV modules 100 in FIG. 2) by first attaching cam foot 101 to frame groove 105 (see especially FIG. 28), and then attaching cam foot 101 (see especially FIG. 3) to spanner groove 109 (see especially FIG. 4).

10. Repeat these procedures until entire PV array 80 is installed and level. (see especially FIG. 1A)

FIGS. 12 through 17 show a method of installing a PV array such as PV array 80 shown in FIG. 1A. In such a method, PV modules 100 (similar to PV modules 100 shown in FIG. 2). In other embodiments spanner bars 102 may be run horizontally instead of vertically on the roof and in still other embodiments PV modules 100 (similar to PV modules 100 in FIG. 2) may be oriented in portrait orientation instead of landscape as shown. Other and similar arrangements are explicitly considered, including PV modules not being oriented in a N-S or E-W plan.

FIG. 18 shows an embodiment of a spanner bar, such as spanner bar 202. Spanner bar 202 may be similar to spanner bar 102 except that double male connector 118 is replaced by a necked down portion 218 of spanner bar 202 and there is no spanner groove 109. Necked down portion 218 may fit into a female portion 203 at an opposite end from necked down portion 218. Thus, spanner bar 202 may comprise a one-piece construction with one male end and one female end. Spanner bars 202 may be capable of mating end-to-end, in a manner similar to conventional tent poles. One skilled in the art will recognize that spanner bar 202 may comprise an inside diameter sized to fit bar clamp 103 as discussed above. In some embodiments spanner bar 202 may comprise a spanner groove 109. In embodiments where spanner bar 202 comprises a spanner groove 109, spanner bar 202 may mate with cam foot 101 as described above for spanner bar 102. In embodiments where spanner bar 202 does not comprise a spanner groove 109 (as depicted in FIG. 18), spanner bar 202 may connect to PV module 100 by way of a typical square tube clamping mechanism as are known in the art.

One or more additional benefits that the above described hardware, systems and methods may facilitate include the following:

May provide a system that simplifies the hardware and/or installation procedure required to mount PV modules on a support structure that requires discrete attachment points, such as a tile roof or ground mount structure;

May reduce or eliminate the need for long mounting rails beneath module arrays, thereby reducing problems associated with warehousing, shipping, and maneuvering long rails onto a roof;

May increase layout flexibility and simplify installations on complicated roofs that may have numerous smaller roof surfaces and/or numerous obstructions (such as vent pipes, chimneys, and so on) since rails may not need to be cut on site;

May enable more cost-effective mounting in landscape orientation since two rows of rail are not required for every row of PV modules as in conventional systems;

May reduce total part count and total number of fasteners required;

May improve the speed of installation and overall reliability of the PV array grounding system;

May provide greater integration with other required equipment in the overall PV system, such as electrical junction and combiner boxes, wire management devices, and other equipment since some embodiments provide mounting hardware that may utilize similar male and female mating parts as other equipment in the system;

May reduce a total length of spanner bar and/or rail material as compared to conventional systems due to optimization of structural support system;

May reduce a total number of attachment points as compared to conventional systems due to optimization of structural support system;

May enable faster PV array system installations due to the ability of a single installer to place and mount PV modules on support structure 81

May allow for easy on site changes to array layout when an actual rooftop does not accurately match the one used for a planned PV array system design;

May provide ability to adapt to uneven roof surfaces.

FIGS. 19 through 32 show an embodiment of a discrete attachment point mounting system.

FIG. 19 shows a spanner bar assembly 340 comprising a connector such as a spanner bar coupling 301, a module spanning bar such as a spanner bar 302, and a module spanning bar clamp such as a bar clamp 303 that may mount to tile hooks 350 or other common tile mount hardware, as with common fasteners such as bolts, nuts, and washers which may be fastened through holes or slots such as clamp holes 303A and tile hook slot 350A. Spanner bar 302 may span one or two PV modules 309, but typically no more; as it may not be intended to replace a long rail which are commonly used in the art. Spanner bar 302 may be provided in lengths that are substantially close to one or two times the length or width of PV module 309 (herein referred generally referred to as "width"). Spanner bar 302 being relatively short and produced in a length that is essentially an integer multiple of the module dimension (noted as "width" above) may yield significant benefits in terms of ease of transport and speed of installation. In some embodiments spanner bar 302 may also provide a simple means to span from two PV module 309 frame 311 sides over to a tile hook 350, thereby freeing up either the x or y axis for positioning flexibility on a roof 308. In some embodiments spanner bar 302 spans the distance between frame 311 side on a first PV module 309 over to frame 311 side on an adjacent PV module 309, while crossing under first PV module 309. For example, an east frame 311 side on first PV module 309 may be effectively coupled to an east frame 311 side on second PV module 309 by way of spanner bar 302 and associated spanner bar couplings 301. In still other embodiments spanner bar 302 spans between two parallel frame sides of PV module 309.

Clamp holes 303A may be in various quantities and may be round, oval, slotted, or the like. As shown in more detail below, spanner bar coupling 301 may connect to spanner bar 302 via a nut 380 that locks in a groove such as spanner groove 302A within the top surface 302B of spanner bar 302 and a machine screw or bolt running through bar coupling 1 (not visible in this view). In other embodiments nut 380 and bolt are replaced by a quarter turn cam nut.

Bar clamp 302 may be connected to tile hook 350 via carriage bolt and nut. In other embodiments, bar clamp 2 may be connected via other fastener types, such as snap-in, press-fit, cam lock, and/or other mechanical connections known in the art. FIG. 19 also shows surface 303B of bar clamp 303. Surface 303B may, in other embodiments, be oriented perpendicular to its orientation as shown in FIG. 19. The variable orientations in which bar clamp 303 may be installed may allow it to be mated with a wide variety of roof tile hook and other roof attachment types. The connection of bar clamp 303 to tile hook 350 or other attachment hardware types as described above, may provide simple and rapid means for connecting bar clamp 303 to standard roof attachment systems such as tile hooks, stand-offs, stanchions, threaded rods, and/or others common in the art.

FIG. 19 also shows bar clamp 303 connected to spanner bar 302. Spanner bar 302 may be inserted through bar clamp 303 as shown. The connection between spanner bar 302 and bar clamp 303 may be made as by a wrap-around friction connection, whereby a bolt may deform the approximately square shape of bar clamp 303 as it may be tightened around the approximately square spanner bar 302. In other embodiments, other connection types such as snap-in, press-fit, cam lock, and/or other mechanical connections known in the art may be used. Some embodiments may provide dimples on bar clamp 303 to ensure proper angular alignment with a plane of the mounting surface. The connection between spanner bar 302 and bar clamp 303 may provide a means for rapid and rigid connection of these components.

It is contemplated that spanner bar assembly 340 comprises components made from aluminum, steel, or other hard metals, or plastic may be suitable as well.

FIG. 20 shows a photovoltaic module array such as PV array 330 mounted on a roof 308 with tile hooks 350 and spanner bar assemblies 340. PV Array 330 comprises a plurality of photovoltaic modules such as PV module 309. As in previous figures, a PV laminate is shown as clear glass so that components below may be viewed. FIG. 20 also shows an interlocking device, such as interlock 345, which may provide both structural and ground bond connections at the corners of PV modules 309. Interlock 345 is described in more detail below.

FIG. 21 shows a portion of PV module 309. As is common in the art, PV module 309 comprises a PV laminate 310 with an aluminum frame 311 to provide additional strength and a location for attachment of mounting hardware. Spanner bar assemblies 340 may be used with module frames that have a groove on the outer surface such as frame groove 311A. Other embodiments comprise spanner bar assemblies optimized for use with non-grooved PV modules frames. In such embodiments, spanner bar coupling 301 may comprise a hold-down clamp or end clamp as are common in the art for non-grooved frame PV modules.

FIG. 21 also shows spanner bar coupling 301 connected to spanner bar 302 through the use of a bolt and nut 380 that interlocks with spanner groove 302A. As with cam foot 101 in FIG. 5, spanner bar coupling 301 may contain a cup or cone point bonding feature such as cone point 110. Spanner bar coupling 301 may be attached to module frame 311 using a geometrically compatible part feature 301A that interlocks with the groove 311A located on the outer surface of the module frame 311 by way of a rotational tool-free motion. In other embodiments a standard T nut may be used instead of cam nut 307.

FIGS. 22 through 32 show the steps required for installing a photovoltaic array such as PV array 330.

In FIG. 22, four typical tile hooks 350 are shown mounted to a rooftop surface. One familiar with the art may recognize that other tile roof mounting hardware besides tile hooks could be used for the same function. A frame mount component 314 that allows for a direct attachment to tile hooks through use of standard fasteners such as nuts, bolts washers and the like may be installed on the first row of tile hooks 350. FIG. 22 also shows the attachment of spanner bar 302 to tile hook 350 through the use of bar clamp 303.

FIG. 23 shows a method of installing PV module 309 in its desired location upon a rooftop as by a pivot-fit, drop in action as discussed above. This method allows for rapid installation that does not require the use of tools, therefore saving installation time.

FIG. 24 shows spanner bar coupling 301 inserting into frame groove 311A. Also depicted is the alignment of cam nut 307 with spanner groove 302A. Once spanner bar coupling 301 has been rotationally engaged frame groove 311A, nut 380 may be secured as described above.

Figure 26:
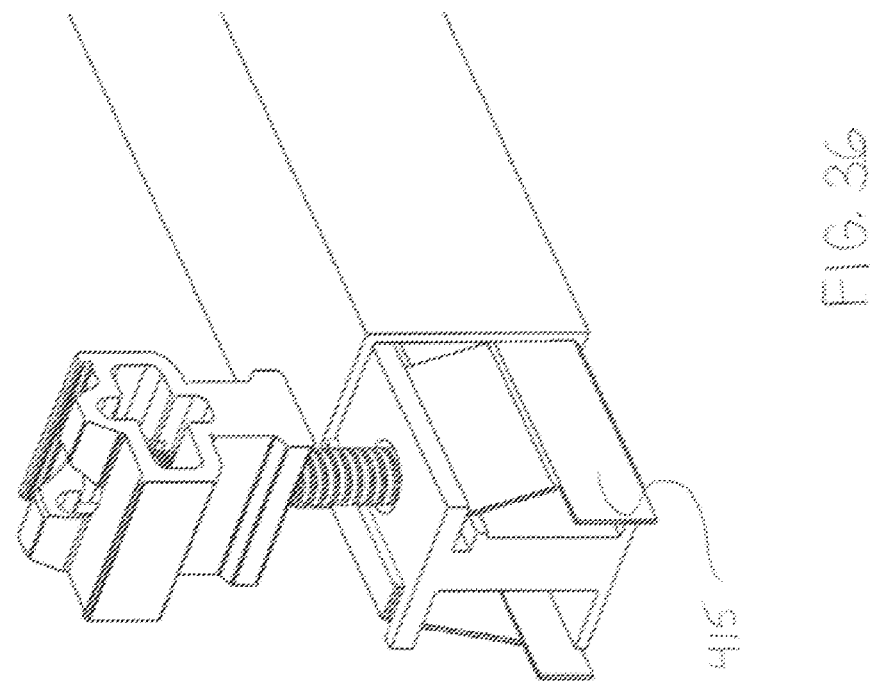
FIG. 26 is an enlarged perspective view of a portion of a PV module and spanner bars.
Figure 37:
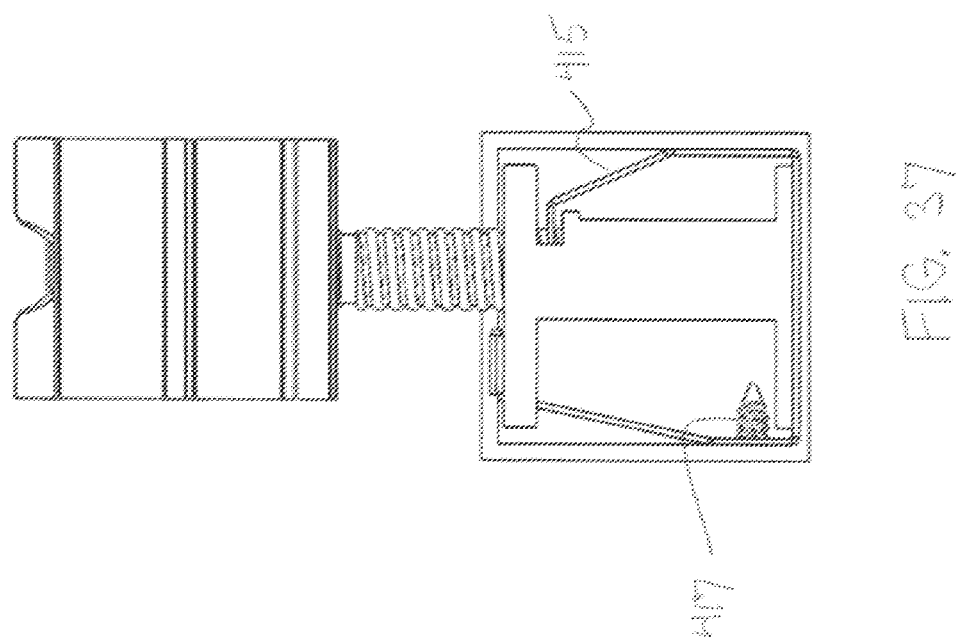
FIG. 37 is a side view of FIG. 36.

FIGS. 25 through 27 show how additional spanner bar assemblies 340 may continue to be connected once the first PV module 309 has been installed.

FIG. 25 depicts spanner bar assembly 340 being installed as by connection to frame groove 311A of PV module 309. This connection may be accomplished via a drop-in, pivot-fit action and serves to lengthen the run of structural material, which spans between tile hooks 350.

FIG. 26 shows a close up view of geometrically compatible part feature 301A of spanner bar coupling 301 pivoting into frame groove 311A in the direction of the arrow.

FIG. 27 shows spanner bar assembly 340 in its installed position on a rooftop.

Figure 28:
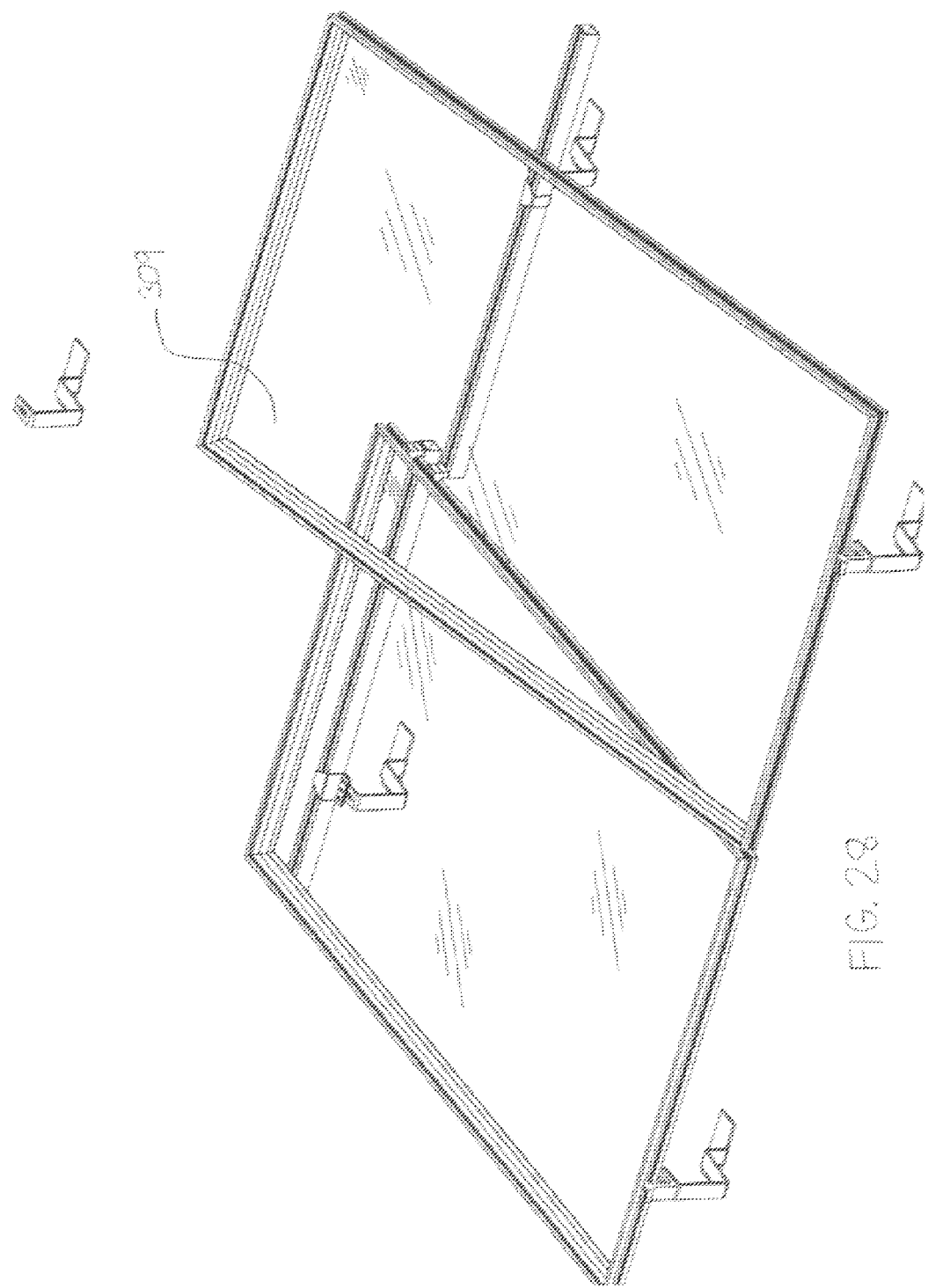
FIG. 28 is a perspective view of PV modules, spanner bars, and tile hooks.

FIG. 28 shows additional PV module 309 being installed via a drop-in, pivot-fit action as described and shown in FIG. 23 above.

FIG. 29 shows additional PV module 309 in its installed position on a rooftop.

FIG. 30 shows installed interlock 345. Interlock 345 may be installed by inserting into frame grooves 311A and rotating frame coupling components 345A approximately 90 degrees. Interlock 345 may provide structural and/or grounding connections between PV modules 309.

FIG. 31 Shows a fully assembled PV array 390 (roof not shown). Note that spanner bars 302 may, in some cases, not be installed under each module. In this case interlock 345 provides the necessary structural connection between modules 309 to minimize or eliminate the need for spanner bar 302 underneath PV module 355. FIG. 31 shows an example 355 of a PV module 309 that does not have a spanner bar 302 underneath it.

FIG. 32 shows an alternate embodiment where spanner bars 302 are replaced by spanner bars 395 which span two modules 309 instead of one module 309.

In other embodiments, spanner bars 302 may be run vertically instead of horizontally on a roof and in still other embodiments PV modules 309 may be oriented in landscape orientation, or other orientation, instead of portrait as shown.

FIGS. 33-47 show additional embodiments. FIGS. 33-37 show an alternate double male coupling such as double male coupling 410. Double male coupling may couple spanner bars 420A and 420B and may provide tapped holes 412, 414 for connection to a double tongue coupling 430. Spring clip 415 may provide retention and grounding between components and may be secured to spanner bar 420A.

FIGS. 38-44 an embodiment where a double male connector such as double male connector 510 comprises a channel-shaped member 525 for coupling adjacent spanner bars 520A, 520B and for connecting to double male PV module coupling 514. FIGS. 42-44 show an embodiment where double male module couplings 514 interlock PV modules 510 on a ground mount structure 540 and connect to double male connectors 525 which link to spanner bars 520A, 520B. Spanner bars 520A, 520B connect to discrete attachment points on mounting structure 540. Interlocks 560 may comprise connections to double male connectors 525 in alternate embodiments instead of double tongue couplings 514.

Referring now to an embodiment, and particularly to FIGS. 45A-45C, wherein like numerals refer to like structures, a bracket, such as a tile hook, clip or the like, such as tile hook 4500 is shown in perspective at FIGS. 45A-45B and with a side view at FIG. 45C. Brackets, such as tile hooks and the like, for use with PV modules, or arrays of PV modules, are known in the art, some examples, types, and embodiments are shown, for example, and disclosed in greater detail at U.S. patent application Ser. No. 13/325,054 filed approximately Dec. 13, 2011 and Ser. No. 13/402,860 filed approximately Feb. 22, 2012, both of which are entitled: "Discrete Attachment Point Apparatus and System for Photovoltaic Arrays", and both of which are incorporated by reference herein in their entireties. A tile hook such as tile hook 4500 may include an arm portion 4501 with a tile hook slot 4502 and one or more notches 4503A and 4503B. Tile hook 4500 may further include base portion 4504 which may consist of a horizontal panel 4505 with one or more substrate apertures 4506A-4506L and a vertical panel 4507 with one or more hook apertures 4508A-4508C. Tile hook 4500 may further include bolt 4509, washer 4510, and nut 4511 and/or other fastening mechanism(s) known to or understood by one of skill in the art. For the purpose of this disclosure, "up" or "upward" means skyward, "down" or "downward" means away from the sky (usually towards a support surface), "front" or "forward" means toward the base portion end of the tile hook, and rear, back, or backward means toward the arm end of the tile hook. A tile hook such as tile hook 4500 may be comprised of components made from aluminum, steel, or other hard, slightly deformable, and/or rigid materials, including suitable metals, plastics, composites and the like. Base portion 4504 and arm portion 4501 of tile hook 4500 may be of suitable dimensions, for example, 6 millimeters thick, 5 millimeters thick, 10 millimeters thick, or some other thickness, and they may be of the same or variable thickness or different thicknesses along their lengths, widths, or other dimension; and/or from one bracket or hook compared to another bracket or hook. Base portion 4504 may be of suitable dimensions, for example, (i) 160 millimeters wide, 100 millimeters wide, 200 millimeters wide, or another width, (ii) 67.5 millimeters deep, 50 millimeters deep, 100 millimeters deep, or another depth, and (iii) 37 millimeters high, 50 millimeters high, 30 millimeters high, or another height or variable thickness or different thicknesses along their lengths, widths, or other dimension; and/or from one base portion compared to another base portion. Horizontal panel 4505 may meet vertical panel 4507 at a ninety degree angle, at an eighty degree angle, at a 110 degree angle, or at some other angle between zero and one hundred eighty degrees. Substrate apertures 4506A-4506L may be circular such as substrate apertures 4506A and 4506G, oblong such as substrate apertures 4506B-4506E and 4506H-4506L, or other shape(s) or a variety of shapes. Substrate apertures 4506A-4506L may appear in rows, in rings, at random, or in another formation. Tile hook apertures 4508A-4508C may be circular, oblong, or another shape, may be centered vertically along the width of vertical panel 4507, may be staggered at different heights along vertical panel 4507, may be evenly distributed across the width/length of vertical panel 4507, or may be unevenly distributed across that width/length. Arm portion 4501 may be (i) 145 millimeters high, 140 millimeters high, 160 millimeters high, or some other height (ii) 35 millimeters wide, 50 millimeters wide, 30 millimeters wide, or some other width, and (iii) in approximately the shape of a question mark or comma, in approximately the shape of a C, G, J, S, V, or some other shape. Tile hook slot 4502 may be centered in the top-most portion of arm portion 4501 or may be off-center. Notches 4503A-4503B may be cut-outs, voids, holes, or the like in the sides of arm portion 4501 and may be curved, angular, or other shape(s), including complex shapes. Base portion 4504 of tile hook 4500 may be secured to a substrate (not shown) as by applying screws, bolts, and/or other fastener(s) to one or more of the substrate aperture(s). In the currently disclosed embodiment, tile hook 4500 is shown with tile hook slot 4502 which may be used to attach to (i) one or more spanner bar(s) or the like (not shown) which may include flanges that curve downward and in toward arm portion 4501 and into notches 4503A and 4503B and/or (ii) ancillary devices for mounting PV modules (not shown) into or onto a PV module or an array of PV modules. A spanner bar and the interaction of tile hooks with spanner bars are discussed in greater detail below. Tile hook 4500 may be used to connect to or mount various tile mount hardware, as with common fasteners such as bolts, rivets, screws, nuts, and/or washers which may be, for example, fastened through or near holes or slots such as clamp holes (not shown) and/or tile hook slot 4502, as discussed in greater detail below.

Figure 46A:
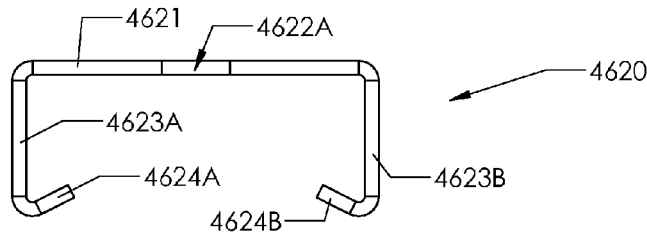
FIG. 46A is an orthogonal view of a spanner bar.
Figure 46B:
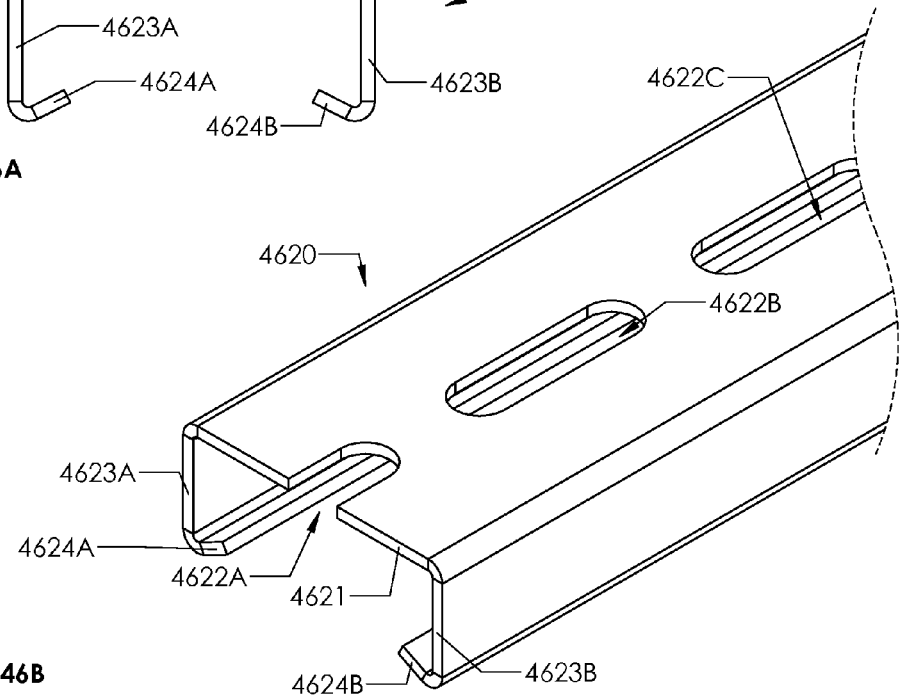
FIG. 46B is a perspective view of a spanner bar.
Figure 46C:
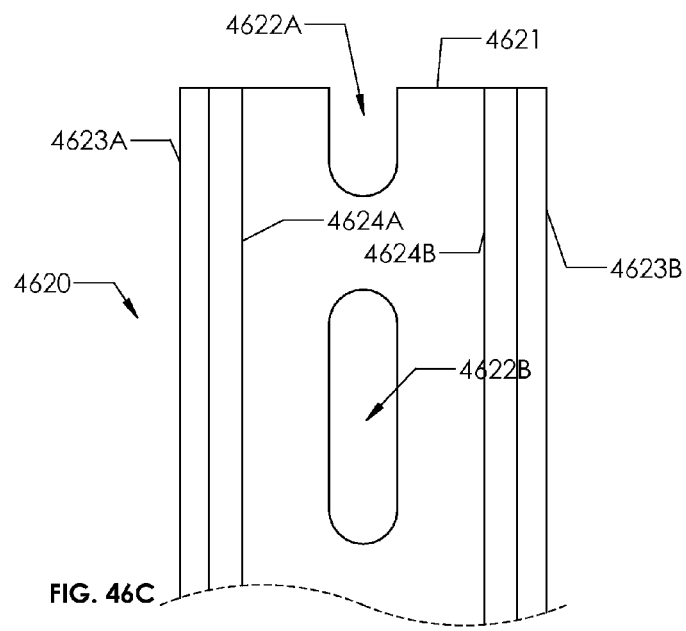
FIG. 46C is a top view of a spanner bar.

Referring now to FIGS. 46A-46C, wherein like numerals refer to like structures, a spanner bar such as spanner bar 4620 is shown. Spanner bar 4620 may consist of a top panel 4621 with one or more apertures 4622A-4622C, two side panels 4623A and 4623B, and two flanges 4624A and 4624B. For the purpose of this disclosure, "up" or "upward" means skyward and "down" or "downward" means away from the sky (usually towards a support surface); "in" or "inward" means toward the center, lengthwise, of the top panel 4621 and "out" or "outward" means away from the center, lengthwise, of the top panel 4621. Side panels 4623A and 4623B identify the "sides" of spanner bar 4620 and the edges of the spanner bar 4620 without side panels 4623A and 4623B identify the "end" or "ends" of spanner bar 4620. For some panels, a side of top panel 4621 intersects a side panel 4623A or 4623B that extends downward from top panel 4621. Such side panel 4623A or 4623B then curves inward and upward to form flange 4624A or 4624B respectively. Apertures 4622A-4622C (and others, not shown) may extend along the center of the length of top panel 4621, may appear off-center, or may appear in a staggered fashion. Apertures 4622A-4622C may be oblong, circular, oval, square, rectangular, or another geometric shape or an irregular shape. Apertures may intersect an end of spanner bar 4620, such as aperture 4622A, or may exist entirely within spanner bar 4620 such as aperture 4622B. Top panel 4621 may intersect side panels 4623A and 4623B at a ninety degree angle, an eighty degree angle, a one hundred degree angle, or another angle between zero and ninety degrees. Side panels 4623A and 4623B may intersect top panel 4621 at the same angle or at different angles. Flanges 4624A and 4624B may extend inward and upward from side panels 4623A and 4623B respectively at a seventy-six degree angle, seventy degree angle, ninety five degree angle, or another angle between zero and one hundred eighty degrees. Spanner bar 4620 may be of suitable dimensions, for example (i) 1430 millimeters long, 1400 millimeters long, 1450 millimeters long, or another length dimension; (ii) 39 millimeters wide, 30 millimeters wide, 50 millimeters wide, or another height dimension; and (iii) 22 millimeters high, 20 millimeters high, 25 millimeters high, or another height dimension. The length of spanner bar 220 may be longer than the length of certain PV module(s) in an array to which it is attached, as discussed in further detail below, by two percent, five percent, seven percent, or another percentage or by fifty millimeters, twenty millimeters, one hundred millimeters, or another length. Alternatively, and without limitation, the length of spanner bar 220 may be longer than then a width of a PV module(s) in an array to which it is attached, discussed in detail below, by two percent, five percent, seven percent, or another percentage or by fifty millimeters, twenty millimeters, one hundred millimeters, or another length. The thickness of top panel 4621, side panels 4623A and 4623B, and flanges 4624A and 4624B may be, for example, 2.25 millimeters, 2.2 millimeters, 2.3 millimeters, or another thickness, or variable thickness or different thicknesses along their length, width, or other dimension; and/or from one spanner bar compared to another spanner bar. Top panel 4621, side panels 4623A and 4623B, and flanges 4624A and 4624B may be the same thickness or different thicknesses. A spanner bar such as spanner bar 220 may be made from aluminum, steel, or other hard and/or rigid materials, including suitable metals, plastics, composites and the like. A spanner bar may connect to one or more tile hooks as well as to one or more other components of a PV module installation, such as mounting feet. A spanner bar may be a rail member. Interaction between a spanner bar and other devices is discussed in greater detail below.

Referring now to FIGS. 47A-48C, wherein like numerals refer to like structures, embodiments of lever clamps are shown. Referring now to FIGS. 47A-47C, an embodiment of a lever clamp is shown. A lever clamp such as lever clamp 4730 may include a crossbar, such as crossbar 4731, crossbar flange 4732, lateral panel 4733, and arm 4734 that may include angle 4735 and may terminate in fork 4736 with two or more prongs 4737A and 4737B. For the purpose of this disclosure, "up" or "upward" means skyward, and the prongs 4737A and 4737B of lever clamp 4730 point skyward, "down" or "downward" means away from the sky (usually towards a support surface), rear, back, or backward means toward the crossbar end of the lever clamp and "front" or "forward" means the opposite direction. Crossbar 4731 of lever clamp 4730 may extend laterally, with crossbar flange 4732 extending downward and angling backward from crossbar 4731. Crossbar flange 4732 may then intersect the lateral panel 4733. Lateral panel 4733 may extend laterally in one direction away from crossbar flange 4732 and may intersect arm 4734, which extends forward from lateral panel 4733. Arm 4734 may include angle 4735 at a point along its length. Arm 4734 may then terminate as it connects to fork 4736. Two prongs 4737A and 4737B may then extend forward and upward from fork 4736. A lever clamp such as lever clamp 4730 may be made from aluminum, steel, or other hard materials that may flex and/or distort and return to their original shape (such as by plastic deformation); such materials including suitable metals, plastics, composites and the like. A thickness of crossbar 4731, crossbar flange 4732, lateral panel 4733, arm 4734, fork 4736, and prongs 4737A and 4737B may be 3 millimeters, 2.75 millimeters, 3.25 millimeters, or another thickness or variable thicknesses, and the thicknesses of crossbar 4731, crossbar flange 4732, lateral panel 4733, arm 4734, fork 4736, and prongs 4737A and 4737B may be the same or variable thickness or different thicknesses along their lengths, widths, or other dimension. Crossbar 4731 may be (i) 50 millimeters wide, 45 millimeters wide, 55 millimeters wide, or another width and (ii) 8 millimeters high, 7 millimeters high, 9 millimeters high, or another height or variable thickness or different thicknesses along their lengths, widths, or other dimension; and/or from one base portion compared to another base portion. The front plane of crossbar 4731 may meet the front plane of crossbar flange 4732 at a 210 degree angle, a 200 degree angle, a 220 degree angle, or another angle. Crossbar flange 4732 may be (i) 9 millimeters long, 8 millimeters long, 10 millimeters long, or another length and (ii) 15 millimeters wide, 12 millimeters wide, 20 millimeters wide, or another width. Arm 4734 may be of suitable dimensions, for example (i) 160 millimeters long, 150 millimeters long, 200 millimeters long, or another length, (ii) 10 millimeters wide, 8 millimeters wide, 12 millimeters wide, or another width, and (iii) may include an angle 4733 of forty-five degrees, forty degrees, fifty degrees, or another angle between zero and one hundred eighty degrees.

Figure 48A:
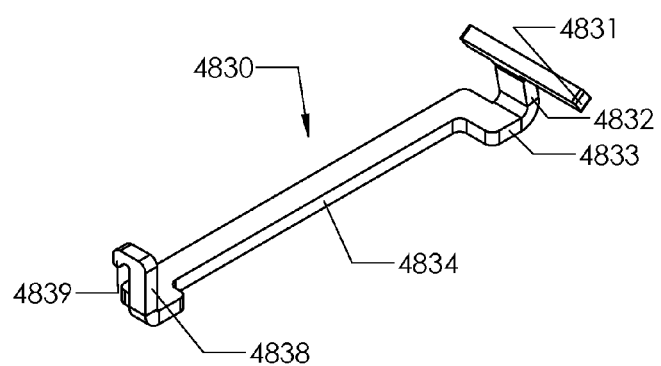
FIG. 48A is a perspective view of a lever clamp.
Figure 48B:
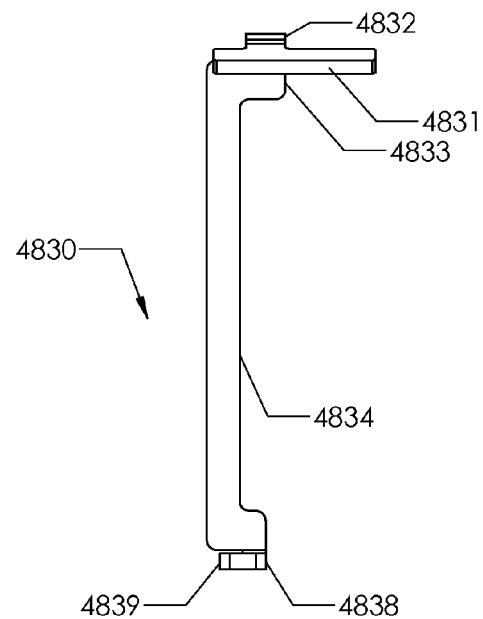
FIG. 48B is a top view of a lever clamp.
Figure 48C:
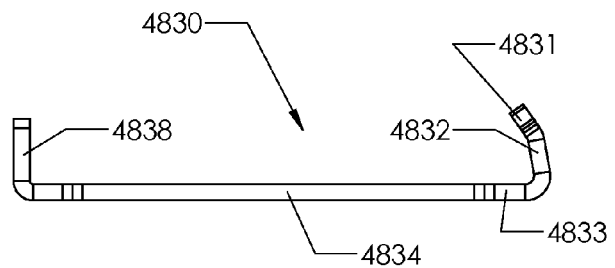
FIG. 48C is a side view of a lever clamp.

Referring now to FIGS. 48A-48C, another embodiment of a lever clamp is shown. A lever clamp such as lever clamp 4830 is similar to lever clamp 4730 as shown and described in FIG. 47A and others, and to other lever clamps. A lever clamp such as lever clamp 4830 may include a crossbar 4831, crossbar flange 4832, lateral panel 4833, and arm 4834 that may terminate in hook 4838 that ends with lip 4839. For the purpose of this disclosure, "up" or "upward" means skyward, "down" or "downward" means away from the sky sky (usually towards a support surface), rear, back, or backward means toward the crossbar end of the lever clamp and "front" or "forward" means the opposite direction. Crossbar 4831 of lever clamp 4830 may be of suitable dimensions and may, for example, extend laterally, with the crossbar flange 4832 extending downward and angling forward from crossbar 4831 with the front surface of crossbar 4831 meeting the front surface of crossbar flange 4832 at a 155 degree angle, 150 degree angle, 160 degree angle, or another angle between zero and one hundred eighty degrees. Crossbar flange 4832 may then intersect lateral panel 4833. Lateral panel 4833 may extend laterally in one direction away from crossbar flange 4832 and may intersect arm 4834, which extends forward from lateral panel 4833. Arm 4834 then may terminate as it connects to hook 4838 which may extend upward, then laterally in the same direction as lateral panel 4833, then extending downward to form lip 4839. A lever clamp may secure one component of a PV array to another component of a PV array, for example and without limitation a tile hook to a spanner bar.

Figure 49A:
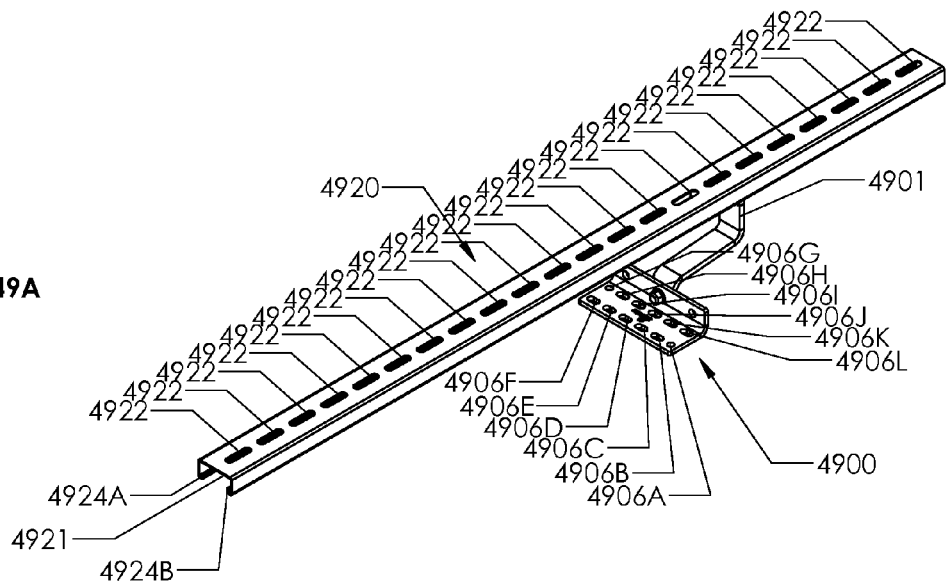
FIG. 49A is a perspective view of a spanner bar connected to a tile hook with a lever clamp.
Figure 49B:
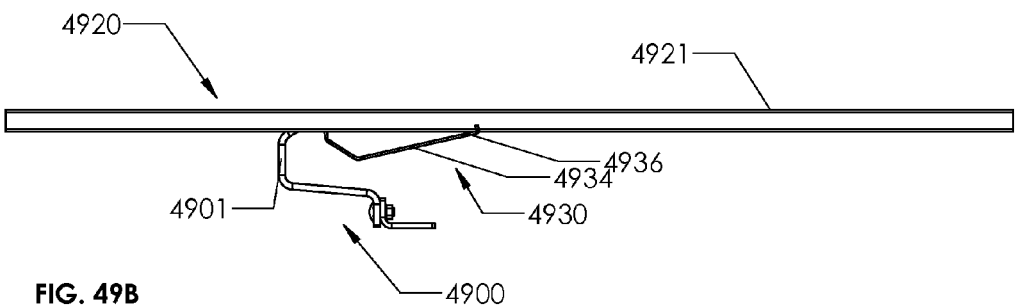
FIG. 49B is a side view of a spanner bar connected to a tile hook with a lever clamp.
Figure 49C:
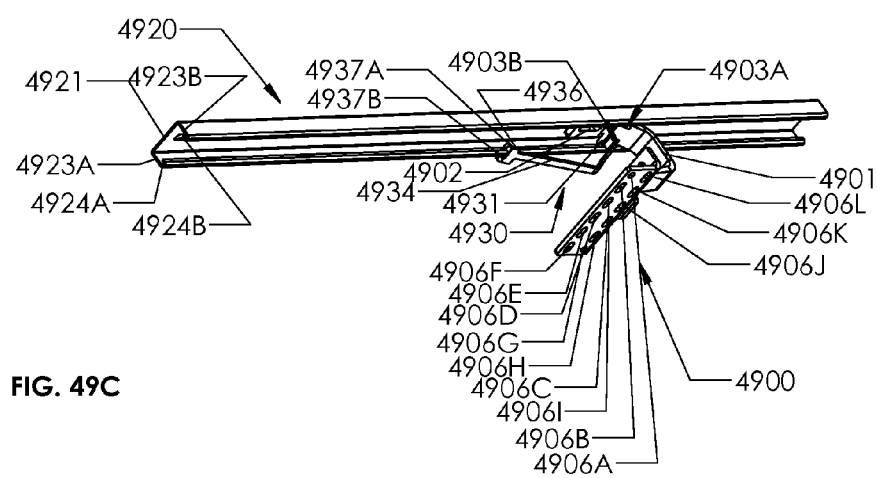
FIG. 49C is a lower perspective view of a spanner bar connected to a tile hook with a lever clamp.

Referring now to FIGS. 49A-49C, other embodiments of a tile hook, spanner bar, and lever clamp are shown engaging one another. A tile hook such as tile hook 4900 may engage a spanner bar such as spanner bar 4920 and a lever clamp such as lever clamp 4930 as follows. Tile hook 4900 may be secured to a substrate (not shown) or support surface, such as a roof, using screws, bolts, or other connector(s) as known to one of skill in the art, as by affixing such connector(s) through one or more substrate apertures 4906A-4906L. Spanner bar 4920 may then be slid onto arm portion 4901 of tile hook 4900 such that flanges 4924A and 4924B of spanner bar 4920 align with notches 4903A and 4903B of tile hook 4900. Tile hook slot 4902 may, but need not, align with any given aperture 4922. Lever clamp 4930 may then be oriented such that crossbar 4931 is placed against the underside of top panel 4921 of spanner bar 4920 such that crossbar 4931 is perpendicular to spanner bar 4920 and is located between the underside of top panel 4921 and the top-most surfaces of the flanges 4924A and 4924B. Arm 4934 may extend either toward or away from tile hook 4900. Crossbar 4931 may then be positioned such that it is beneath and pressing against the underside of arm portion 4901 of tile hook 4900. Arm 4934 of lever clamp 4930 may then be pulled downward, at which time lever clamp 4930 may flex, and fork 4936 positioned such that prongs 4937A and 4937B straddle the bottom of the nearest side panel 4923. When the downward force on arm 4934 is released, it will "spring" upward to press against spanner bar 4920, and the springing force will press crossbar 4931 against the underside of arm portion 4901 of tile hook 4900, positioning, connecting, affixing, locking, holding or securing tile hook 4900 into place against spanner bar 4920.

Figures 50A, 50B:
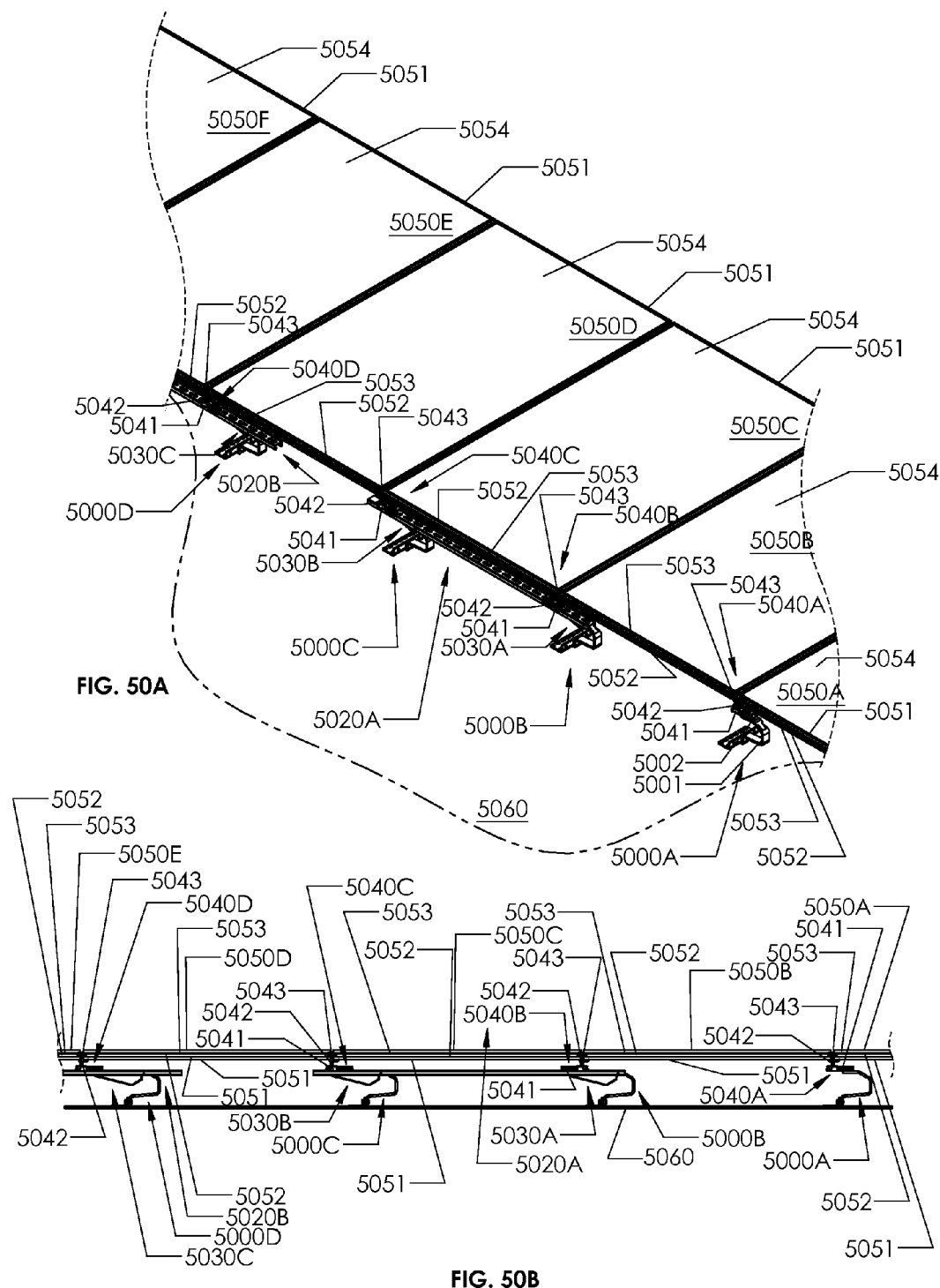
FIG. 50A is a perspective view of a PV array installed on non-contiguous spanner bars.
FIG. 50B is a side view of a PV array installed on non-contiguous spanner bars.

Referring now to FIGS. 50A-50B, other embodiments of a tile hook, spanner bar, and lever clamp are shown connected to PV modules using leveling feet to form a portion of a PV array attached to a substrate or support surface. Tile hooks such as tile hooks 5000A, 5000B, 5000C and 5000D are similar to tile hook 100 as shown and described in FIG. 45A and others and to tile hook 4900 as shown and described in FIG. 49A and others, as well as to other tile hooks. Spanner bars such as spanner bars 5020A and 5020B are similar to spanner bar 4620 as shown and described in FIG. 46A and others, to spanner bar 4920 as shown and described in FIG. 49A and others, and to other spanner bars. Lever clamps 5030A, 5030B, and 5030C are similar to lever clamp 4730 as shown and described in FIG. 47A and others, to lever clamp 4830 as shown and described in FIG. 48A and others, to lever clamp 4930 as shown and described in FIG. 49A and others, and to other lever clamps. PV modules such as PV Modules 5050A, 5050B, 5050C, 5050D, and 5050E are shown. PV Modules 5050A, 5050B, 5050C, 5050D, 5050E, and 5050F may each include a frame 5051 with a groove, such as groove 5052, on at least one (but usually two non-intersecting, or four) outer surface(s) 5053 that surround a PV laminate, such as laminate 5054 that may include any of various photovoltaic materials for converting solar radiation to electric current. One or more leveling feet, such as leveling feet 5040A, 5040B, 5040C, and 5040D, are shown. Leveling feet for use with PV modules or arrays of PV modules are known in the art, some examples, types, and embodiments are shown, for example, and disclosed in greater detail, without limitation, at (i) U.S. Pat. No. 7,592,537 entitled Method and Apparatus for Mounting Photovoltaic Modules, filed approximately Feb. 7, 2005, which is incorporated by reference herein in its entirety; (ii) U.S. patent application Ser. No. 13/241,199 entitled Method and Apparatus for Mounting Photovoltaic Modules, filed approximately Sep. 22, 2011, which is incorporated by reference herein in its entirety; and (iii) U.S. patent application Ser. No. 13/351,397 entitled Method and Apparatus for Mounting Photovoltaic Modules, filed approximately Jan. 17, 2012, which is incorporated by reference herein in its entirety. Leveling feet 5040A, 5040B, 5040C, and 5040D may each include base 5041, stud 5042 and coupling 5043. A substrate, such as substrate 5060, may be a roof or other support surface or structure.

As shown in FIGS. 50A and 50B, tile hooks 5000B, 5000C, and 5000D, spanner bars 5020A and 5020B, and lever clamps 5030A, 5030B, and 5030C may connect to one another and to substrate 5060 as generally described above for other embodiments. Leveling foot 5040A may connect directly to tile hook 5000A by securing base 5041 of leveling foot 5040A to arm portion 5001 of tile hook 5000A by passing a bolt or other connector through tile hook slot 5002 of tile hook 5000A. Alternatively, (i) tile hooks 5000B and 5000C may connect to spanner bar 5020A, to which leveling feet 5040B and 5040C may also connect, and (ii) tile hook 5000D may connect to spanner bar 5020B, to which leveling foot 5040D may also connect. One or more couplings 5043 of leveling feet 5040A, 5040B, 5040C, and 5040D may then connect adjacent PV modules 5050A-5050E as by engaging grooves 5052 of adjacent modules. Because couplings 5043 of leveling feet 5040A, 5040B, 5040C, and 5040D may connect adjacent PV modules, couplings 5043 may appear at, near or proximate to a seam or gap formed between two adjacent modules. The seam or gap between two adjacent modules, such as modules 5050A and 5050B, may appear at a point sufficiently proximate to tile hook 5000A such that leveling foot 5040A may connect directly to tile hook 5000A and be properly positioned for coupling 5043 of leveling foot 5040A to connect to grooves 5052 of modules 5050A and 5050B. Where tile hooks 5000B, 5000C, and 5000D may not align with a seam or gap formed between two adjacent modules, (i) leveling feet 5040B and 5040C may connect to spanner bar 5020A to be positioned between modules 5050B and 5050C and modules 5050C and 5050D respectively, and (ii) leveling foot 5050D may connect to spanner bar 5020B to be positioned between modules 5050D and 5050E. This configurability of components removes a need for a spanner bar or similar component between tile hooks 5000A and 5000B, and between tile hooks 5000C and 5000D, or may provide for a variety of other configurations in which contiguous segments of spanner bars or other rails are not necessary between each or all tile hooks. Because rails are not necessary between all tile hooks, the total length of rail required may be reduced and/or minimized for a PV array. Where the substrate is the support surface beneath the tiles on a tile roof, the necessary number of spanner bars may be reduced if the length of the PV module (meaning, for this purpose, the dimension that extends in the same direction as the slope of the roof) is a multiple or nearly a multiple of the length of the "reveal" of those tiles, where the reveal is the portion of a given tile that is not covered by the next tile immediately up-roof from the given tile. Where the PV module length is a multiple or nearly a multiple of the tile reveal, tile hooks may be connected to the substrate at intervals equal to or nearly equal to the position of the gap or seam between adjacent PV modules because the tile hook slot of a tile hook may appear above the reveal of a tile. Where the length of a PV module is a multiple of the length of the tile reveal, a number, n, of overlapping tiles (running in the direction of the slope of the roof) will equal or nearly equal the length of the PV module. In such a circumstance, tile hooks may be placed at or sufficiently close to the position of the seams or gaps between adjacent modules that leveling feet may be connected directly to the tile hooks such that the couplings of the leveling feet may connect to the grooves of the adjacent PV modules with no use, minimal use, or lesser use of spanner bars.

Rails

Referring now to FIGS. 51-55, various embodiments of a rail are shown. Referring now to FIGS. 51A-51B, a rail such as rail 5170 may consist of a lower panel 5171, one or more vertical panels 5172A and 5172B, and one or more flanges 5173A and 5173B. For the purpose of this disclosure, "up" or "upward" means skyward, "down" or "downward" means away from the sky (usually towards a support surface), "end" means toward either terminus of the rail, "side" means the outermost surface of either vertical panel 5172A or 5172B, "inward" means toward the lengthwise midline of lower panel 5171, and "outward" means the opposite direction, laterally, toward either flange 5173A or 5173B. Lower panel 5571 may be rectangular, with its longer edges meeting vertical panels 5172A and 5172B at a ninety degree angle, eighty degree angle, one hundred degree angle, or another angle between zero and one hundred eighty degrees. Lower panel 5171 may be 15.5 millimeters wide, 15 millimeters wide, 16 millimeters wide, or another width, (ii) 1000 millimeters long, 900 millimeters long, 1100 millimeters long, or another length, and (iii) 3 millimeters thick, 2 millimeters thick, 4 millimeters thick or another thickness. Vertical panels 5172A and 5172B may extend upward to meet flanges 5173A and 5173B respectively that extend outward from vertical panels 5172A and 5172B at a ninety degree angle, eighty degree angle, one hundred degree angle, or another angle between zero and one hundred eighty degrees. Vertical panels 5172A and 5172B may be (i) 30 millimeters high, 25 millimeters high, 35 millimeters high, or another height, (ii) 1000 millimeters long, 900 millimeters long, 1100 millimeters long, or another length, and (iii) 3 millimeters thick, 2 millimeters thick, 4 millimeters thick or another thickness, and may be of the same dimensions or different dimensions. Flanges 5173A and 5173B may be (i) 7.5 millimeters wide, 7 millimeters wide, 8 millimeters wide, or another width, (ii) 1000 millimeters long, 900 millimeters long, 1100 millimeters long, or another length, and (iii) 3 millimeters thick, 2 millimeters thick, 4 millimeters thick or another thickness, and may be of the same dimensions or different dimensions. Lower panel 5171, vertical panels 5172A and 5172B, and flanges 5173A and 5173B may be the same lengths or different lengths and the same thickness or different thicknesses. Rail 5170 may be aluminum, steel, or another alloy or metal, or plastic, composite, or another largely rigid material. Rail 5170 may be extruded, molded, stamped, forged, cast, formed, or made by any method known to one skilled in the art. Rail 5170 may serve as a lateral support structure for a PV array and may attach to pipes, tile hooks, or other structures as discussed in greater detail below. Flanges 5173A and 7173B may form a pivot-lock connection with the slot of a bracket, as discussed in greater detail below, and alternatively an embodiment of a rail may, without limitation, include a flange with a female portion for connection to a device or component with a male connector. A rail may be a rail member. Lower panel 5171 and vertical panels 5172A and 5172B from a channel that may hold, guide, and otherwise manage wires, cables, or similar components of a PV array.

Referring now to FIGS. 52A-52B, another embodiment of a rail is shown. A rail such as rail 5270 is similar to rail 5170 as shown and described in FIG. 51, and to other rails. The outward edges of flanges 5273A and 5273B of rail 5270 may terminate with a semicircular curve, a quarter-circular curve, another dimension of curve, an angle between zero degrees and ninety degrees, or a combination of curves and angles.

Referring now to FIGS. 53A-53B, another embodiment of a rail is shown. A rail such as rail 5370 is similar to rail 5170 as shown and described in FIG. 51, to rail 5270 as shown and described in FIG. 52, and to other rails. Rail 5370 may include a lower panel, a vertical panel 5372A, a vertical panel 5372B, and a flange 5373. Vertical panel 5372A may be 40 millimeters high, 35 millimeters high, 45 millimeters high, or another height; vertical panel 5372B may be 6 millimeters high, 5 millimeters high, 7 millimeters high, or another height. Flange 5373 may extend diagonally inward and upward from vertical panel 5372A at a forty-five degree angle, fifty degree angle, forty degree angle, or other angle between ninety and one hundred eighty degrees. Flange 5373 may extend 11 millimeters, 10 millimeters, 12 millimeters, or another distance.

Referring now to FIGS. 54A-545B, another embodiment of a rail is shown. A rail such as rail 5470 is similar to rail 5170 as shown and described in FIG. 51, to rail 5270 as shown and described in FIG. 52, rail 5370 as shown and described in FIG. 53, and to other rails. Rail 5470 may include a lower panel, a vertical panel 5472A, a vertical panel 5472B, and a flange 5473 with an angle 5476. Angle 5476 may extend the length of flange 5473 and may appear in the center of flange 5473 or at any point between the intersection of flange 5473 and vertical panel 5472A and the end of flange 5473. Angle 5476 may be ten degrees, fifteen degrees, twenty degrees, or another angle between zero and ninety degrees, and may extend upward or downward.

Referring now to FIG. 55, another embodiment of a rail is shown. A rail such as rail 5570 is similar to rail 5170 as shown and described in FIG. 51, to rail 5270 as shown and described in FIG. 52, rail 5370 as shown and described in FIG. 53, rail 5470 as shown an described in FIG. 54, and to other rails. Rail 5570 may include a lower panel 5571 with flanges 5573A and 5573B, vertical panels 5572A and 5572B that extend into diagonal panels 5574A and 5574B, and upper panel 5575 with flanges 5573C and 5573D. Lower panel 5571 may be rectangular, with sides extending upward into flanges 5573A and 5573B. Vertical panels 5572A and 5572B may extend upward from lower panel 5571, then extend inward forming diagonal panels 5574A and 5574B which terminate upon intersecting upper panel 5575. The outer edges of upper panel 5575 may extend downward as flanges 5573C and 5573D. Lower panel 5571 and upper panel 5575 may be (i) 85 millimeters wide, 80 millimeters wide, 90 millimeters wide, or another width, (ii) 1000 millimeters long, 900 millimeters long, 1100 millimeters long or another length, (iii) 3 millimeters thick, 2 millimeters thick, 4 millimeters thick, or another thickness, (iv) and may be the same dimensions or different dimensions. Flanges 5573A and 5573B and flanges 5573C and 5573D may extend from lower panel 5571 and upper panel 5575 respectively at a ninety degree angle, eighty degree angle, one hundred degree angle, or another angle between zero and one hundred eighty degrees. Flanges 5573A and 5573B and flanges 5573C and 5573D may extend 1 millimeter, 0.5 millimeters, 2 millimeters, or another distance, and may extend the same distance or different distances. Vertical panels 5572A and 5572B (i) may be 5 millimeters high, 4 millimeters high, 6 millimeters high, or another height, and may be the same height or different heights, and (ii) may extend from points equidistant from the lengthwise midline of lower panel 5571 or from points at varying distances from that midline. Diagonal panels 5574A and 5574B (i) may extend inward at a forty-five degree angle, forty degree angle, fifty degree angle, or other angle between zero and ninety degrees, and diagonal panels 5574A and 5574B may extend at identical angles or different angles, and (ii) may extend 55 millimeters, 50 millimeters, 60 millimeters, or another distance, and may extend the same distance or different distances.

Pipes (Vertical Supports)

Referring now to FIGS. 56A-56B, an embodiment of a pipe is shown. A pipe such as pipe 5661 may feature a cylinder 5662 and a hollow interior 5663. Other embodiments of a pipe may be solid cylinders, solid square lengths, hollow square lengths, solid octagonal lengths, hollow octagonal lengths, or other geometric lengths either solid or hollow and may include connectors or couplings at one or both ends. Pipe 5661 may have a diameter of 25 millimeters, 20 millimeters, 30 millimeters, or another distance. Pipe 5661 may be 1500 millimeters long, 1400 millimeters long, 1600 millimeters long, or another length. Pipe 5661 may be extruded, forged, cast, molded, stamped, formed, or otherwise made in any manner known to one of skill in the art. Pipe 5661 may be aluminum, steel, or another alloy or metal, or plastic, composite, or another largely rigid material. Pipe 5661 may serve as a vertical support structure for a PV array and may attach to rails or other structures as discussed in greater detail below. The thinness of pipe 5661 may permit multiple pipes to be driven into the ground or other installation surface at once, where a more standard vertical support in the field must often be installed one at a time. The thinness of pipe 5661 may allow for flexibility along its length, creating a tolerance for installation discrepancies. The thinness of pipe 5661 may also allow for installation by hand or with a hand-held tool rather than by large machine.

PV Module

Referring now to FIG. 57A-57B, a PV module such as PV module 5750 is shown in full and with an enlarged view of one corner. PV module 5750 is similar to PV module 100 as shown and described in FIG. 1A and others, to PV module 309 as shown and described in FIG. 20 and others, to PV module 355 as shown and described in FIG. 31 and others, to PV module 510 as shown and described in FIG. 42 and others, to PV modules 5050A, 5050B, 5050C, 5050D, 5050E, and 5050F as shown in FIG. 50A and others, and to other PV modules. Area A of FIG. 57A is shown in detail in FIG. 57A-1. PV Module 5750 may include a frame 5751 with a groove, such as groove 5752, on at least one (but usually two non-intersecting, or four) outer surface(s) 5753 that surround a PV laminate, such as laminate 5754 that may include any of various photovoltaic materials for converting solar radiation to electric current (not shown). PV modules with grooved frames are known in the art; some examples, types, and embodiments are shown, for example, and disclosed more fully at U.S. patent application Ser. No. 13/351,397, filed approximately Jan. 17, 2012, U.S. patent application Ser. No. 13/405,118, filed approximately Feb. 25 2012, U.S. patent application Ser. No. 13/407,607 filed approximately Feb. 29 2012, U.S. patent application Ser. No. 13/413,329 filed approximately Mar. 6, 2012, U.S. patent application Ser. No. 13/415,669 filed approximately Mar. 8, 2012, and U.S. patent application Ser. No. 13/434,426 filed approximately Mar. 29, 2012, each of which is entitled "METHOD AND APPARATUS FOR FORMING AND MOUNTING A PHOTOVOLTAIC ARRAY". Groove 5752 may further include an upper lip 5755, a lower lip 5756 with an upper surface 5757, an upper recess 5758 and a lower recess 5759. Grooves in modules and other devices with various embodiments are more fully disclosed and described in U.S. patent application Ser. No. 12/830,249 filed approximately Jul. 2, 2010 entitled "Pivot-Fit Frame, System, and Method for Photovoltaic Modules, U.S. patent application Ser. No. 13/316,453 filed approximately Dec. 9, 2011 entitled "Pivot-Fit Connection Apparatus and System for Photovoltaic Modules," and U.S. patent application Ser. No. 13/402,846, filed approximately Feb. 22 2012 entitled "Pivot-Frame System and Method for Photovoltaic Modules". PV modules with grooved frames may collect photovoltaic radiation for the purpose of converting it to electricity, and the frame thereof may facilitate the attachment of the PV module to a PV array, to installation hardware, to ancillary devices, or other components.

Bracket

Referring now to FIGS. 58A-62B, wherein like numerals refer to like structures, various embodiments of a bracket are shown. Referring now to FIGS. 58A-58C, a bracket such as bracket 5880 may include a tooth 5881 on an upper surface 5882 of an upper portion 5883, an off-set 5884 with an underside 5885 and a lower portion 5886 with one or more slots 5887. Tooth 5881 may extend upward from the upper surface 5882 of upper portion 5883. Upper surface 5882 may be flat, rounded, or consist of multiple surfaces meeting at one or more angles. Upper portion 5883 may extend downward to meet off-set 5884. Upper portion 5883 may be 11 millimeters high, 10 millimeters high, 12 millimeters high, or another height. Lower portion 5886 may extend downward from off-set 5884. Off-set 5884 may extend downward, angle upward, and angle downward once more. Off-set 5884 may (i) extend downward from upper portion 5883 5 millimeters, 4 millimeters, 6 millimeters, or another distance, (ii) angle upward at a seventy-five degree angle, eighty degree angle, seventy degree angle, or another angle between zero and one hundred eighty degrees for a distance of 3.3 millimeters, 3 millimeters, 4 millimeters, or another distance, (iii) and extend downward to lower portion 5886 3 millimeters, 2 millimeters, 4 millimeters, or another distance. Off-set 5884 may be 11 millimeters wide, 10 millimeters wide, 12 millimeters wide, or another width. The rear surface of off-set 5884 may be flush with the rear surfaces of upper portion 5883 and lower portion 5886, may be flush with just one or the other, or may not be flush with either. Lower portion 5886 may be 17 millimeters high, 16 millimeters high, 18 millimeters high, or another height. Lower portion 5886 may have square corners, rounded corners, or a combination thereof. Upper portion 5883 and lower portion 5886 (i) may be 14 millimeters wide, 12 millimeters wide, 16 millimeters wide, or another width, (ii) may be 2 millimeters thick, 1 millimeter thick, 3 millimeters thick, or another thickness, and (iii) may be equal widths or different widths and may be equal thickness or different thicknesses. Slot 5887 may appear as a notch or cut-out in the front or rear edge of lower portion 5886. Slot 5887 may appear in the vertical center of lower portion 5886 or may appear elsewhere along its height. Slot 5887 may be 3.5 millimeters deep, 3 millimeters deep, 4 millimeters deep, or another depth and may be 2 millimeters high, 1.5 millimeters high, 3 millimeters high or another height. Slot 5887 may be rectangular with square corners, rectangular with rounded corners, lozenge-shaped, or another geometry and may form a square corner at the edge of lower portion 5886 or may form a curve or an angle. Bracket 5880 may be cast, forged, or otherwise formed in a fashion known to one of skill in the art, and may be aluminum, steel, another metal or alloy, plastic, composite, or another largely rigid material with flex as known to one of skill in the art. Bracket 5880 may connect the groove of a frame of a PV module or other structure to a rail or other component by snapping into, press-fitting into, rotating into, or otherwise engaging a female groove feature, as discussed in greater detail below. Bracket 5880 may also leverage a slot, groove, ridge, hole, nipple, notch, or the like such as slot 5887 to engage and connect with an edge, lip, slot, hole, groove, depression, nipple, raised feature or similar component of a rail, beam, or member, as discussed in greater detail below. Slot 5887 of bracket 5880 is a female feature, but another embodiment of a bracket may include a male feature. Tooth 5881 may ground bracket 5880 to a PV module frame by cutting into the frame upon installation. Bracket 5880 may serve as a pre-loaded joint when connecting a PV module to a rail, as discussed in greater detail below.

Referring now to FIGS. 59A-59C, another embodiment of a bracket is shown. A bracket such as bracket 5980 is similar to bracket 5880 as shown and described in FIG. 58A and others, and to other brackets. Bracket 5980 may include two teeth 5981A and 5981B extending from the upper surface 5982 of an upper portion 5983 with an angle 5988. Bracket 5980 may further include an off-set 5984 with an underside 5985 as well as a lower portion 5986 with two slots 5987A and 5987B. Angle 5988 may extend laterally across upper portion 5983 and may be fifty two degrees, fifty degree, sixty degrees, or another angle.

Referring now to FIG. 60, another embodiment of a bracket is shown. A bracket such as bracket 6080 is similar to bracket 5880 as shown and described in FIG. 58A and others, to bracket 5980 as shown and described in FIG. 59A and others, and to other brackets. Bracket 6080 may include two teeth 6081A and 6081B extending from the upper surface 6082 of upper portion 6083. Bracket 6080 may further include an off-set 6084 with an underside 6085 as well as a lower portion 6086 with two slots 6087A and 6087B. Upper portion 6083 may meet off-set 6084 at a one hundred twenty-one degree angle, a one hundred twenty degree angle, a one hundred twenty-two degree angle, or another angle between ninety and one hundred eighty degrees.

Referring now to FIG. 61, another embodiment of a bracket is shown. A bracket such as bracket 6180 is similar to bracket 5880 as shown and described in FIG. 58A and others, to bracket 5980 as shown and described in FIG. 59A and others, bracket 6080 as shown and described in FIG. 60 and others, and to other brackets. Bracket 6180 may include an upper portion 6183, an off-set 6184 with an underside 6185, a lower portion 6186, and one or more slots 6187A and 6187B.

Referring now to FIG. 62, another embodiment of a bracket is shown. A bracket such as bracket 6280 is similar to bracket 5880 as shown and described in FIG. 58A and others, to bracket 5980 as shown and described in FIG. 59A and others, bracket 6080 as shown and described in FIG. 60 and others, bracket 6180 as shown and described in FIG. 61 and others, and to other brackets. Bracket 6280 may include an upper notch 6265 and a ridge 6289 on the upper surface 6282 of an upper portion 6283. Bracket 6280 may further include an off-set 6284 with an underside 6285 and a lower notch 6264. Bracket 6280 may also include a lower portion 6286 with one or more slots 6287A and 6287B. Ridge 6289 may extend upward from upper surface 6282 2.2 millimeters, 2 millimeters, 3 millimeters, or another distance, and may extend the width of upper portion 6283 or a greater or lesser width. Upper notch 6265 may appear as a groove in the upper surface 6282 at the front-most intersection of ridge 6289 and upper portion 6283. Upper portion 6283, off-set 6284, and lower portion 6286 may be 25 millimeters wide, 20 millimeters wide, 30 millimeters wide, or another width, and maybe the same widths or different widths. Upper portion 6283 may be a horizontal panel and may be 11 millimeters deep, 10 millimeters deep, 12 millimeters deep, or another depth. The rear-most end of upper portion 6283 may meet the top edge of off-set 6284 at a ninety degree angle, eighty degree angle, one hundred degree angle, or another angle. Upper portion 6283 and off-set 6284 may be 2.8 millimeters thick, 2 millimeters thick, 3 millimeters thick, or another thickness, and may be the same thickness, different thicknesses, or varying thicknesses. Off-set 6284 (i) may extend downward from upper portion 6283 7.2 millimeters, 7 millimeters, 8 millimeters, or another distance, (ii) may then extend downward and forward at a one hundred fifty degree angle, one hundred forty degree angle, one hundred fifty-five degree angle, or another angle between ninety and one hundred eighty degrees for a distance of 5 millimeters, 6 millimeters, 4 millimeters, or another distance, and (iii) may then extend forward horizontally for 6 millimeters, 5 millimeters, 7 millimeters, or another distance. Off-set 6284 may meet lower portion 6286 at a ninety degree angle, eighty degree angle, one hundred degree angle, or another angle between zero and one hundred eighty degrees. Lower notch 6264 may appear as a groove extending the width of underside 6285 of off-set 6284 at the intersection of off-set 6284 and lower portion 6286. Lower portion 6286 may be 5.5 millimeters thick, 3.175 millimeters thick, 6 millimeters thick, or another thickness or varied thicknesses. Without limitation, the thickness of lower portion 6286 may vary from embodiment to embodiment depending upon the material from which bracket 6280 is formed, where more resilient materials may require less thickness and less resilient materials may require more thickness.

Lever Clip

Referring now to FIGS. 63A-68, wherein like numerals indicate like structures, embodiments of lever clips are shown. Referring now to FIGS. 63A-63C, various embodiments of a lever clip, lever clamp, spring clip, spring clamp, connector, or hold-down clamp, such as lever clip 6390, lever clip 6490, lever clip 6590, lever clip 6690, lever clip 6790, and lever clip 6890, are shown. Lever clip 6390 may include a head portion for connecting, attaching, mounting, or fixing a PV module to a support or rail, such as head 6346, a lever portion or arm 6391 extending away from head 6346, and a retaining portion or catch 6347. Head 6346 may comprise a portion for engaging a support or rail, such as hook 6392 with a notch 6398, and flanges, fulcrums, or pivots. For the purpose of this disclosure, "front" or "forward" shall mean toward hook 6392, "back" or "rear" shall mean toward catch 6393B, "up" or "upward" shall me toward the sky, and "down" or "downward" shall mean away from the sky. Arm 6931 may extend 113 millimeters, 110 millimeters, 115 millimeters, or another length. Catch 6393B may extend upward from the rear-most point of arm 6931, or another point along arm 6931, and then bend to either side and downward at an angle of seventy degrees, seventy-five degrees, sixty-five degrees, or another angle. Pivot 6393A may extend upward from the front-most point of arm 6391, or another point along arm 6391 provided that it is in front of catch 6393B, and then bend to either side and downward at an angle of eighty degrees, eighty-five degrees, seventy-five degrees, or another angle. Hook 6392 may extend downward and backward from arm 6391 forming notch 6398. Arm 6391, hook 6392, and pivot 6393A and catch 6393B may be 2.28 millimeters thick, 2 millimeters thick, 3 millimeters thick, or another thickness or varying thicknesses, and may be the same thickness or different thicknesses. Lever clip 6390 may be formed of aluminum, steel, another metal or alloy, plastic, composite, or another flexible, semi-rigid material as known to one of skill in the art. Lever clip 6390 may connect the grooved frame of a PV module to a rail or other ancillary device, as discussed in additional detail below. Lever clip 6390 rotates upward to connect a device such as a PV module to an ancillary component such as a rail, as described more fully below, but without limitation other embodiments of a lever clip may rotate downward to so connect. A lever clip may be deformable, partially deformable, or non-deformable. A deformable lever clip may create preload when connecting components such as components of a PV array, described in greater detail below, when force is applied to the lever clip during installation causing a portion or portions of the lever clip to deform. For example and without limitation, the arm of a lever clip may deform when force is applied to it. A non-deformable lever clip may create preload upon connection by deforming one or more of the components to which it connects. For example and without limitation, a lever clip may temporarily or permanently deform a groove of a frame of a PV module upon connecting or during a connecting procedure.

Referring now to FIGS. 64A-64C, another embodiment of a lever clip is shown. A lever clip such as lever clip 6490 is similar to lever clip 6390 as shown and described in FIG. 63A and others, and to other lever clips. Lever clip 6490 may include arm 6491, flange 6403, notch 6498, front panel 6494, side panels 6495 each with one or more teeth 6497A and 6497B, lower panel 6496, and hooks 6492A and 6492B with teeth 6497C and 6497D. Arm 6491 may extend 133 millimeters, 130 millimeters, 140 millimeters, or another distance and may be flat or arced. Notch 9498 may appear as a cut-out slot in either side of arm 6491 immediately to the fore of flange 6493 to permit flange 6493 to extend downward without exceeding the width of arm 6491. Flange 6493 (i) may extend downward from either side of the rear terminus of arm 6491 a distance of 15 millimeters, 10 millimeters, 20 millimeters, or another distance and (ii) may then angle upward and outward a distance of 7.26 millimeters, 7 millimeters, 8 millimeters, or another distance at a seventy-six degree angle, a seventy degree angle, an eighty degree angle, or another angle. Front panel 6494 may extend downward from arm 6491 at a one hundred thirty-five degree angle, one hundred forty degree angle, one hundred thirty degree angle, or other angle between zero and one hundred eighty degrees for a distance of 42 millimeters, 40 millimeters, 50 millimeters, or another distance. Pivots 6495A and 9495B may extend from either side of front panel 6494 at any position along the height of front panel 6494 and at the same height or at different heights. Pivots 6495A and 9495B may be 10.88 millimeters wide, 10 millimeters wide, 12 millimeters wide, or another width, and may be the same width or different widths. Teeth 6497A and 6497B may extend downward from pivots 6495A and 9495B respectively. Lower panel 6496 may extend downward from front panel 6494 at a one hundred fifty degree angle, one hundred forty degree angle, one hundred sixty degree angle, or another angle between zero and one hundred eighty and may extend for a distance of 11.81 millimeters, 11 millimeters, 12 millimeters, or another distance. Hooks 6492A and 6492B may extend forward from either side of lower panel 6496 a distance of 8.30 millimeters, 8 millimeters, 9 millimeters, or another length, and teeth 6497C and 6497D may extend upward from hooks 6492A and 6492B respectively. Arm 6491, front panel 6494, and lower panel 6496 may be 12.70 millimeters wide, 12 millimeter wide, 13 millimeters wide, another width, or varying widths and may be the same width or different widths.

Referring now to FIG. 65, another embodiment of a lever clip is shown. A lever clip such as lever clip 6590 is similar to lever clip 6390 as shown and described in FIG. 63A and others, lever clip 6490 as shown and described in FIG. 64A and others, and to other lever clips. Lever clip 6590 may include an arm 6591, catch 6593A and pivot 6593B, teeth 6597A and 6597B, notch 6598, and head 9599 with ascending surface 6566 and descending surface 6567. Arm 6592 may extend upward from head 6599 to flange 6593 at a 24.8 degree angle, a 20 degree angle, a 25 degree angle, or another angle between zero and ninety degrees. Flange 6593 may extend outward in either direction and backward from the rear terminus of arm 6591 at a one hundred ten degree angle, a one hundred degree angle, a one hundred twenty degree angle, or another angle. Tooth 6597A may extend upward from the rear terminus of flange 6593. Ascending surface 6566 may extend upward at a 17.2 degree angle, a 17 degree angle, a 19 degree angle, or another angle between zero and ninety degrees for a distance of 25.92 millimeters, 25 millimeters, 30 millimeters, or another distance. Descending surface 6567 may extend downward from the front-most terminus of ascending surface 6566 at a fourteen degree angle, fifteen degree angle, thirteen degree angle, or another angle between zero and ninety degrees for a distance of sixteen millimeters, fifteen millimeters, seventeen millimeters, or another distance before extending downward as the front edge of head 6599. Notch 6598 may appear as a cut-out in the front of head 6599 that may appear as a horizontal slot or an angled cut with tooth 6597B rising upward from the bottom of notch 6598. Pivot 6593B may extend from descending surface 6567 and either side and downward at a seventy degree angle, eighty degree angle, sixty degree angle, or another angle between zero and ninety degrees.

Referring now to FIG. 66, another embodiment of a lever clip is shown. A lever clip such as lever clip 6690 is similar to lever clip 6390 as shown and described in FIG. 63A and others, lever clip 6490 as shown and described in FIG. 64A and others, lever clip 6590 as shown and described in FIG. 65 and others, and to other lever clips. Lever clip 6690 may include arm 6691, vertical arm 6668, catches 6693A and 6693B, notch 6698, front panel 6694, pivots 6695A and 6695B, and hook 6692 with tooth 6698. Vertical arm 6668 may be a vertical panel and the bottom surface may meet the side surface of arm 6691 at a ninety degree angle, eighty degree angle, one hundred degree angle, or other angle. Catch 6693A may extend upward and backward from the rear terminus of arm 6691 at a one hundred five degree angle, one hundred degree angle, ninety degree angle, or another angle between ninety and one hundred eighty degrees. Catch 6693B may extend upward from a side edge at the rear terminus of arm 6691 at a ninety degree angle, eighty degree angle, seventy degree angle, or another angle between zero and ninety degrees. Notch 6698 may appear as a cut-out in arm 6691 immediately behind the point where vertical arm 6668 meets arm 6691. The front edge of vertical arm 6668 may meet the side edge of front panel 6694 at a ninety degree angle, eighty degree angle, one hundred degree angle, or another angle between zero and one hundred eighty degrees. Pivots 6695A and 6695B may extend from either side of front panel 6694 at any point other than the point of connection to vertical panel 6668. Hook 6692 may extend forward from the side of front panel 6694 and extend upward to form tooth 6697. The inclusion of both arm 6691 and vertical arm 6668 may provide lever clip 6690 additional flexibility, as arm 6691 may grant vertical flexibility and vertical arm 6668 may grant horizontal flexibility.

Figure 67:
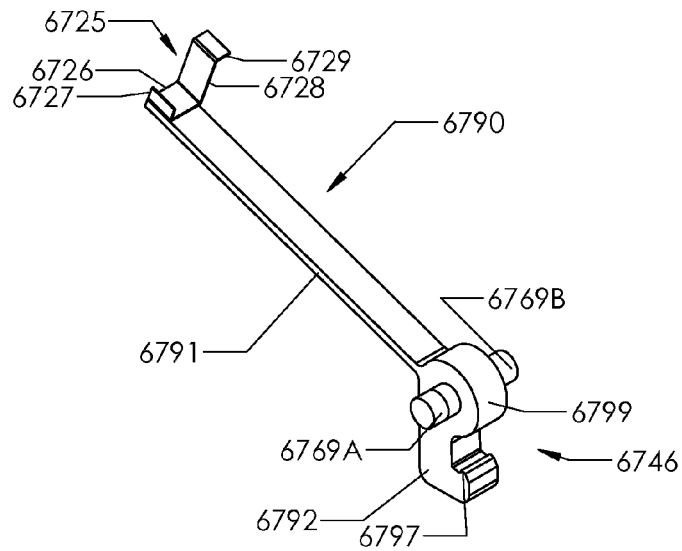
FIG. 67 is a perspective view of a lever clip.

Referring now to FIG. 67, another embodiment of a lever clip is shown. A lever clip such as lever clip 6790 is similar to lever clip 6390 as shown and described in FIG. 63A and others, lever clip 6490 as shown and described in FIG. 64A and others, lever clip 6590 as shown and described in FIG. 65 and others, lever clip 6690 as shown and described in FIG. 66 and others, and to other lever clips. Lever clip 6790 may include an arm 6791, a bracket 6725, a head 6799, one or more pivots 6769A and 6769B, and a hook 6792 with a tooth 6797. Head 6799 may be cylindrical with a radius of 12.5 millimeters, 12 millimeters, 13 millimeters, or another radius, may be another rounded geometry or a polygonal geometry. Pivots 6769A and 6769B may be cylindrical with a radius of 5 millimeters, 4 millimeters, 6 millimeters, or another radius, may be another rounded geometry or a polygonal geometry. Hook 6792 may extend downward from head 6799 and curve upward to form tooth 6797. Arm 6791 may extend backward from head 6799. Bracket 6725 may comprise a separate component soldered, adhered, clipped or otherwise attached in a fashion known to one skilled in the art to the top surface of arm 6791 nearest the rear terminus of arm 6791. As a separate component, bracket 6725 may have a spring rate that is greater than, less than, or equal to the spring rate of the remainder of lever clip 6790. Bracket 6725 may consist of a lower horizontal panel 6726 adhered to arm 6791 with a short vertical panel 6727 and a tall vertical panel 6728 arising from either side edge of the lower horizontal panel 6726 and an upper horizontal panel 6729 extending outward from tall vertical panel 6728 at a ninety degree angle, eighty degree angle, one hundred degree angle, or another angle between zero and one hundred eighty degrees.

Figure 68:
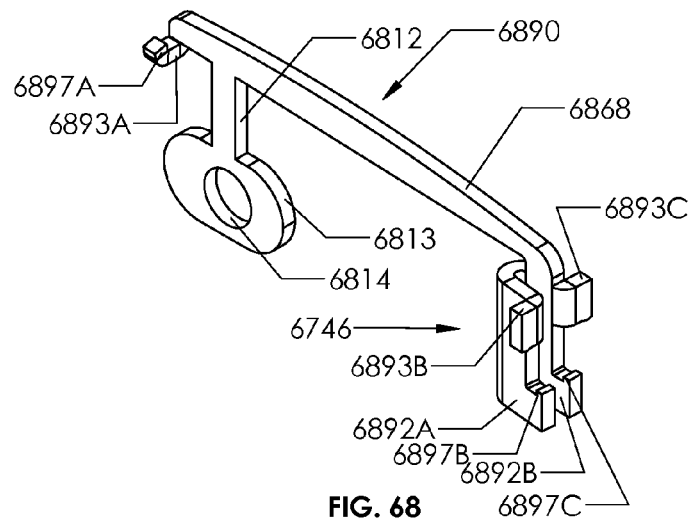
FIG. 68 is a perspective view of a lever clip.

Referring now to FIG. 68, another embodiment of a lever clip is shown. A lever clip such as lever clip 6890 is similar to lever clip 6390 as shown and described in FIG. 63A and others, lever clip 6490 as shown and described in FIG. 64A and others, lever clip 6590 as shown and described in FIG. 65 and others, lever clip 6690 as shown and described in FIG. 66 and others, lever clip 6790 as shown and described in FIG. 67 and others, and to other lever clips. Lever clip 6890 may include a vertical arm 6868, a handle 6812 with a finger grip 6813 having an aperture 6814, catch 6893A, pivots 6893B-6893C, hooks 6892A and 6892B, and teeth 6897A-6897C. Handle 6812 extends downward from vertical arm 6868 and meets finger grip 6813. Finger grip 6813 may be round, lozenge shaped, square, rectangular, or another shape and may include aperture 6814 which may be round, lozenge-shaped, square, rectangular, or another shape and, if round, may have a diameter of 19.74 millimeters, 20 millimeters, 19 millimeters, or another distance. Handle 6812 and finger grip 6813 may facilitate the installation of lever clip 6890 in a circumstance where the installation occurs overhead by providing purchase and reach to an installer situated beneath lever clip 6890.

Support Structure

Figure 69A:
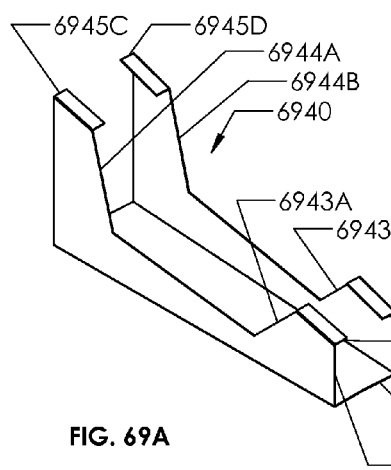
FIG. 69A is a perspective view of a support structure.
Figure 69B:
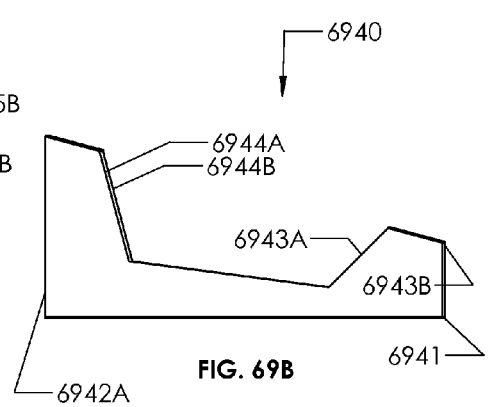
FIG. 69B is a side view of a support structure.
Figure 69C:
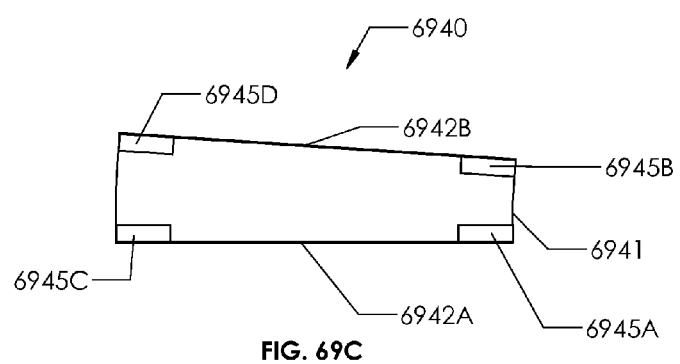
FIG. 69C is a top view of a support structure.

Referring now to FIGS. 69A-69C, an embodiment of a support structure is shown from various angles. Support structure 6940 may include base panel 6941, one or more vertical panels 6942A and 6942B including a low rise 6943A and 6943B and a high rise 6944A and 6944B each with a connector flange 6945A-6945D. For the purpose of this disclosure, the "x dimension" shall mean the direction running the length of support structure 6940, the "y dimension" shall mean the direction running the height thereof, and the "z dimension" shall mean the direction running the width thereof. Base panel 6941 may be trapezoidal, rectangular, square, or another shape. Vertical panels 6942A and 6942B may extend upward from either side of base panel 6941 at a ninety degree angle, eighty degree angle, one hundred degree angle, or another angle. Vertical panels 6942A and 6942B may be 1062 millimeters long, 1000 millimeters long, 1100 millimeters long, or another length and may be the same lengths or different lengths. High rise 6944A and 6944B may be 484 millimeters high, 400 millimeters high, 500 millimeters high, or another height at their peaks, and may be the same height or different heights. Low rise 6943A and 6943B may be 237 millimeters high, 200 millimeters high, 250 millimeters high, or another height at their peaks, and may be the same height or different heights. Each high rise 6944A and 6944B and low rise 6943A and 6943B may fold inward and downward or outward and downward to create connector flanges 6945A-6945D that are perpendicular to their respective rises in the z direction but extend downward and forward in the x direction at a fifteen degree angle, ten degree angle, twenty degree angle, or another angle between zero and ninety degrees. Connector flanges 6945A-6945D may be 150 millimeters long, 100 millimeters long, 200 millimeters long, or another length and 44 millimeters wide, 40 millimeters wide, 50 millimeters wide, or another width. Support structure 6940 may be formed of aluminum, steel, another metal or alloy, plastic, composite, or another rigid or semi-rigid material known to one of skill in the art. Support structure 6940 may be stamped, molded, cast, or otherwise formed by a method known to one of skill in the art. Support structure 6940 may connect to rails and PV modules to form a photovoltaic array, as discussed in greater detail below. Flanges 6945A-6945D of support structure 6940 may connect to rails by means of clips, threaded bolts that connect through an aperture in flanges 6945A-6945D (not shown), or by means of another connector as known to one skilled in the art.

Referring now to FIGS. 70A-77, where like numerals correspond to like components, various embodiments of a rail-mounted PV array, and the components thereof, are shown. Referring now to FIGS. 70A-70E, a bracket is shown installed in the frame of a PV module. A bracket such as bracket 7080 is similar to bracket 5880 as shown and described in FIG. 58A and others, to bracket 5980 as shown and described in FIG. 59A and others, bracket 6080 as shown and described in FIG. 60 and others, bracket 6180 as shown and described in FIG. 61 and others, bracket 6280 as shown and described in FIG. 62 and others, and to other brackets. A PV module such as PV module 7050 is similar to PV module 100 as shown and described in FIG. 1A and others, to PV module 309 as shown and described in FIG. 20 and others, to PV module 355 as shown and described in FIG. 31 and others, to PV module 510 as shown and described in FIG. 42 and others, to PV modules 5050A, 5050B, 5050C, 5050D, 5050E, and 5050F as shown in FIG. 50A and others, to PV module 5750 as shown and described in FIG. 57, and to other PV modules. With PV module 7050 oriented such that laminate 7054 faces skyward, bracket 7080 may be oriented such that slot 7087 faces upward. Upper portion 7083 may then be placed in groove 7052 as shown and described in FIGS. 70A, 70A-1, and 70B where FIG. 70A-1 is a detailed view of area A of FIG. 70A. Bracket 7080 may then be rotated roughly ninety degrees counterclockwise, which may align underside 7085 such that it may be roughly flush with upper surface 7057 of lower lip 7056 and may press tooth 7081 into upper recess 7058, which may securely engage bracket 7080 into groove 7052 as shown and described in FIGS. 70C-70E where FIG. 70C-1 is a detail view of Area B of FIG. 70C.

Figure 73A:
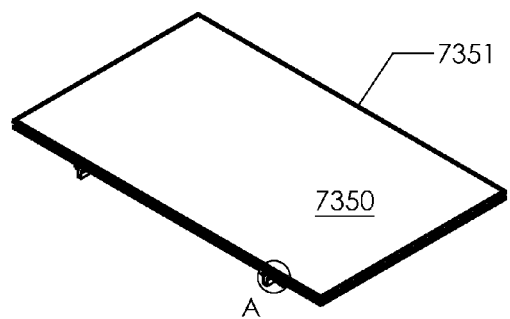
FIG. 73A is a perspective view of a lever clip attaching a PV module to a rail.
Figures 1, 73A:
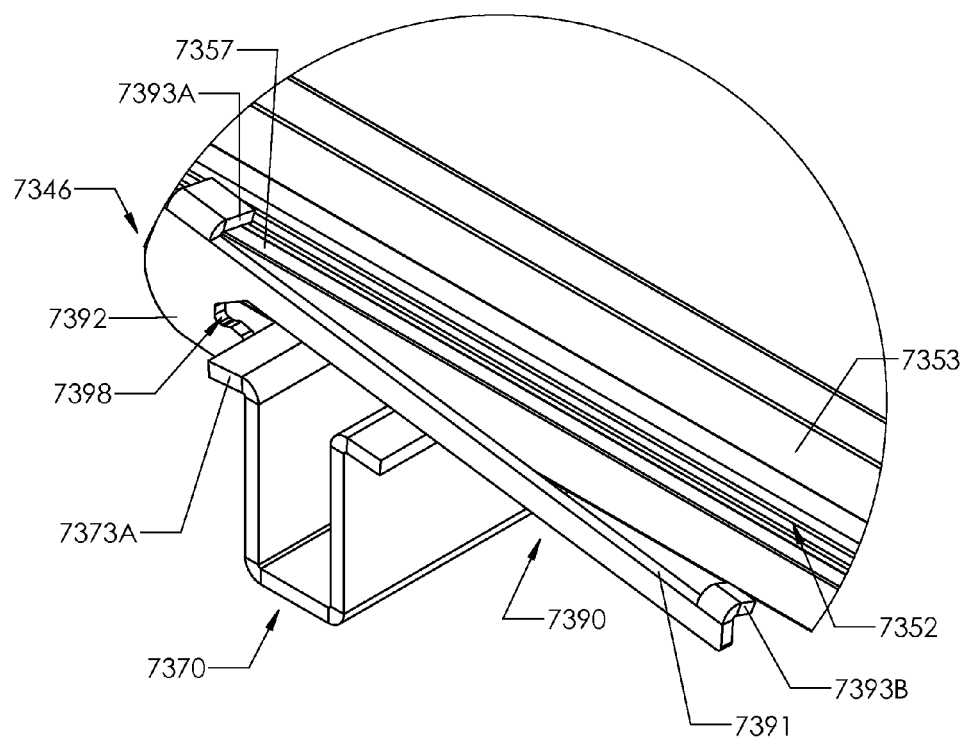

Referring now to FIGS. 71A-71C-1, another embodiment of a bracket is shown installed in the groove of the frame of a PV module. A bracket such as bracket 7180 is similar to bracket 5880 as shown and described in FIG. 58A and others, to bracket 5980 as shown and described in FIG. 59A and others, bracket 6080 as shown and described in FIG. 60 and others, bracket 6180 as shown and described in FIG. 61 and others, bracket 6280 as shown and described in FIG. 62 and others, to bracket 7080 as shown and described in FIG. 70A and others, and to other brackets. A PV module such as PV module 7150 is similar to PV module 100 as shown and described in FIG. 1A and others, to PV module 309 as shown and described in FIG. 20 and others, to PV module 355 as shown and described in FIG. 31 and others, to PV module 510 as shown and described in FIG. 42 and others, to PV modules 5050A, 5050B, 5050C, 5050D, 5050E, and 5050F as shown in FIG. 50A and others, to PV module 5750 as shown and described in FIG. 57, PV module 7050 as shown an described in FIG. 70A and others, and to other PV modules. Bracket 7180 may engage frame 7151 of PV module 7150 as follows. Teeth 7181A and 7181B of upper portion 7183 may be tilted into upper recess 7157 as shown and described in FIG. 71A. Bracket 7180 may then be angled downward such that off-set 7184 enters groove 7152 and "snaps" into place such that underside 7185 is approximately parallel to and in contact with upper surface 7157 and lower portion 7186 is roughly parallel to and in contact with outer surface 7153, as shown and described in FIGS. 71B, 71C, and 71C-1, where FIG. 71C-1 is a detail view of Area C of FIG. 71C. In other embodiments bracket 7180 may be fastened to PV module 7150 with a fastener or glued with an adhesive. In still other embodiments bracket 7180 may be connected around a frame or around a frameless PV laminate as opposed to connecting in a frame groove.

Referring now to FIGS. 72A-72C-1, a PV module is shown connecting to a rail using a bracket. A bracket such as bracket 7280 is similar to bracket 5880 as shown and described in FIG. 58A and others, to bracket 5980 as shown and described in FIG. 59A and others, bracket 6080 as shown and described in FIG. 60 and others, bracket 6180 as shown and described in FIG. 61 and others, bracket 6280 as shown and described in FIG. 62 and others, to bracket 7080 as shown and described in FIG. 70A and others, bracket 7180 as shown and described in FIG. 71A and other, and to other brackets. A PV module such as PV module 7250 is similar to PV module 100 as shown and described in FIG. 1A and others, to PV module 309 as shown and described in FIG. 20 and others, to PV module 355 as shown and described in FIG. 31 and others, to PV module 510 as shown and described in FIG. 42 and others, to PV modules 5050A, 5050B, 5050C, 5050D, 5050E, and 5050F as shown in FIG. 50A and others, to PV module 5750 as shown and described in FIG. 57, PV module 7050 as shown an described in FIG. 70A and others, PV module 7150 as shown and described in FIG. 71A and others, and to other PV modules. A rail such as rail 7270 is similar to rail 5170 as shown and described in FIG. 51, to rail 5270 as shown and described in FIG. 52, rail 5370 as shown and described in FIG. 53, rail 5470 as shown an described in FIG. 54, rail 5570 as shown and described in FIG. 55 and others, and to other rails. PV module 7250 may connect to one or more brackets 7280 as described above. PV module 7250 may be placed on top of rail 7270 at an angle that is roughly parallel to the angle of flange 7273A as shown in FIGS. 72A and 72A-1, where FIG. 72A-1 is a detail view of area A of FIG. 72A. PV module 7250 may then be moved laterally such that flange 7273A enters slot 7287B as shown and described in FIGS. 72B and 72b-1, where FIG. 72B-1 is a detail view of area B of FIG. 72B. PV module 7250 may then be rotated down until it rests on rail 7270 as shown and described in FIGS. 72C and 72C-1, where FIG. 72C-1 is a detail view of area C of FIG. 72C. Slot 7287B may bend flange 7273A when PV module 7250 is pivoted down, creating a pre-loaded joint to secure PV module 7250 to rail 7270. One of skill in the art will recognize that the method of connecting PV module 7250 to rail 7270 as shown in FIGS. 72A-72C may not require separate tools or physically touching bracket 7280 during the process of moving the PV module 7250 into a state of secured engagement with rail 7270. More explicitly stated, one or more embodiments permit a lever clip to be connectable to a rail member without a separate tool. Once bracket 7280 has been connected to PV module 7250, as described above and as could be performed for example before even moving PV module near to its final installed location, the process of connecting PV module 7250 to rail 7270 may be as simple as moving the module into position as shown in FIG. 72A, sliding it over as shown in FIG. 72B, then rotating it downward as shown in FIG. 72C. Such an installation process may significantly reduce the labor required to install a PV array by eliminating certain tools and/or steps as required in prior art systems.

Figure 73B:
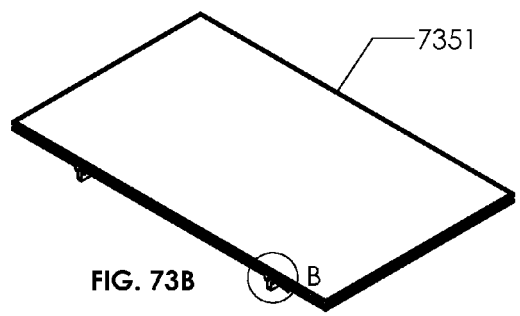
FIG. 73B is a perspective view of a lever clip attaching a PV module to a rail.
Figures 1, 73B:
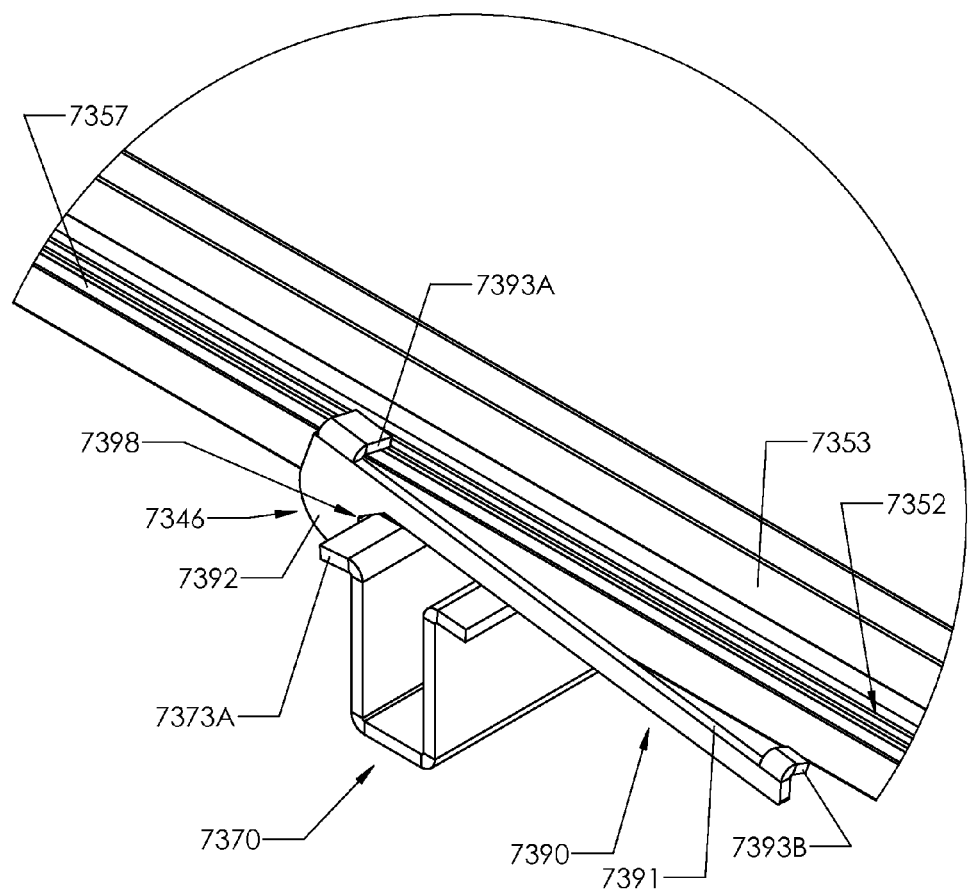
Figure 73C:
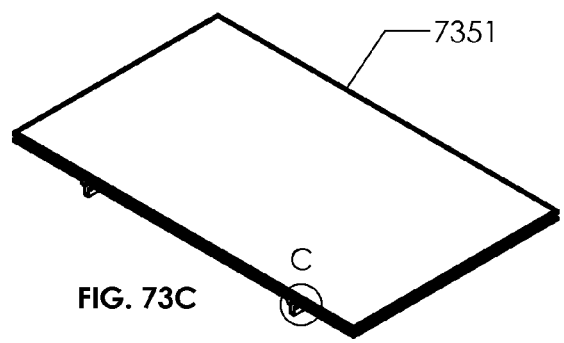
FIG. 73C is a perspective view of a lever clip attaching a PV module to a rail.
Figures 1, 73C:
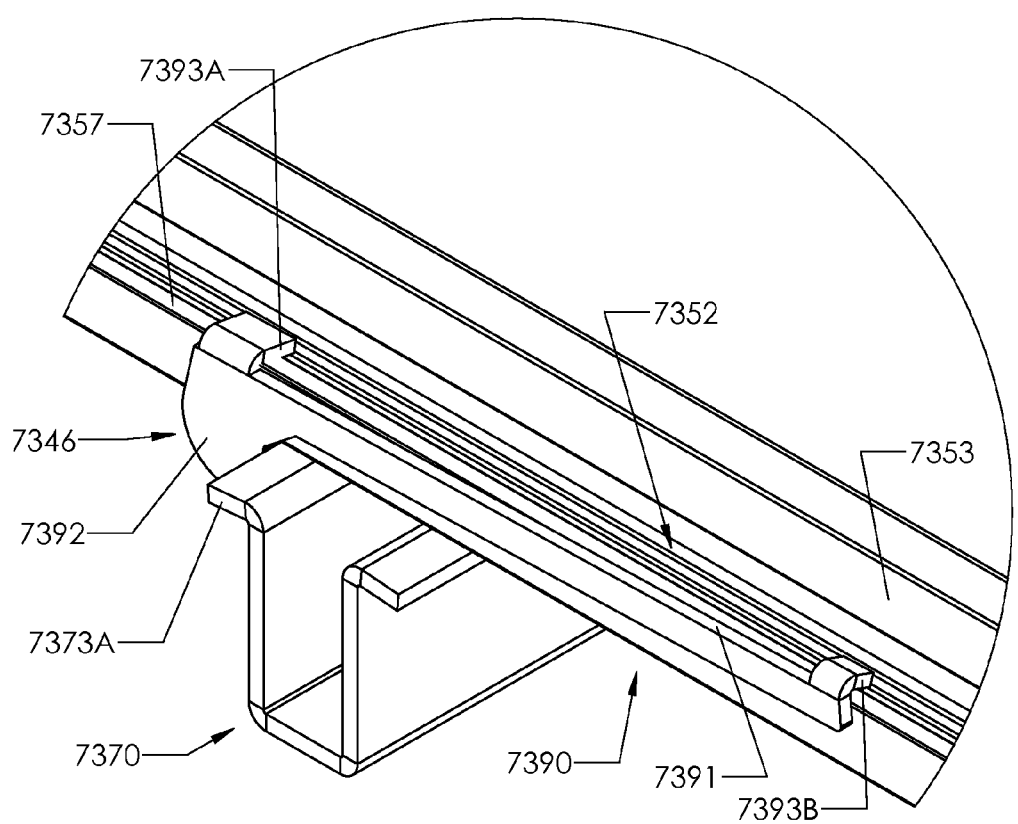

Referring now to FIGS. 73A-73C, an embodiment of a PV module is shown connecting to a rail using a lever clip. A PV module such as PV module 7350 is similar to PV module 100 as shown and described in FIG. 1A and others, to PV module 309 as shown and described in FIG. 20 and others, to PV module 355 as shown and described in FIG. 31 and others, to PV module 510 as shown and described in FIG. 42 and others, to PV modules 5050A, 5050B, 5050C, 5050D, 5050E, and 5050F as shown in FIG. 50A and others, to PV module 5750 as shown and described in FIG. 57, PV module 7050 as shown an described in FIG. 70A and others, PV module 7150 as shown and described in FIG. 71A and others, PV module 7250 as shown and described in FIG. 72A and others, and to other PV modules. A rail such as rail 7370 is similar to rail 5170 as shown and described in FIG. 51, to rail 5270 as shown and described in FIG. 52, rail 5370 as shown and described in FIG. 53, rail 5470 as shown an described in FIG. 54, rail 5570 as shown and described in FIG. 55 and others, rail 7170 as shown and described in FIG. 71A and others, rail 7270 as shown and described in FIG. 72A and others, and to other rails. Lever clip 7390 is similar to lever clip 6390 as shown and described in FIG. 63A and others, lever clip 6490 as shown and described in FIG. 64A and others, lever clip 6590 as shown and described in FIG. 65 and others, lever clip 6690 as shown and described in FIG. 66 and others, lever clip 6790 as shown and described in FIG. 67 and others, lever clip 6890 as shown and described in FIG. 68, and to other lever clips. PV module 7350 may be placed on rail 7370 such that rail 7370 extends some distance beyond the outer surface 7353 of frame 7351. Lever clip 7390 may then be placed such that (i) pivot 7393A overlaps over upper surface 7357, (ii) arm 7391 extends across the top of rail 7370 and down such that catch 7393B is lower than upper surface 7357, and (iii) flange 7373A extends toward notch 7398, as shown in FIGS. 73A and 73A-1, where FIG. 73A-1 is a detail view of area A of FIG. 73A. Lever clip 7390 may then be moved laterally toward rail 7370 such that flange 7373A enters notch 7398 as shown in FIG. 73B. The end of arm 7391 comprising catch 7393B may then be lifted and rotated about pivot 7393A. Initial rotation may further seat flange 7373A in notch 7398, while continued rotation may flex arm 7391 and/or flange 7373A such that catch 7393B rises above upper surface 7357. Subsequent force applied toward PV module 7350 may engage catch 7393B with upper surface 7357 of PV module 7350 thereby securing PV module 7350 to rail 7370 as shown in FIG. 73C. Arm 7391 may spring back toward its un-flexed position to keep catch 7393B engaged with groove 7352. In some embodiments head 7346 cuts into frame 7351 and rail 7370 to create a continuous electrical grounding path between frame 7351 and rail 7370. One of skill in the art will recognize that arm 7391 acts as a lever to provide mechanical advantage that reduces the amount of force required to rotate head 7346, pivoting it about pivot 7393A such that notch exerts an upward force on, and is engaged with, rail flange 7373A and pivot 7393A exerts a downward force on, and is engaged with, upper surface 7357 of PV module 7350, thereby securely connecting PV module 7350 to a rail or support structure. Thus, lever clip 7390, unlike prior art systems, may be installed without the use of a separate tool or other fasteners significantly reducing labor costs associated with the installation of PV module 7350. One of skill in the art will further recognize that the installation process described above may result in lever clip 7390 effectively applying a preload to the joint between PV module 7350 and rail 7370 that must be overcome by forces, such as those resulting from wind or snow, in order to loosen the connection; and that this preload may be relatively high (considering a separate tool is not used) since arm 7391 provide mechanical advantage as described above. It is of note that arm 7391 may act as (i) a lever to provide mechanical advantage that enables higher preload without separate tools, (ii) a spring that flexes to enable catch 7393B to be latched onto PV module 7350, and (iii) a spring that provides a spring force to keep catch engaged once installed. In some embodiments arm 7391 is substantially rigid and therefore does not flex when installed as described above. In such embodiments frame 7391, rail 7370, or other components in the system may flex or partially deform to allow catch to be positioned and held in place. In some embodiments lever clip 7390 may be manufactured as a high volume (and relatively low cost) stamped sheet metal part. In other embodiments lever clip 7390 may be cast, molded, stamped, extruded, or formed or otherwise made by any method as known to one skilled in the art. Without limitation, similar connecting steps could be used with (i) a PV module frame with several non-continuous grooves, slots, or holes instead of a continuous groove, (ii) a PV module frame that lacks grooves as discussed in greater detail below, and (iii) a frameless module as discussed in greater detail below.

Figure 74A:
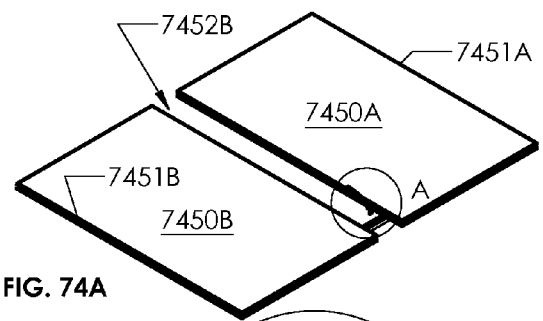
FIG. 74A is a perspective view of two PV modules being connected to a rail by a lever clamp.
Figure 74B:
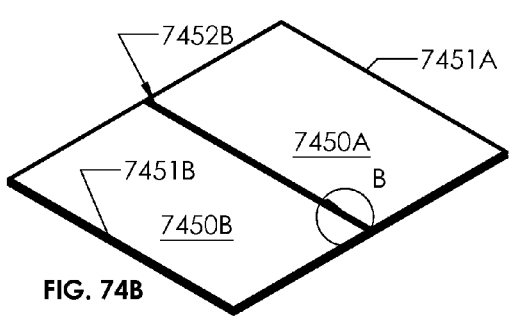
FIG. 74B is a perspective view of two PV modules being connected to a rail by a lever clamp.
Figures 1, 74A:
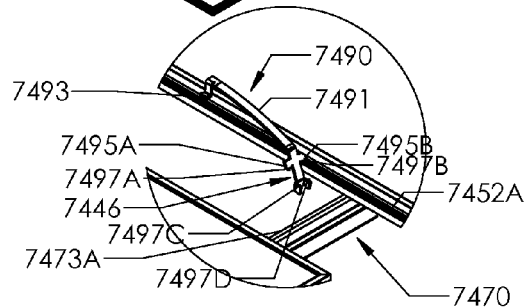
Figures 1, 74B:
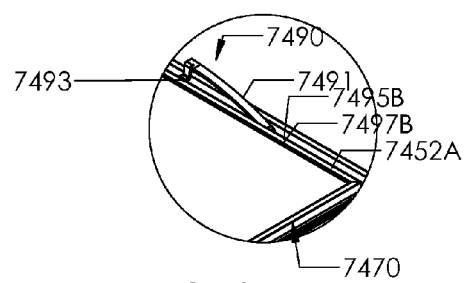
Figure 74C:
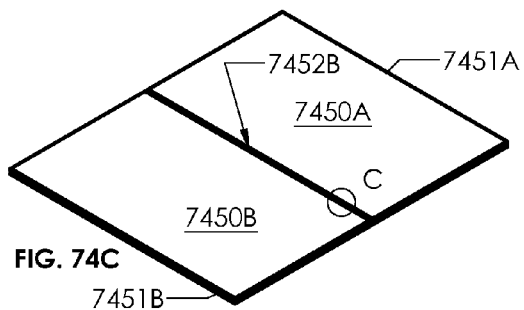
FIG. 74C is a perspective view of two PV modules being connected to a rail by a lever clamp.
Figures 1, 74C:
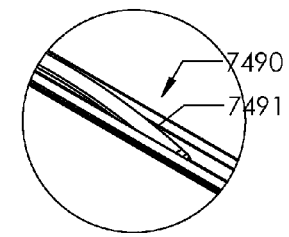
Figure 74D:
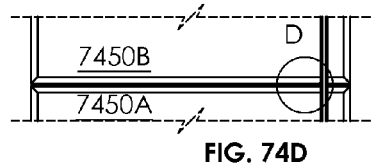
FIG. 74D is a bottom view of two PV modules being connected to a rail by a lever clamp.
Figures 1, 74D:
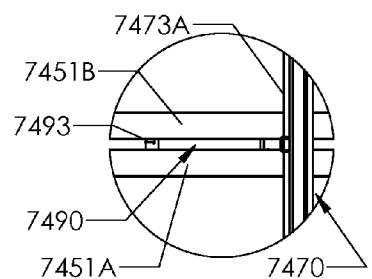

Referring now to FIGS. 74A-74C-1, another embodiment of a lever clip is shown connecting two adjacent PV modules to one another and to a rail. PV modules such as PV modules 7450A and 7450B are similar to PV module 100 as shown and described in FIG. 1A and others, to PV module 309 as shown and described in FIG. 20 and others, to PV module 355 as shown and described in FIG. 31 and others, to PV module 510 as shown and described in FIG. 42 and others, to PV modules 5050A, 5050B, 5050C, 5050D, 5050E, and 5050F as shown in FIG. 50A and others, to PV module 5750 as shown and described in FIG. 57, PV module 7050 as shown an described in FIG. 70A and others, PV module 7150 as shown and described in FIG. 71A and others, PV module 7250 as shown and described in FIG. 72A and others, PV module 7350 as shown and described in FIG. 73A and others, and to other PV modules. A rail such as rail 7470 is similar to rail 5170 as shown and described in FIG. 51, to rail 5270 as shown and described in FIG. 52, rail 5370 as shown and described in FIG. 53, rail 5470 as shown an described in FIG. 54, rail 5570 as shown and described in FIG. 55 and others, rail 7170 as shown and described in FIG. 71A and others, rail 7270 as shown in FIG. 72A and others, rail 7370 as shown in FIG. 73A and others, and to other rails. A lever clip such as lever clip 7490 is similar to lever clip 6390 as shown and described in FIG. 63A and others, lever clip 6490 as shown and described in FIG. 64A and others, lever clip 6590 as shown and described in FIG. 65 and others, lever clip 6690 as shown and described in FIG. 66 and others, lever clip 6790 as shown and described in FIG. 67 and others, lever clip 6890 as shown and described in FIG. 68, lever clip 7390 as shown and described in FIG. 73A and others, and to other lever clips. Two adjacent PV module 7450A and 7450B may be placed on rail 7470 such that rail 7470 forms a ninety degree angle with respect to the grooves 7452A and 7452B. Pivot 7495B and tooth 7497B of lever clip 7490 may be placed in groove 7452A as shown in FIGS. 74A and 74A-1, where FIG. 74A-1 is a detail view of area A of FIG. 74A. Lever clip 7490 may then be moved forward until teeth 7497C and 7497D are underneath flange 7473A as shown and described in FIGS. 74B and 74B-1, where FIG. 74B-1 is a detail view of area B of FIG. 74B. PV module 7450B may then be moved toward PV module 7450A such that pivot 7495A and tooth 7497A enter groove 7452B. Arm 7491 may be pressed downward causing it to flex and pressing teeth 9497C and 7497D against flange 7473A, and flange 7493 may be tucked into groove 7452B of module 7450B, as shown in FIGS. 74C and 74C-1, where FIG. 74C-1 is a detail view of area C of FIG. 74C, as well as FIGS. 74D and 74D-1, where FIG. 74D-1 is a detail view of area D of FIG. 74D. Once released, arm 7491 springs upward to keep flange 7493 secured against frame 7451B. As described in greater detail above, (i) initial rotation of lever clip 7490 against rail 7470 may further seat the connection, (ii) continued rotation may flex arm 7491 which may then spring backward toward its un-flexed position once installed to keep catch 7493 engaged with groove 7452, (iii) arm 7491 may act as a lever to provide mechanical advantage, reducing the amount of force required to rotate head 7446 such that it exerts force upon and is engaged with flange 7473A, (iv) no separate tool or fastener is required to form this connection, and (v) installation creates preload that must be overcome by forces in order to loosen the connection. Thus, significant labor savings during installation may result.

Figure 75:
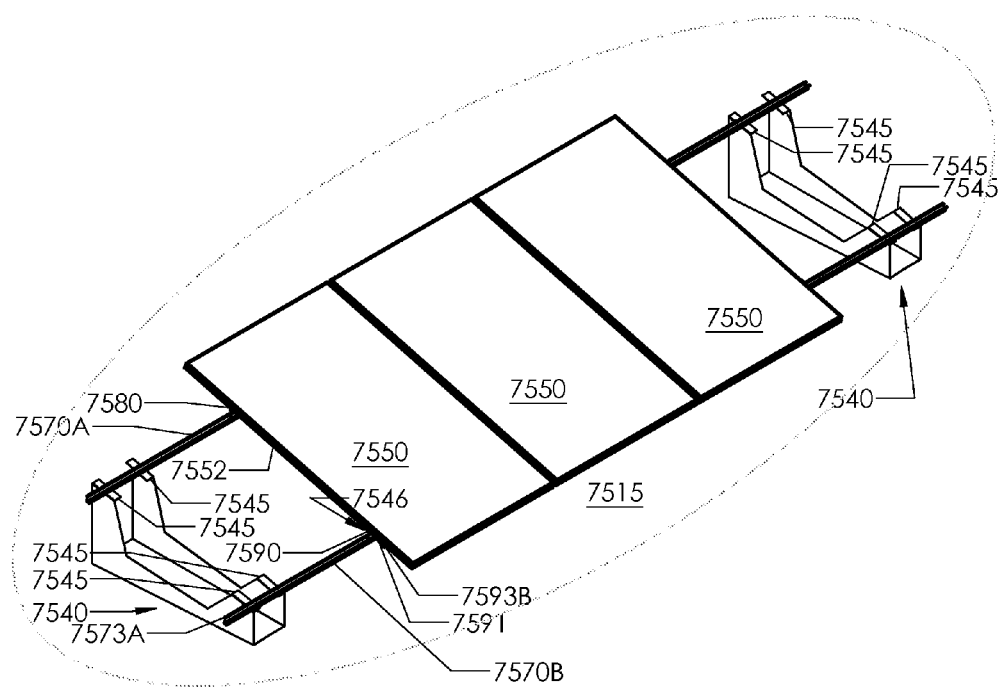
FIG. 75 is a perspective view of a PV array installed on support structures.

Referring now to FIG. 75, a PV array using rails is shown mounted on a support structure using both brackets and lever clips. PV modules such as PV modules 7550 are similar to PV module 100 as shown and described in FIG. 1A and others, to PV module 309 as shown and described in FIG. 20 and others, to PV module 355 as shown and described in FIG. 31 and others, to PV module 510 as shown and described in FIG. 42 and others, to PV modules 5050A, 5050B, 5050C, 5050D, 5050E, and 5050F as shown in FIG. 50A and others, to PV module 5750 as shown and described in FIG. 57, PV module 7050 as shown an described in FIG. 70A and others, PV module 7150 as shown and described in FIG. 71A and others, PV module 7250 as shown and described in FIG. 72A and others, PV module 7350 as shown and described in FIG. 73A and others, to PV Modules 7450A and 7450B as shown and described in FIG. 74A and others, and to other PV modules. Rails such as rails 7570A and 7570B are similar to rail 5170 as shown and described in FIG. 51, to rail 5270 as shown and described in FIG. 52, rail 5370 as shown and described in FIG. 53, rail 5470 as shown an described in FIG. 54, rail 5570 as shown and described in FIG. 55 and others, rail 7170 as shown and described in FIG. 71A and others, rail 7270 as shown in FIG. 72A and others, rail 7370 as shown in FIG. 73A and others, to rail 7470 as shown and described in FIG. 74A and others, and to other rails. A lever clip such as lever clip 7590 is similar to lever clip 6390 as shown and described in FIG. 63A and others, to lever clip 6490 as shown and described in FIG. 64A and others, to lever clip 6590 as shown and described in FIG. 65 and others, to lever clip 6690 as shown and described in FIG. 66 and others, to lever clip 6790 as shown and described in FIG. 67 and others, to lever clip 6890 as shown and described in FIG. 68, to lever clip 7390 as shown and described in FIG. 73A and others, to lever clip 7490 as shown and described in FIG. 74A and others, and to other lever clips. Support structure 7540 is similar to support structure 6940 as shown and described in FIG. 69A and others, and to other support structures. A bracket such as bracket 7580 is similar to bracket 5880 as shown and described in FIG. 58A and others, to bracket 5980 as shown and described in FIG. 59A and others, to bracket 6080 as shown and described in FIG. 60 and others, to bracket 6180 as shown and described in FIG. 61 and others, to bracket 6280 as shown and described in FIG. 62 and others, to bracket 7080 as shown and described in FIG. 70A and others, to bracket 7180 as shown and described in FIG. 71A and other, to bracket 7280 as shown and described in FIG. 72A and others, and to other brackets. As discussed above, rails 7570A and 7570B may connect to the connector flanges 7545 of support structures 7540 by means of bolts, clips, clamps, or other connectors (not shown). PV modules 7550 may connect to brackets 7580 as described above, and may then connect to rail 7570A as described above. Lever clips 7590 may then connect PV modules 7550 to rail 7570B as described above. This configuration may create a PV array that may rest on a surface 7515, which may be a roof, the ground, or another surface, and mounts PV modules 7570 at fifteen degree angle, ten degree angle, twenty degree angle, or another angle between zero and ninety degrees with respect to surface 7515 to improve the PV modules' 7550 exposure to sunlight. As described in greater detail above, (i) initial rotation of lever clip 7590 against rail 7570 may further seat the connection, (ii) continued rotation may flex arm 7591 which may then spring backward toward its un-flexed position once installed to keep catch 7593B engaged with groove 7552, (iii) arm 7591 may act as a lever to provide mechanical advantage, reducing the amount of force required to rotate head 7546 such that it exerts force upon and is engaged with flange 7573A, (iv) no separate tool or fastener is required to form this connection, and (v) installation creates preload that must be overcome by forces in order to loosen the connection. Thus, significant labor savings during installation may result.

Figure 76:
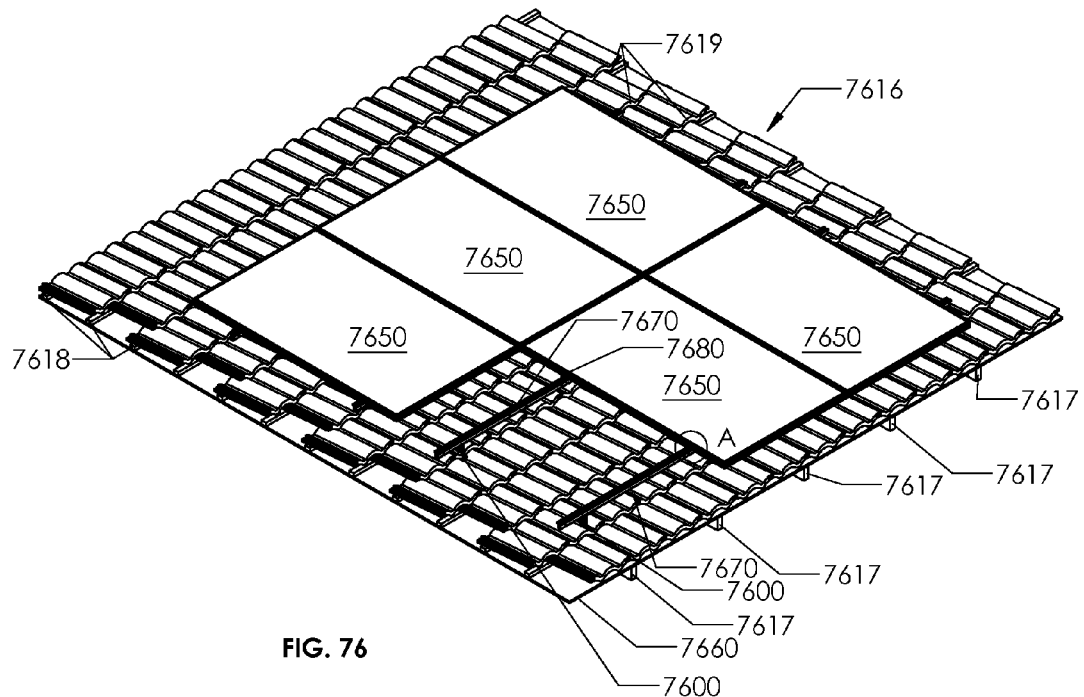
FIG. 76 is a perspective view of a PV array installed on a tile roof.
Figures 1, 76:
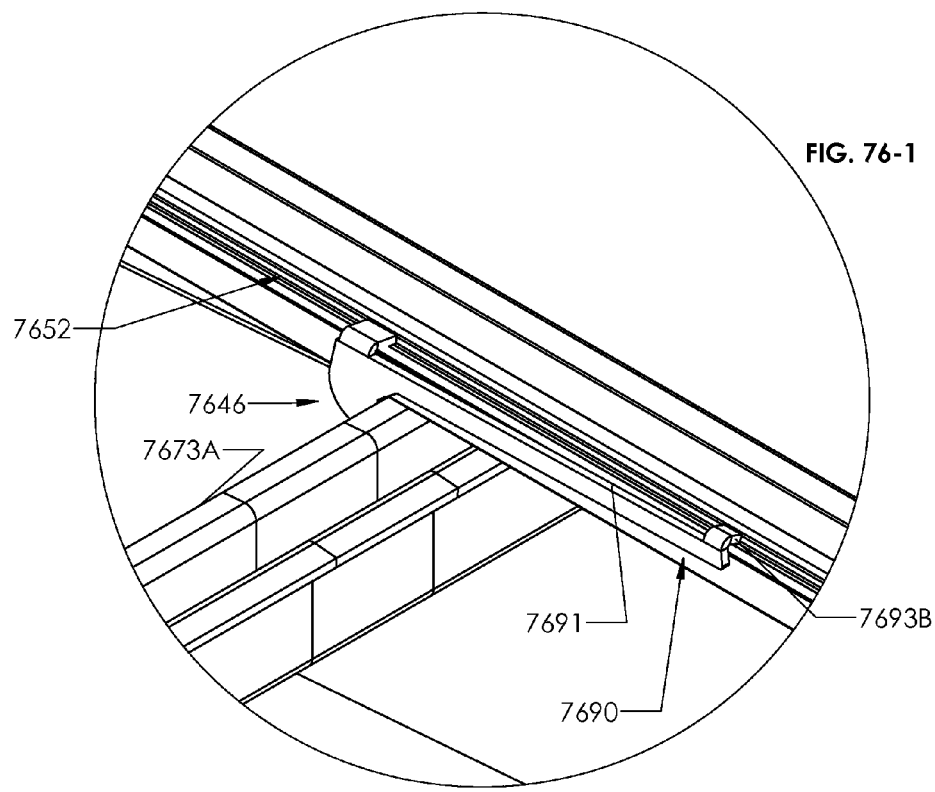

Referring now to FIG. 76, a PV array is shown installed on a tile roof PV modules such as PV modules 7650 are similar to PV module 100 as shown and described in FIG. 1A and others, to PV module 309 as shown and described in FIG. 20 and others, to PV module 355 as shown and described in FIG. 31 and others, to PV module 510 as shown and described in FIG. 42 and others, to PV modules 5050A, 5050B, 5050C, 5050D, 5050E, and 5050F as shown in FIG. 50A and others, to PV module 5750 as shown and described in FIG. 57, PV module 7050 as shown an described in FIG. 70A and others, PV module 7150 as shown and described in FIG. 71A and others, PV module 7250 as shown and described in FIG. 72A and others, PV module 7350 as shown and described in FIG. 73A and others, to PV Modules 7450A and 7450B as shown and described in FIG. 74A and others, PV module 7550 as shown in FIG. 75 and others, and to other PV modules. Rails such as rails 7670 are similar to rail 5170 as shown and described in FIG. 51, to rail 5270 as shown and described in FIG. 52, rail 5370 as shown and described in FIG. 53, rail 5470 as shown an described in FIG. 54, rail 5570 as shown and described in FIG. 55 and others, rail 7170 as shown and described in FIG. 71A and others, rail 7270 as shown in FIG. 72A and others, rail 7370 as shown in FIG. 73A and others, to rail 7470 as shown and described in FIG. 74A and others, to rails 7570A and 7570B as shown and described in FIG. 75 and others, and to other rails. Lever clips such as lever clips 7690 are similar to lever clip 6390 as shown and described in FIG. 63A and others, to lever clip 6490 as shown and described in FIG. 64A and others, to lever clip 6590 as shown and described in FIG. 65 and others, to lever clip 6690 as shown and described in FIG. 66 and others, to lever clip 6790 as shown and described in FIG. 67 and others, to lever clip 6890 as shown and described in FIG. 68, to lever clip 7390 as shown and described in FIG. 73A and others, to lever clip 7490 as shown and described in FIG. 74A and others, to lever clip 7590 as shown and described in FIG. 75 and others, and to other lever clips. A bracket such as bracket 7680 is similar to bracket 5880 as shown and described in FIG. 58A and others, to bracket 5980 as shown and described in FIG. 59A and others, to bracket 6080 as shown and described in FIG. 60 and others, to bracket 6180 as shown and described in FIG. 61 and others, to bracket 6280 as shown and described in FIG. 62 and others, to bracket 7080 as shown and described in FIG. 70A and others, to bracket 7180 as shown and described in FIG. 71A and other, to bracket 7280 as shown and described in FIG. 72A and others, and to other brackets. A roof such as roof 7616 may include joints 7617, a substrate 7660, batons 7618 and tiles 7619. PV modules 7650 may be installed on roof 7617 as follows. Tile hooks such as tile hooks 7600 may be installed on substrate 7660 as described above to form rows across roof 7616. Rails 7670 may be connected across the rows of tile hooks 7600 using bolts, clips, adhesive, or another connection method known to one of skill in the art. PV modules may then be installed on rails 7670 using brackets 7680 and lever clips 7690, as described above and as shown and described in FIGS. 76 and 76-1, where FIG. 76-1 is a detail view of area A of FIG. 76. As described in greater detail above, (i) initial rotation of lever clip 7690 against rail 7670 may further seat the connection, (ii) continued rotation may flex arm 7691 which may then spring backward toward its un-flexed position once installed to keep catch 7693B engaged with groove 7652, (iii) arm 7691 may act as a lever to provide mechanical advantage, reducing the amount of force required to rotate head 7646 such that it exerts force upon and is engaged with flange 7673A, (iv) no separate tool or fastener is required to form this connection, and (v) installation creates preload that must be overcome by forces in order to loosen the connection. Thus, significant labor savings during installation may result.

Referring now to FIG. 77, a PV arrays is shown installed on pipes. PV modules such as PV modules 7750 are similar to PV module 100 as shown and described in FIG. 1A and others, to PV module 309 as shown and described in FIG. 20 and others, to PV module 355 as shown and described in FIG. 31 and others, to PV module 510 as shown and described in FIG. 42 and others, to PV modules 5050A, 5050B, 5050C, 5050D, 5050E, and 5050F as shown in FIG.

50A and others, to PV module 5750 as shown and described in FIG. 57, PV module 7050 as shown an described in FIG. 70A and others, PV module 7150 as shown and described in FIG. 71A and others, PV module 7250 as shown and described in FIG. 72A and others, PV module 7350 as shown and described in FIG. 73A and others, to PV Modules 7450A and 7450B as shown and described in FIG. 74A and others, PV module 7550 as shown in FIG. 75 and others, and to other PV modules. A bracket such as bracket 7780 is similar to bracket 5880 as shown and described in FIG. 58A and others, to bracket 5980 as shown and described in FIG. 59A and others, to bracket 6080 as shown and described in FIG. 60 and others, to bracket 6180 as shown and described in FIG. 61 and others, to bracket 6280 as shown and described in FIG. 62 and others, to bracket 7080 as shown and described in FIG. 70A and others, to bracket 7180 as shown and described in FIG. 71A and other, to bracket 7280 as shown and described in FIG. 72A and others, to bracket 7580 as shown and described in FIG. 75 and others, and to other brackets. Pipes such as pipes 7761 are similar to pipe 5661 as shown and described in FIG. 56A, and to other pipes. Rails such as rails 7770 are similar to rail 5170 as shown and described in FIG. 51, to rail 5270 as shown and described in FIG. 52, rail 5370 as shown and described in FIG. 53, rail 5470 as shown an described in FIG. 54, rail 5570 as shown and described in FIG. 55 and others, rail 7170 as shown and described in FIG. 71A and others, rail 7270 as shown in FIG. 72A and others, rail 7370 as shown in FIG. 73A and others, to rail 7470 as shown and described in FIG. 74A and others, to rails 7570A and 7570B as shown and described in FIG. 75 and others, and to other rails. Without limitation, a PV array may be installed on rails as follows. Two or more rows of pipes 7761 may be driven into the ground or otherwise installed in a surface as discussed above, where the rows are no further apart than the length or width of a PV module 7750. These rows may be the same height or different heights, and at different heights may cause PV modules 7750 to be installed at an angle that may improve their exposure to sunlight, as discussed above. Connectors such as L-brackets 7739 or other connectors may be attached to the top of rails 7761. Rails 7770 may then be installed across each row of pipes 7761 by connecting to connectors such as L-brackets 7739 using bolts, clips, or another method known to one of skill in the art. Brackets such as bracket 7780 may be installed in PV modules 7750 as discussed above and as shown in FIG. 77-1 which is a detail view of area A of FIG. 77. Bracket 7780 placement aligns with the distance between rows of pipes 7761. Lever clip 7790 may connect PV module 7750 to rail 7770 as discussed above, and as shown in FIG. 77-2, which is a detail view of area B of FIG. 77. PV modules 7750 may then be installed on the rails using brackets as discussed above. As described in greater detail above, (i) initial rotation of lever clip 7790 against rail 7770 may further seat the connection, (ii) continued rotation may flex arm 7791 which may then spring backward toward its un-flexed position once installed to keep catch 7793A engaged with groove 7752, (iii) arm 7791 may act as a lever to provide mechanical advantage, reducing the amount of force required to rotate head 7746 such that it exerts force upon and is engaged with flange 7773, (iv) no separate tool or fastener is required to form this connection, and (v) installation creates preload that must be overcome by forces in order to loosen the connection. Thus, significant labor savings during installation may result.

Figure 78A:
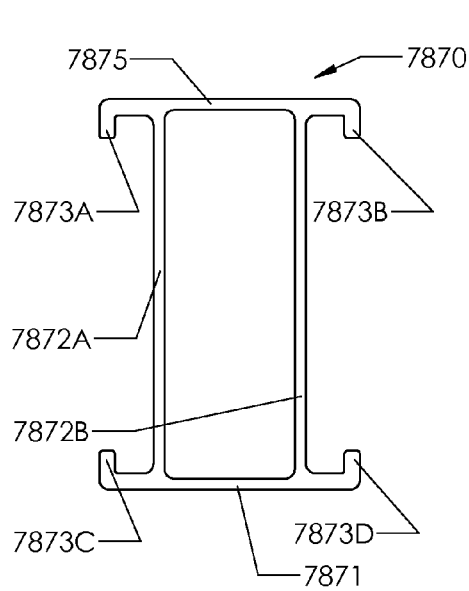
FIG. 78A is an orthogonal view of a rail.
Figure 78B:
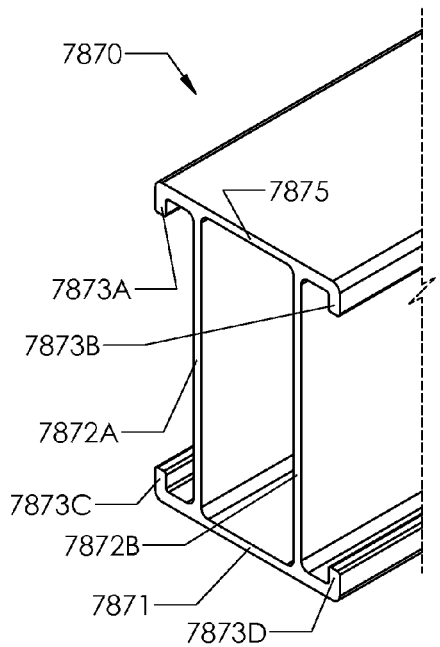
FIG. 78B is a perspective view of a rail.

Referring now to FIGS. 78A and 78B, another embodiment of a rail is shown. A rail such as rail 7870 is similar to rail 5170 as shown and described in FIG. 51, to rail 5270 as shown and described in FIG. 52, rail 5370 as shown and described in FIG. 53, rail 5470 as shown an described in FIG. 54, rail 5570 as shown and described in FIG. 55 and others, rail 7170 as shown and described in FIG. 71A and others, rail 7270 as shown in FIG. 72A and others, rail 7370 as shown in FIG. 73A and others, to rail 7470 as shown and described in FIG. 74A and others, to rails 7570A and 7570B as shown and described in FIG. 75 and others, to rail 7770 as shown and described in FIG. 77 and others, and to other rails. Rail 7870 may include a lower panel 7871 with flanges 7873C and 7873D, vertical panels 7872A and 7872B, upper panel 7875 with flanges 7873A and 7873B. Lower panel 7871 and upper panel 7875 may be 37 millimeters wide, 40 millimeters wide 30 millimeters wide, or another width, and may be the same width or different widths. Vertical panels 7872A and 7872B may be 53 millimeters tall, 50 millimeters tall, 55 millimeters tall, or another height, and may be the same height or different heights. Flanges 7873A-7873D may be 2.5 millimeters high, 2 millimeters high, 3 millimeters high, or another height. Lower panel 7871, upper panel 7875, vertical panels 7872A and 7872B, and flanges 7873A-7873D may be 1.7 millimeters thick, 2.5 millimeters thick, 2 millimeters thick, or another thickness, or varying thicknesses, and may be the same thickness or different thicknesses.

Figure 79:
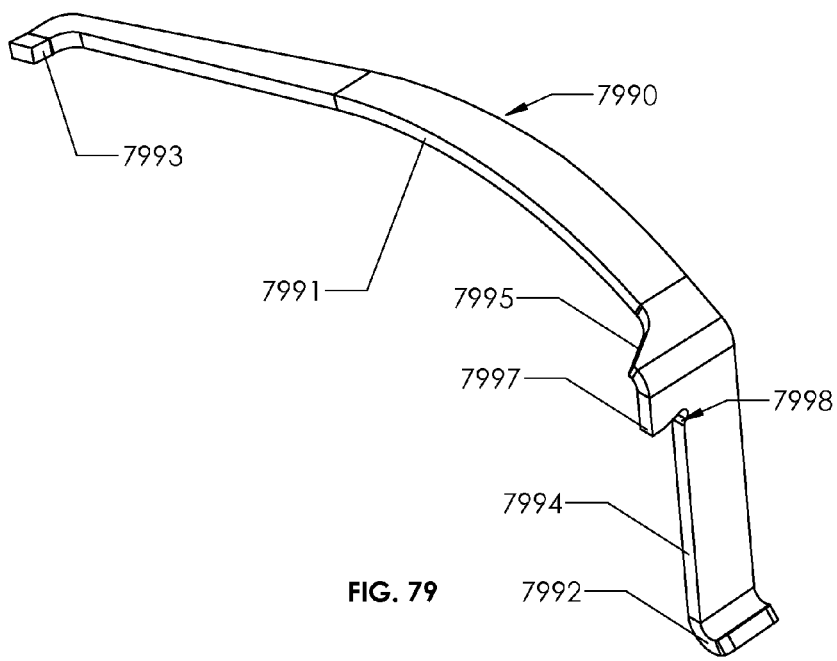
FIG. 79 is a perspective view of a lever clip.

Referring now to FIG. 79, another embodiment of a lever clip is shown. A lever clip such as lever clip 7990 is similar to lever clip 6390 as shown and described in FIG. 63A and others, to lever clip 6490 as shown and described in FIG. 64A and others, to lever clip 6590 as shown and described in FIG. 65 and others, to lever clip 6690 as shown and described in FIG. 66 and others, to lever clip 6790 as shown and described in FIG. 67 and others, to lever clip 6890 as shown and described in FIG. 68, to lever clip 7390 as shown and described in FIG. 73A and others, to lever clip 7490 as shown and described in FIG. 74A and others, to lever clip 7590 as shown and described in FIG. 75 and others, to lever clip 7690 as shown and described in FIG. 76 and others, and to other lever clips. Lever clip 7990 may include a flange 7993, an arm 7991, a side panel 7995, a pivot 7997, a notch 7998, a front panel 7994, and a hook 7992. Arm 7991 may be 154 millimeters long, 150 millimeters long, 160 millimeters long, or another length. Flange 7993 may be 9 millimeters long, 10 millimeters long, 8 millimeters long, or another dimension. Side panel 7995 may extend outward from front panel 7994 a distance of 9 millimeters, 8 millimeters, 10 millimeters, or another distance. Front panel 7994 (i) may be 57 millimeters long, 50 millimeters long, 60 millimeters long, or another length and (ii) may be 14 millimeters wide, 10 millimeters wide 15 millimeters wide, or another width. Flange 7993, arm 7991, side panel 7995, pivot 7997, a front panel 7994, and a hook 7992 may be 3 millimeters thick, 2 millimeters thick, 4 millimeters thick, or another thickness or varying thicknesses, and may be the same thickness or different thicknesses.

Figure 80:
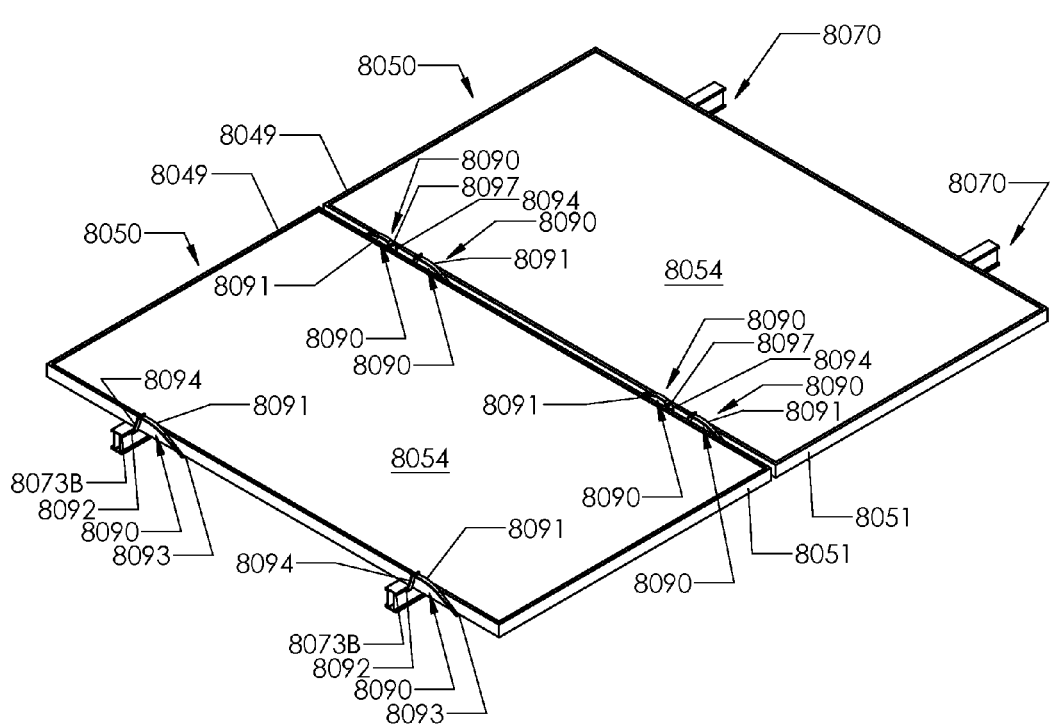
FIG. 80 is a perspective view of a PV array with PV modules that lack grooves in their frames.

Referring now to FIG. 80, a PV array is shown in which PV modules with groove-less frames are mounted to rails using lever clips. A PV module such as PV module 8050 is similar to PV module 100 as shown and described in FIG. 1A and others, to PV module 309 as shown and described in FIG. 20 and others, to PV module 355 as shown and described in FIG. 31 and others, to PV module 510 as shown and described in FIG. 42 and others, to PV modules 5050A, 5050B, 5050C, 5050D, 5050E, and 5050F as shown in FIG. 50A and others, to PV module 5750 as shown and described in FIG. 57, PV module 7050 as shown an described in FIG.

70A and others, PV module 7150 as shown and described in FIG. 71A and others, PV module 7250 as shown and described in FIG. 72A and others, PV module 7350 as shown and described in FIG. 73A and others, to PV Modules 7450A and 7450B as shown and described in FIG. 74A and others, PV module 7550 as shown in FIG. 75 and others, to PV module 7750 as shown and described in FIG. 77 and others, and to other PV modules. A rail such as rail 8070 is similar to rail 5170 as shown and described in FIG. 51, to rail 5270 as shown and described in FIG. 52, rail 5370 as shown and described in FIG. 53, rail 5470 as shown an described in FIG. 54, rail 5570 as shown and described in FIG. 55 and others, rail 7170 as shown and described in FIG. 71A and others, rail 7270 as shown in FIG. 72A and others, rail 7370 as shown in FIG. 73A and others, to rail 7470 as shown and described in FIG. 74A and others, to rails 7570A and 7570B as shown and described in FIG. 75 and others, to rail 7770 as shown and described in FIG. 77 and others, to rail 7870 as shown and described in FIG. 78A and others, and to other rails. A lever clip such as lever clip 8090 is similar to lever clip 6390 as shown and described in FIG. 63A and others, to lever clip 6490 as shown and described in FIG. 64A and others, to lever clip 6590 as shown and described in FIG. 65 and others, to lever clip 6690 as shown and described in FIG. 66 and others, to lever clip 6790 as shown and described in FIG. 67 and others, to lever clip 6890 as shown and described in FIG. 68, to lever clip 7390 as shown and described in FIG. 73A and others, to lever clip 7490 as shown and described in FIG. 74A and others, to lever clip 7590 as shown and described in FIG. 75 and others, to lever clip 7690 as shown and described in FIG. 76 and others, to lever clip 7990 as shown and described in FIG. 79 and others, and to other lever clips. PV module 8050 may include a laminate 8054 and a frame 8051 where the laminate 8054 is inset within the frame 8051 rather than flush with the facing surface 8049 of the frame 8051, as shown in FIG. 80. PV module 8050 may be rested upon two or more rails 8090 and connected with lever clips 8090 as follows. Tooth 8097 of lever clip 8090 may be placed on the facing surface 8049 and then moved across the surface toward rail 8070 until front panel 8094 reaches flange 8073B. Lever clip 8090 may then be rotated so hook 8092 may be oriented such that it arcs beneath the bottom of flange 8073B while tooth 8097 remains in contact with facing surface 8049. Downward force may then be applied to arm 8091 causing it to deform slightly, and flange 8093 may be tucked beneath frame 8051. Upon release, arm 8091 may spring upward, pressing flange 8093 against frame 8051 and securing rail 8070 to PV module 8050.

Figure 81:
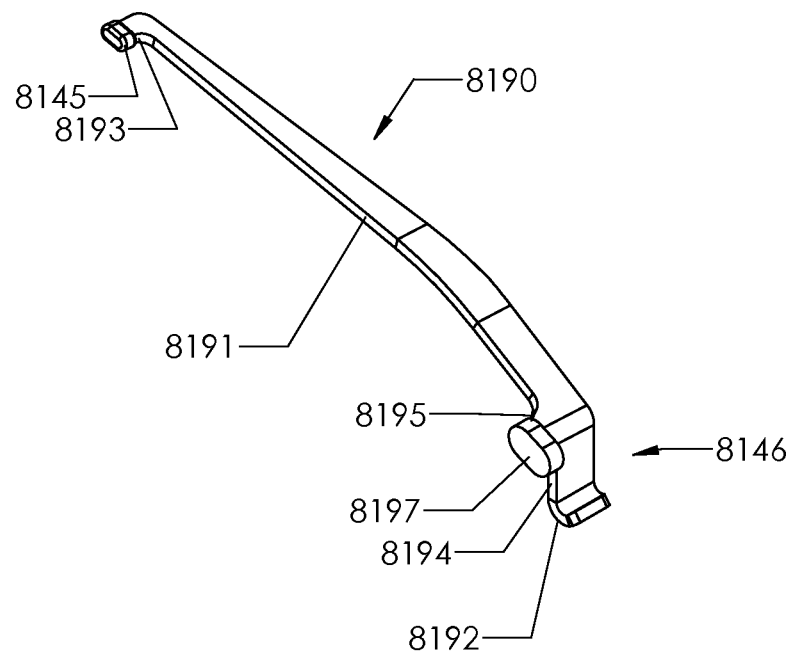
FIG. 81 is a perspective view of a lever clip.

Referring now to FIG. 81, another embodiment of a lever clip is shown. A lever clip such as lever clip 8190 is similar to lever clip 6390 as shown and described in FIG. 63A and others, to lever clip 6490 as shown and described in FIG. 64A and others, to lever clip 6590 as shown and described in FIG. 65 and others, to lever clip 6690 as shown and described in FIG. 66 and others, to lever clip 6790 as shown and described in FIG. 67 and others, to lever clip 6890 as shown and described in FIG. 68, to lever clip 7390 as shown and described in FIG. 73A and others, to lever clip 7490 as shown and described in FIG. 74A and others, to lever clip 7590 as shown and described in FIG. 75 and others, to lever clip 7690 as shown and described in FIG. 76 and others, to lever clip 7990 as shown and described in FIG. 79 and others, to lever clip 8090 as shown and described in FIG. 80 and others, and to other lever clips. Lever clip 8190 may include a catch 8193 with a cushion, flexible material, or bumper 8145, an arm 8191, a side panel 8195, a pivot 8197, a front panel 8194, a head 8146, and a hook 8192. Arm 8191 may be 154 millimeters long, 150 millimeters long, 160 millimeters long, or another length. Catch 8193 may be 9 millimeters long, 10 millimeters long, 8 millimeters long, or another dimension. Side panel 8195 may extend outward from front panel 8194 a distance of 9 millimeters, 8 millimeters, 10 millimeters, or another distance. Front panel 8194 (i) may be 57 millimeters long, 50 millimeters long, 60 millimeters long, or another length and (ii) may be 14 millimeters wide, 10 millimeters wide 15 millimeters wide, or another width. Catch 8193, arm 8191, side panel 8195, pivot 8197, a front panel 8194, and a hook 8192 may be 3 millimeters thick, 2 millimeters thick, 4 millimeters thick, or another thickness or varying thicknesses, and may be the same thickness or different thicknesses. Bumper 8145 and pivot 8197 may be rubber, plastic, or another malleable or semi-malleable material known to one of skill in the art as bumper 8145 and pivot 8197 may directly contact the laminate of a PV module which may be cracked or shattered by a more rigid material.

Figure 82:
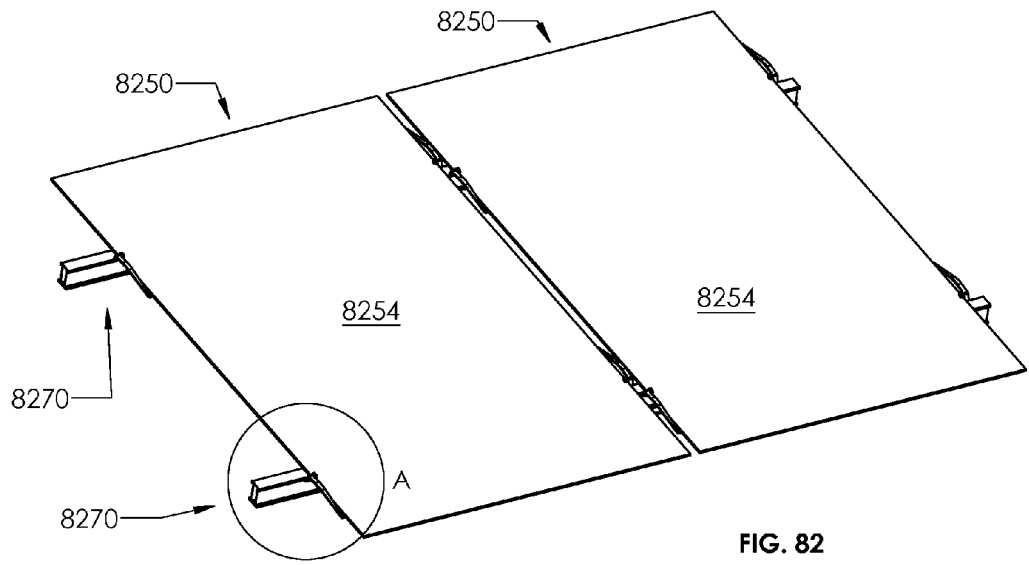
FIG. 82 is a perspective view of a PV array with PV modules that lack frames.
Figures 1, 82:
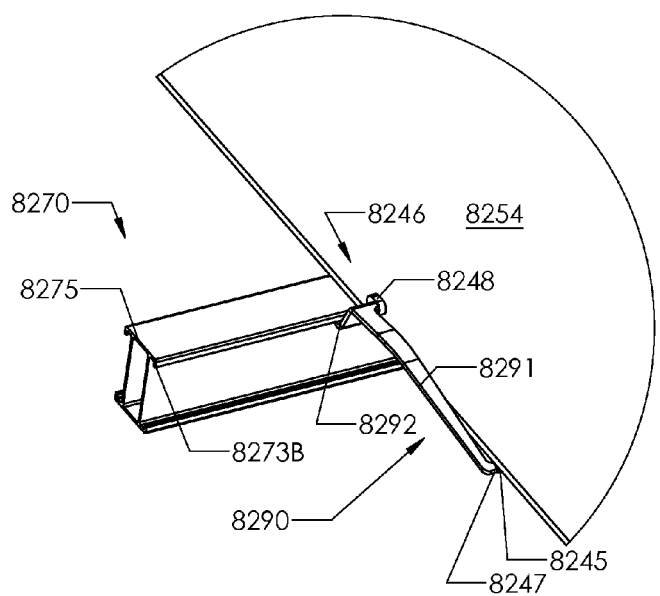

Referring now to FIG. 82, a PV array is shown consisting of rails, lever clips, and frameless PV modules. A PV module such as PV module 8250 may include a laminate 8254. A rail such as rail 8270 is similar to rail 5170 as shown and described in FIG. 51, to rail 5270 as shown and described in FIG. 52, rail 5370 as shown and described in FIG. 53, rail 5470 as shown an described in FIG. 54, rail 5570 as shown and described in FIG. 55 and others, rail 7170 as shown and described in FIG. 71A and others, rail 7270 as shown in FIG. 72A and others, rail 7370 as shown in FIG. 73A and others, to rail 7470 as shown and described in FIG. 74A and others, to rails 7570A and 7570B as shown and described in FIG. 75 and others, to rail 7770 as shown and described in FIG. 77 and others, to rail 7870 as shown and described in FIG. 78A and others, and to other rails. A lever clip such as lever clip 8290 is similar to lever clip 6390 as shown and described in FIG. 63A and others, to lever clip 6490 as shown and described in FIG. 64A and others, to lever clip 6590 as shown and described in FIG. 65 and others, to lever clip 6690 as shown and described in FIG. 66 and others, to lever clip 6790 as shown and described in FIG. 67 and others, to lever clip 6890 as shown and described in FIG. 68, to lever clip 7390 as shown and described in FIG. 73A and others, to lever clip 7490 as shown and described in FIG. 74A and others, to lever clip 7590 as shown and described in FIG. 75 and others, to lever clip 7690 as shown and described in FIG. 76 and others, to lever clip 7990 as shown and described in FIG. 79 and others, to lever clip 8090 as shown and described in FIG. 80 and others, and to other lever clips. Without limitation, lever clip 8290 may connect PV module 8250 to rail 8070 as follows. PV module 8050 may be placed atop rail 8270 such that the underside of laminate 8254 contacts the top surface of upper panel 8275 and the end of rail 8270 extends beyond the edge of laminate 8254. In some embodiments (not shown) a rubber or other flexible or cushioning material is placed between laminate 8254 and upper panel 8275. Pivot 8248 may then be placed on the upward-facing surface of laminate 8254 and hook 8292 may be rotated underneath flange 8273B. Arm 8291 may then be rotated down and may begin to flex. Catch 8247 and bumper 8245 may then be placed beneath laminate 8254. Upon release, arm 8291 may spring toward its former position, pressing catch 8247 and bumper 8245 against the underside of laminate 8254. As described in greater detail above, (i) initial rotation of lever clip 8290 against rail 8270 may further seat the connection, (ii) continued rotation may flex arm 8291 which may then spring backward toward its un-flexed position once installed to keep catch 8247 engaged with laminate 8254, (iii) arm 8291 may act as a lever to provide mechanical advantage, reducing the amount of force required to rotate head 8246 such that it exerts force upon and is engaged with flange 8273B, (iv) no separate tool or fastener is required to form this connection, and (v) installation creates preload that must be overcome by forces in order to loosen the connection.

While a number of exemplary aspects and embodiments have been discussed above, those of skill in the art will recognize certain modifications, permutations, additions and sub-combinations thereof. It is therefore intended that the following appended claims and claims hereafter introduced be interpreted to include all such modifications, permutations, additions, and sub-combinations as are within their true spirit and scope.

What is claimed as invention is:

1. A photovoltaic array, comprising:
   an array of photovoltaic modules, comprising:
      a first photovoltaic module;
      a second photovoltaic module adjacent to said first photovoltaic module; and
      a third photovoltaic module adjacent to said second photovoltaic module;
   a rail member disposed substantially beneath at least a portion of said second photovoltaic module and comprising a first end and a second end, each of which are positioned inward of a periphery of the array of photovoltaic modules in a lengthwise direction of the rail member;
   first and second attachment brackets coupled to said rail member, the first attachment bracket being offset from a gap between said first and second photovoltaic modules; and
   a coupling engaged with both the rail member and the second photovoltaic module, the coupling being at least partially positioned within the gap,
   wherein (i) said second photovoltaic module is substantially coplanar with and located between said first and third photovoltaic modules and (ii) said rail member is connected to said first, second, and third photovoltaic modules and attached to a support structure by said first and second attachment brackets.

2. The photovoltaic array of claim 1, wherein said rail member is adjustably connected to said attachment brackets in a direction substantially parallel with a plane defined by a top surface of a light-receiving side of a photovoltaic laminate of said first photovoltaic module.

3. The photovoltaic array of claim 2, wherein adjustment of said rail member enables connection of said photovoltaic modules to said rail member when said first attachment bracket does not align with said gap.

4. The photovoltaic array of claim 1, wherein said first and second attachment brackets align with tiles of a roof.

5. The photovoltaic array of claim 1, wherein a portion of said rail member spans between said gap and said first attachment bracket.

6. The photovoltaic array of claim 5, wherein said first and second attachment brackets substantially align with roof tiles of the support structure.

7. The photovoltaic array of claim 1, wherein said first attachment bracket is connected to said rail member by a lever clamp.

8. The photovoltaic array of claim 7, wherein said lever clamp is connectable to said rail member without a separate tool.

9. The photovoltaic array of claim 1, wherein said first attachment bracket is shaped to fit beneath a roof tile.

10. The photovoltaic array of claim 1, wherein said attachment brackets comprise notches for receiving said rail member.

11. The photovoltaic array of claim 1, further comprising a third attachment bracket coupled to said support structure and to a second coupling, at least a portion of the second coupling being disposed within a second gap between the first photovoltaic module and a fourth photovoltaic module adjacent to and substantially coplanar with the first photovoltaic module.

12. The photovoltaic array of claim 1, wherein at least one of the first, second and third photovoltaic modules is mounted to said support structure without a rail member extending from a first side of the at least one photovoltaic module to a second side of the at least one photovoltaic module, the first side being opposite the second side.

13. The photovoltaic array of claim 1, wherein said first photovoltaic module is connected to a third attachment bracket without a rail member.

14. The photovoltaic array of claim 1, wherein said coupling connects said first photovoltaic module to said second photovoltaic module.

15. The photovoltaic array of claim 1, wherein said coupling elevates the first and second photovoltaic modules above the rail member.

16. A photovoltaic array, comprising:
   a first photovoltaic module, comprising a frame extending along at least one side of the first photovoltaic module and defining a channel;
   a second photovoltaic module adjacent to the first photovoltaic module;
   a rail located substantially beneath said first photovoltaic module; and
   a lever clip, said lever clip comprising:
      a head disposed at a first end of said lever clip and connecting said first and second photovoltaic modules to said rail, the head comprising a first pivot portion engaging said first photovoltaic module and a second pivot portion engaging said second photovoltaic module,
      a retaining portion proximate a second end of said lever clip, and engaging said channel, and
      a lever arm extending between the head and the retaining portion.

17. The photovoltaic array of claim 16, wherein said lever arm is substantially rigid.

18. The photovoltaic array of claim 16, wherein said lever arm acts as a spring that applies a force that at least partially holds said retaining portion in engagement with said channel.

19. The photovoltaic array of claim 16, wherein said lever arm acts as a lever to rotate said head during installation such that said head secures said first photovoltaic module to said rail when said retaining portion is secured to said first photovoltaic module.

20. The photovoltaic array of claim 16, wherein said lever clip is deployable as a single unit without requiring a separate tool to install.

21. The photovoltaic array of claim 16, wherein said lever arm pivots about a portion of said head during installation.

22. The photovoltaic array of claim 16, wherein said head applies a preload to a joint between said first photovoltaic module and said rail.

23. The photovoltaic array of claim 16, wherein said first and second pivot portions resist upward movement of said first and second photovoltaic modules.

24. The photovoltaic array of claim 16, wherein said lever clip cuts into said frame of said first photovoltaic module to create an electrical ground path between said lever clip and said rail.

25. The photovoltaic array of claim 16, wherein said lever clip is made of sheet metal.

26. The photovoltaic array of claim 16, wherein said lever clip is formed by a casting, molding, stamping or extrusion process.

\* \* \* \* \*